(12) United States Patent
Ariga et al.

(10) Patent No.: US 7,382,816 B2
(45) Date of Patent: Jun. 3, 2008

(54) TWO-STAGE LASER PULSE ENERGY CONTROL DEVICE AND TWO-STAGE LASER SYSTEM

(75) Inventors: Tatsuya Ariga, Kanagawa (JP); Osamu Wakabayashi, Kanagawa (JP); Kouji Kakizaki, Kanagawa (JP)

(73) Assignee: Gigaphoton Inc., Tokyo (JP)

( * ) Notice: Subject to any disclaimer, the term of this patent is extended or adjusted under 35 U.S.C. 154(b) by 351 days.

(21) Appl. No.: 10/568,091

(22) PCT Filed: Aug. 9, 2004

(86) PCT No.: PCT/JP2004/011434

§ 371 (c)(1),
(2), (4) Date: Feb. 10, 2006

(87) PCT Pub. No.: WO2005/015699

PCT Pub. Date: Feb. 17, 2005

(65) Prior Publication Data
US 2006/0239309 A1    Oct. 26, 2006

(30) Foreign Application Priority Data
Aug. 11, 2003  (JP) ............................. 2003-291463

(51) Int. Cl.
*H01S 3/22*    (2006.01)
*H01S 3/223*   (2006.01)

(52) U.S. Cl. ........................ 372/58; 372/56; 372/57
(58) Field of Classification Search .............. 372/56, 372/57, 58
See application file for complete search history.

(56) References Cited

U.S. PATENT DOCUMENTS 6,567,450 B2 *  5/2003  Myers et al. ................. 372/55
7,095,773 B2 *  8/2006  Nakao et al. ................. 372/55

* cited by examiner

*Primary Examiner*—Minsun Harvey
*Assistant Examiner*—Marcia A. Golub
(74) *Attorney, Agent, or Firm*—Welsh & Katz, Ltd.

(57) ABSTRACT

A charging voltage Vosc applied to a main capacitor C0 disposed in an oscillating high-voltage pulse generator 12 of an oscillating laser 100 is subject to constant control such that a pulse energy Posc of the oscillating laser 100 becomes a lower limit energy Es0 or more of an amplification saturation region. And, a charging voltage Vamp applied to a main capacitor C0 disposed in an amplifying high-voltage pulse generator 32 of an amplifying laser 300 is controlled, and pulse energy Pamp of the amplifying laser 300 is determined as target energy Patgt. Thus, the pulse energy of a two-stage laser is controlled to stabilize the pulse energy.

14 Claims, 25 Drawing Sheets

STRUCTURE DIAGRAM OF
EACH CHAMBER AND ITS PERIPHERY

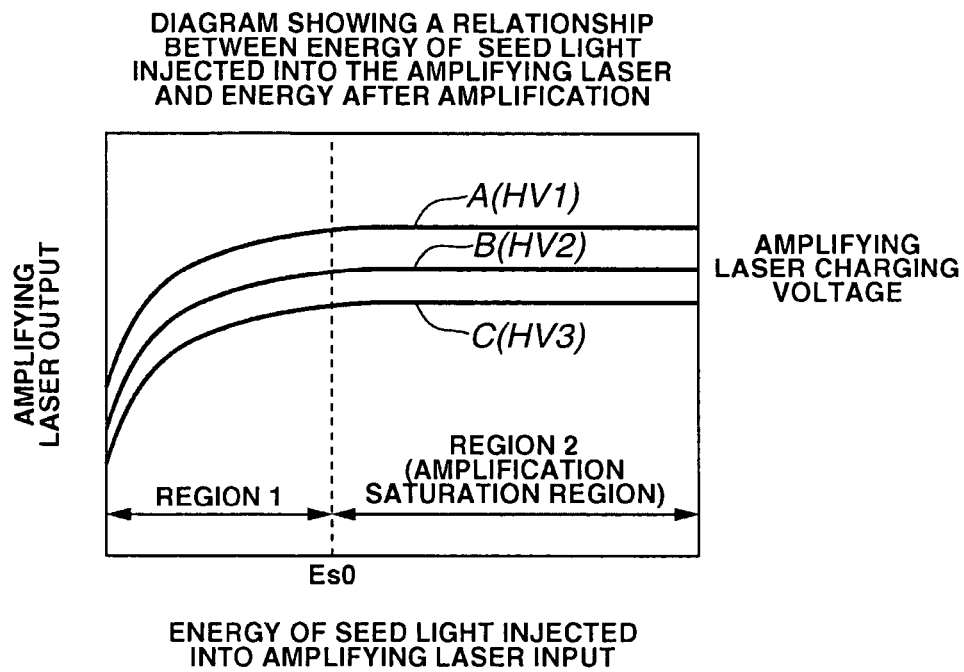
FIG.6
DIAGRAMS SHOWING INDIVIDUAL CHARGING VOLTAGES
AND INDIVIDUAL PULSE ENERGIES IN FIRST CONTROL EXAMPLE
FIG.7A osc CHARGING VOLTAGE Vosc
FIG.7B osc PULSE ENERGY Posc
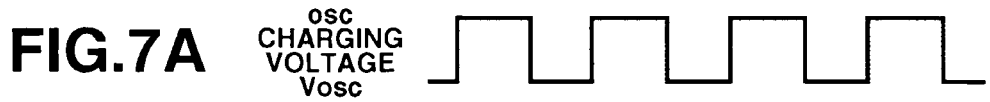
FIG.7C amp CHARGING VOLTAGE Vamp
FIG.7D amp PULSE ENERGY Pamp
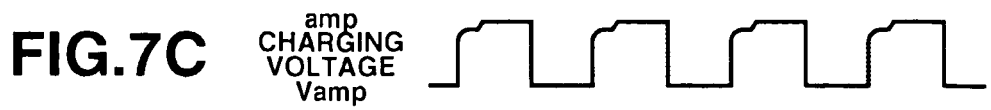

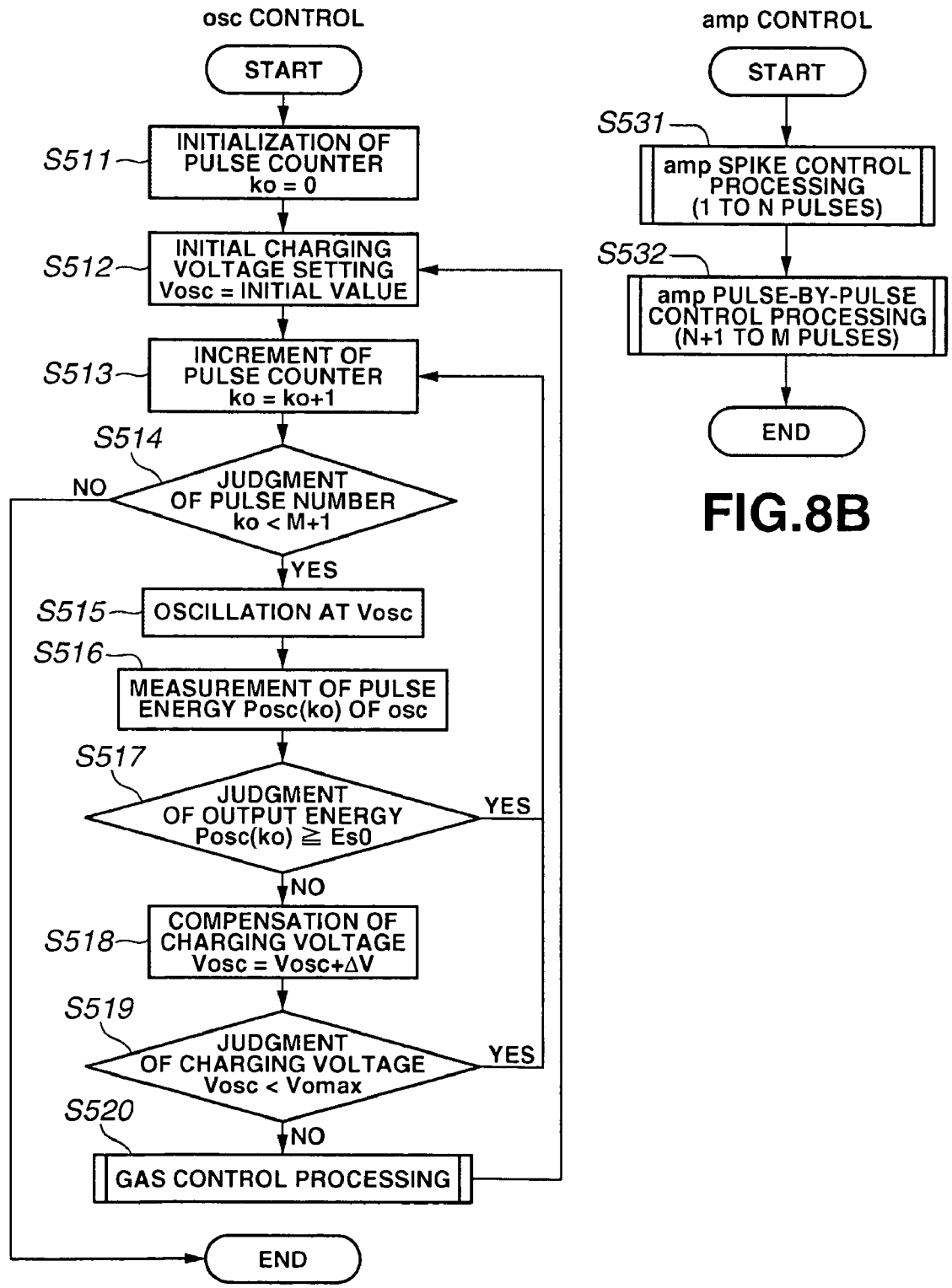

DIAGRAM SHOWING INDIVIDUAL CHARGING VOLTAGES
AND INDIVIDUAL PULSE ENERGIES IN SECOND CONTROL EXAMPLE
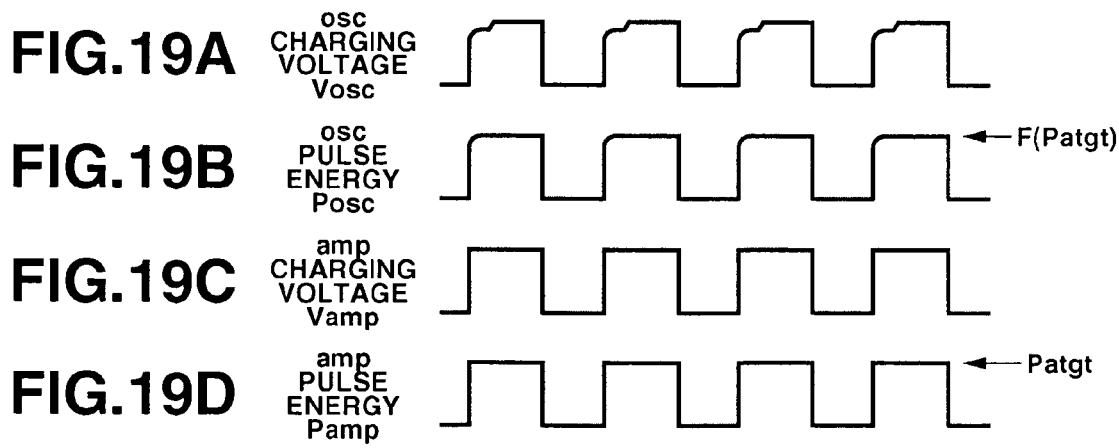

CONTROL FLOWS OF OSCILLATING LASER
AND AMPLIFYING LASER

DIAGRAM SHOWING INDIVIDUAL CHARGING VOLTAGES
AND INDIVIDUAL PULSE ENERGIES IN THIRD CONTROL EXAMPLE

CONTROL FLOWS OF OSCILLATING LASER
AND AMPLIFYING LASER

CONTROL FLOWS OF OSCILLATING LASER
AND AMPLIFYING LASER

TWO-STAGE LASER PULSE ENERGY CONTROL DEVICE AND TWO-STAGE LASER SYSTEM

TECHNICAL FIELD

The present invention relates to a two-stage laser pulse energy control device provided with an optical oscillation stage that outputs seed light and an optical amplification stage into which the seed light is injected and that amplifies and outputs an energy of the seed light, and also relates to a two-stage laser system provided with the two-stage laser pulse energy control device and an exposure device.

BACKGROUND ART

In recent years, an excimer laser apparatus and a molecular fluorine laser apparatus are taken into consideration and adopted as a lithography light source. In such a case, the following two points are required in order to improve the throughput of an exposure device and to conduct ultrafine fabrication uniformly.

A first point is to provide a high power laser beam. To provide high power, there is a method of increasing a pulse energy per pulse of a laser pulse which is output from a laser apparatus. And, if the pulse energy per pulse is low, a shortage of energy can be compensated by a method of increasing a repetition frequency.

A second point is to provide a very narrow-band spectrum. To provide a very narrow-band spectrum, there are, for example, a method of providing a high resolution line narrow module (hereinafter referred to as the "LNM") which is configured of a prism and a grating, and a method of providing a long pulsed laser as described in the following Patent Literature 1 given below.

But, the provision of the LNM with the high resolution ability and the long pulse degrades the pulse energy because an optical loss is generally increased. In other words, the very narrow banding of the spectrum and the increase of the pulse energy are incompatible with each other. When it is assumed that the cost is to be reduced, the increase of a repetition frequency, for example, a repetition frequency of exceeding 4 kHz is hard to achieve technically. Therefore, the realization of an excimer laser apparatus or a molecular fluorine laser apparatus having only one chamber provided with high power by increasing a repetition frequency while keeping a very narrow-band spectrum has limitations.

To satisfy both the above-described two points, a two stage laser having an optical oscillation stage and an optical amplification stage is proposed by, for example, the following Patent Literature 2 and the like. Both the optical oscillation stage and the optical amplification stage have a chamber in which laser gas is sealed and a pair of opposed electrodes are disposed. When a discharge occurs between the electrodes in the oscillating chamber, the laser gas is excited to transit to an excited state, and light is produced at the time of transition from the excited state to a ground state. When a light energy is amplified to some extent, a laser beam (seed light) is output from the oscillating laser. The output seed light is injected into the amplifying chamber. When a discharge is generated between the electrodes in the amplifying chamber, the energy of the injected seed light is amplified and output.

The two stage laser is roughly divided into two types. One of them is a type in that an oscillating laser apparatus is disposed in an optical oscillation stage, and an amplifier not having a light resonator is disposed in an optical amplification stage and called as an MOPA system (Master Oscillator Power Amplifier). The other is a type in that an oscillating laser apparatus is disposed in an optical oscillation stage and an amplifying laser apparatus having a light resonator is disposed in an optical amplification stage and called as an MOPO system (Master Oscillator Power Oscillator).

The optical oscillation stage is provided with an LNM to realize a very narrow-band spectrum. Meanwhile, in the optical amplification stage, only the energy is amplified while keeping a very narrow-band spectrum of the seed light which is output from the optical oscillation stage and injected into the amplifying chamber. According to this two-stage laser, the optical amplification stage does not include an element which becomes an optical loss of the LNM and the like, so that laser oscillation efficiency is very high. Therefore, it becomes possible to obtain a desired very narrow-band spectrum and laser output. The desired laser output is the product of a pulse energy per pulse and repetition frequency. For example, performance required for a next-generation ArF excimer laser includes a spectral FWHM (Full Width at Half Maximum) of 0.25 pm or less and laser output of 40 W or more when operating at a repetition frequency of 4 kHz.

To reduce damage to the optical system provided for the exposure device, it is desirable that a light pulse waveform is low peak power. Accordingly, long pulsization is demanded. And, high repetition is demanded because high power is required.

Where a laser apparatus has a single chamber only, it is controlled to obtain a prescribed energy by predictive determination (feedback) of a charging voltage HV for a next pulse in view of a relationship between a supply voltage (charging voltage) HV of a pulse earlier by one to several pulses or one to several bursts and a pulse energy. Besides, it is controlled to raise the charging voltage HV in order to compensate a medium-term output drop, and to increase a laser gas pressure in order to compensate the long-term output drop. To control the pulse energy integrated value into a target range, a charging voltage HV of the next pulse is determined according to a difference between the cumulative energy up to the previous pulse and the target cumulative energy so that a prescribed integrated value can be obtained.

Patent Literature 1: Japanese Patent Laid-open Publication No. 2001-156367

Patent Literature 2: Japanese Patent Laid-open Publication No. 2001-24265 (FIG. 1)

DISCLOSURE OF THE INVENTION

Problems to be Solved by the Invention

A laser apparatus to be used for an exposure device needs to perform high-precision pulse energy control while conducting a burst operation which repeats the laser oscillation of the prescribed pulse number and the pause of the laser. As described above, it is appropriate to adopt the two-stage laser as the light source in order to realize the high resolution and high throughput of the exposure device. But, a high-precision pulse energy control means used at the time of the burst operation has not been established for the two-stage laser.

Where the laser apparatus is used as the lithography light source, it is necessary to conduct pulse energy control of the laser apparatus such that a prescribed pulse energy can be obtained for a long period and the pulse energy integrated value falls in the target range.

But, where a laser has two or more laser apparatuses like the two-stage laser, the pulse energy of every pulse is varied by a variation of pulse energy in the optical oscillation stage, a variation of pulse energy in the optical amplification stage, a variation in synchronization between the optical oscillation stage and the optical amplification stage or the like. Therefore, it is hard to ensure the desired pulse energy.

Thus, the two-stage laser has a problem that stable pulse energy cannot be supplied because high-precision energy control means is not established.

The present invention has been made in view of the above circumstances and provides a resolution to stabilize pulse energy by conducting pulse energy control of the two-stage laser.

Means for Solving the Problems

Accordingly, a first invention is a two-stage laser pulse energy control device, comprising:

a two-stage laser which is comprised of:

an optical oscillation stage which has an oscillating chamber having laser gas sealed therein and a pair of mutually opposed electrodes disposed therein, and an oscillating high-voltage pulse generator for applying a high-voltage pulse to the pair of electrodes in the oscillating chamber by performing pulse compression of energy charged in an oscillating capacitor in order to excite the laser gas in the oscillating chamber, and which outputs seed light, and an optical amplification stage which has an amplifying chamber having laser gas sealed therein and a pair of mutually opposed electrodes disposed therein and the seed light being injected therein, and an amplifying high-voltage pulse generator for applying a high-voltage pulse to the pair of electrodes in the amplifying chamber by performing pulse compression of energy charged in an amplifying capacitor in order to amplify the seed light, and which outputs a laser beam obtained from amplifying the seed light; and a monitor module which measures a pulse energy Pamp of the laser beam, and controlling the pulse energy Pamp of the laser beam, wherein:

the optical oscillation stage and the optical amplification stage are controlled according to a measured result of the monitor module so that the pulse energy Pamp of the laser beam becomes a target energy Patgt of the optical amplification stage.

According to the first invention, the pulse energy Pamp of the laser beam output from the optical amplification stage is measured by the monitor module, and the optical oscillation stage or the optical amplification stage is controlled according to the measured results such that the pulse energy Pamp of the laser beam becomes the target energy Patgt.

A second invention is a two-stage laser pulse energy control device, comprising:

a two-stage laser which is comprised of:

an optical oscillation stage which has an oscillating chamber having laser gas sealed therein and a pair of mutually opposed electrodes disposed therein, and an oscillating high-voltage pulse generator for applying a high-voltage pulse to the pair of electrodes in the oscillating chamber by performing pulse compression of energy charged in an oscillating capacitor in order to excite the laser gas in the oscillating chamber, and which outputs seed light, and an optical amplification stage which has an amplifying chamber having laser gas sealed therein and a pair of mutually opposed electrodes disposed therein and the seed light being injected therein, and an amplifying high-voltage pulse generator for applying a high-voltage pulse to the pair of electrodes in the amplifying chamber by performing pulse compression of energy charged in an amplifying capacitor in order to amplify the seed light, and which outputs a laser beam obtained from amplifying the seed light;

a first monitor module which measures a pulse energy Posc of the seed light; and a second monitor module which measures a pulse energy Pamp of the laser beam, and controlling the pulse energy Pamp of the laser beam, wherein:

the optical oscillation stage is controlled according to a measured result of the first monitor module so that the pulse energy Posc of the seed light becomes a prescribed energy Es0 or more, the optical amplification stage is controlled according to a measured result of the second monitor module so that the pulse energy Pamp of the laser beam becomes a target energy Patgt of the optical amplification stage, and the prescribed energy Es0 is set in an amplification saturation region such that a change ratio of the pulse energy Pamp of the laser beam associated with a change of the pulse energy Posc of the seed light becomes a prescribed value or less.

A third invention is the two-stage laser pulse energy control device according to the second invention, wherein the control in the optical oscillation stage controls a charging voltage Vosc applied to the oscillating capacitor, and the control in the optical amplification stage controls a charging voltage Vamp applied to the amplifying capacitor.

A fourth invention is the two-stage laser pulse energy control device according to the second invention, wherein:

the control in the optical oscillation stage controls at least one of a laser gas pressure and a laser gas composition in the oscillating chamber in addition to a control of a charging voltage Vosc applied to the oscillating capacitor, and the control in the optical amplification stage controls at least one of a laser gas pressure and a laser gas composition in the amplifying chamber in addition to a control of the charging voltage Vamp applied to the amplifying capacitor.

The second through fourth inventions will be described. As a rule, a charging voltage (hereinafter, a charging voltage of an oscillating laser 100) Vosc of an oscillating capacitor (hereinafter referred to as the main capacitor) C0 disposed in an oscillating high-voltage pulse generator 12 of the oscillating laser 100 is controlled to be constant such that a pulse energy (pulse energy of seed light injected into the amplification stage, e.g., an amplifying laser 300) Posc of the optical oscillation stage (hereinafter referred to as the oscillating laser) 100 becomes a lower limit energy Es0 or more of an amplification saturation region of the optical amplification stage (hereinafter, descriptions will be made with reference to the amplifying laser) 300 (see FIG. 7B). In other words, the charging voltage Vosc is not controlled for each pulse (see FIG. 7A). But, only when the pulse energy Posc of the oscillating laser 100 being monitored by a first monitor module 19 becomes lower than the lower limit energy Es0 of the amplification saturation region, the charging voltage Vosc of the oscillating laser 100 is increased. And, the pulse energy Pamp of the amplifying laser 300 is measured by a second monitor module 39, and a charging voltage (hereinafter, a charging voltage of the amplifying laser 300) Vamp of the amplifying capacitor (hereinafter referred to as the main capacitor) C0 which is disposed in an amplifying high-voltage pulse generator 32 of the amplifying laser 300 is controlled for each pulse (see FIG. 7C) so that the measured value becomes a target energy Patgt (see FIG. 7D).

Here, the amplification saturation region will be described with reference to FIG. 6. Where the pulse energy Posc of the seed light is Es0 or more (region 2), a ratio of a change in the pulse energy Pamp of the laser beam associated with a change of the pulse energy Posc of the seed light is negligibly small. In other words, even if the pulse energy Posc changes, there is no influence on the amplified pulse energy Pamp. The region where the pulse energy Posc of the seed light is Es0 or more is called as the amplification saturation region.

The oscillating laser 100 and the amplifying laser 300 can also be controlled by controlling at least either the laser gas pressure and the laser gas composition in the oscillating chamber 10 and the amplifying chamber 30 in addition to the control of the charging voltage Vosc and the charging voltage Vamp.

The second through fourth inventions use the properties that the pulse energy after the amplification is substantially constant even if the pulse energy of the seed light varies when the pulse energy of the laser beam (seed light) which is output from the oscillating laser 100 and injected into the amplifying laser 300 is in the amplification saturation region of about Es0 or more (region 2 of FIG. 6). Therefore, the amplified pulse energy is determined by a charging voltage of the amplifying laser, namely a charging voltage of the main capacitor C0 of the amplifying high-voltage pulse generator 32.

A fifth invention is the two-stage laser pulse energy control device according to the third or fourth inventions, wherein the charging voltage Vosc applied to the oscillating capacitor is nearly matched with the charging voltage Vamp applied to the amplifying capacitor.

A sixth invention is the two-stage laser pulse energy control device according to the third or fourth inventions, wherein a change ratio of the charging voltage Vosc applied to the oscillating capacitor is nearly matched with a change ratio of the charging voltage Vamp applied to the amplifying capacitor.

A seventh invention is the two-stage laser pulse energy control device according to the third or fourth inventions, wherein a change amount of the charging voltage Vosc applied to the oscillating capacitor is nearly matched with a change amount of the charging voltage Vamp applied to the amplifying capacitor.

The fifth through seventh inventions will be described. Even if timing when a solid-state switch SW of the oscillating high-voltage pulse generator 12 becomes an ON state and timing when a solid-state switch SW of the amplifying high-voltage pulse generator 32 becomes an ON state are constant, timing when a discharge occurs in each laser is variable depending on the values of the charging voltage Vosc of the oscillating laser 100 and the charging voltage Vamp of the amplifying laser 300. It is because the magnetic switches included in the magnetic pulse compression circuits which are disposed in the high-voltage pulse generators 12, 32 have a different Vt product property. This variation is corrected by the pulse energy control device of the present invention.

But, when the temperatures of the component elements (capacitors, magnetic switches, etc.) of the magnetic pulse compression circuits possessed by the individual high-voltage pulse generators 12, 32 vary under the operation conditions (repetition frequency, operating time, operation duty, downtime, etc.) of the oscillating laser 100 and the amplifying laser 300, the Vt product property itself varies.

Accordingly, it is desirably controlled such that the charging voltage Vosc to the main capacitor C0 disposed in the oscillating high-voltage pulse generator 12 and the charging voltage Vamp to the main capacitor C0 disposed in the amplifying high-voltage pulse generator 32 become substantially the same.

Otherwise, it is desirably controlled such that a change ratio of the charging voltage Vosc to the main capacitor C0 disposed in the oscillating high-voltage pulse generator 12 and a change ratio of the charging voltage Vamp to the main capacitor C0 disposed in the amplifying high-voltage pulse generator 32 are substantially the same.

Otherwise, it is desirably controlled such that a change amount of the charging voltage Vosc to the main capacitor C0 disposed in the oscillating high-voltage pulse generator 12 and a change amount of the charging voltage Vamp to the main capacitor C0 disposed in the amplifying high-voltage pulse generator 32 are substantially the same.

An eighth invention is a two-stage laser pulse energy control device, comprising:
  a two-stage laser which is comprised of:
    an optical oscillation stage which has an oscillating chamber having laser gas sealed therein and a pair of mutually opposed electrodes disposed therein, and an oscillating high-voltage pulse generator for applying a high-voltage pulse to the pair of electrodes in the oscillating chamber by performing pulse compression of energy charged in an oscillating capacitor in order to excite the laser gas in the oscillating chamber, and which outputs seed light, and
    an optical amplification stage which has an amplifying chamber having laser gas sealed therein and a pair of mutually opposed electrodes disposed therein and the seed light being injected therein, and an amplifying high-voltage pulse generator for applying a high-voltage pulse to the pair of electrodes in the amplifying chamber by performing pulse compression of energy charged in an amplifying capacitor in order to amplify the seed light, and which outputs a laser beam obtained from amplifying the seed light;
  a monitor module which measures a pulse energy Pamp of the laser beam, and
  controlling a pulse energy Pamp of the laser beam, wherein:
    the optical oscillation stage is controlled according to a measured result of the monitor module so that the pulse energy Pamp of the laser beam becomes a target energy Patgt of the optical amplification stage, and
    the target energy Patgt is set to fall in a region such that a change ratio of the pulse energy Pamp of the laser beam associated with a change of a pulse energy Posc of the seed light becomes a prescribed value or more.

A ninth invention is the two-stage laser pulse energy control device according to the eighth invention, wherein the optical amplification stage is controlled when the pulse energy Pamp of the laser beam does not become the target energy Patgt of the optical amplification stage even if the optical oscillation stage is controlled.

A tenth invention is the two-stage laser pulse energy control device according to the eighth invention, wherein the control in the optical oscillation stage controls a charging voltage Vosc applied to the oscillating capacitor.

An eleventh invention is the two-stage laser pulse energy control device according to the eighth invention, wherein the control in the optical oscillation stage controls at least one of laser gas pressure and laser gas composition in the oscillating chamber in addition to a control of a charging voltage Vosc applied to the oscillating capacitor.

A twelfth invention is the two-stage laser pulse energy control device according to the ninth invention, wherein:

the control in the optical oscillation stage controls a charging voltage Vosc applied to the oscillating capacitor, and the control in the optical amplification stage controls a charging voltage Vamp applied to the amplifying capacitor.

A thirteenth invention is the two-stage laser pulse energy control device according to the ninth invention, wherein:

the control in the optical oscillation stage controls at least one of laser gas pressure and laser gas composition in the oscillating chamber in addition to a control of a charging voltage Vosc applied to the oscillating capacitor, and the control in the optical amplification stage controls at least one of laser gas pressure and laser gas composition in the amplifying chamber in addition to a control of a charging voltage Vamp applied to the amplifying capacitor.

The eighth through thirteenth inventions will be described. The pulse energy Posc (namely, pulse energy of seed light injected into the amplifying laser 300) of the oscillating laser 100 is operated in a region with lower limit energy Es0 or less of the amplification saturation region of the amplifying laser 300. In this operation region, the pulse energy after the amplification varies according to a change in pulse energy of the seed light output from the oscillating laser 100 (see FIG. 6).

Accordingly, as a rule, the charging voltage Vamp of the amplifying laser 300 is controlled to be constant (not controlled for every pulse: see FIG. 19C). But, if the charging voltage Vosc of the oscillating laser 100 exceeds the upper limit charging voltage Vomax or if the pulse energy Pamp of the amplifying laser 300 is not target energy Patgt, the charging voltage Vamp of the amplifying laser 300 is increased.

The pulse energy Pamp of the amplifying laser 300 is measured by the second monitor module 39, and the charging voltage Vosc of the oscillating laser 100 is controlled for every pulse (see FIG. 19A) such that the measured value becomes the target energy Patgt (FIG. 19D).

The oscillating laser 100 and the amplifying laser 300 can be controlled by controlling at least one of the laser gas pressure and the laser gas composition in the oscillating chamber 10 and the amplifying chamber 30 in addition to the control of the charging voltage Vosc and the charging voltage Vamp.

The eighth through thirteenth inventions utilizes the property that the pulse energy after amplification depends on a change in the energy of the seed light when the pulse energy of the laser beam (seed light) which is output from the oscillating laser 100 and injected into the amplifying laser 300 is in a region (region 1 of FIG. 6) with the lower limit energy Es0 of the amplification saturation region or less. Therefore, the pulse energy after the amplification is determined according to a charging voltage of the oscillating laser 100, namely a charging voltage of the main capacitor C0 disposed in the oscillating high-voltage pulse generator 12.

A fourteenth invention is a two-stage laser pulse energy control device, comprising:

a two-stage laser which is comprised of:

an optical oscillation stage which has an oscillating chamber having laser gas sealed therein and a pair of mutually opposed electrodes disposed therein, and an oscillating high-voltage pulse generator for applying an high-voltage pulse to the pair of electrodes in the oscillating chamber by performing pulse compression of energy charged in an oscillating capacitor in order to excite the laser gas in the oscillating chamber, and which outputs seed light, and an optical amplification stage which has an amplifying chamber having laser gas sealed therein and a pair of mutually opposed electrodes disposed therein and the seed light being injected therein, and an amplifying high-voltage pulse generator for applying a high-voltage pulse to the pair of electrodes in the amplifying chamber by performing pulse compression of energy charged in an amplifying capacitor in order to amplify the seed light, and which outputs a laser beam obtained from amplifying the seed light;

a first monitor module which measures a pulse energy Posc of the seed light; and a second monitor module which measures a pulse energy Pamp of the laser beam, and controlling the pulse energy Pamp of the laser beam, wherein:

the optical oscillation stage is controlled according to a measured result of the first monitor module so that the pulse energy Posc of the seed light becomes a target energy Potgt of the optical oscillation stage, and the optical amplification stage is controlled according to a measured result of the second monitor module so that the pulse energy Pamp of the laser beam becomes a target energy Patgt of the optical amplification stage.

A fifteenth invention is the two-stage laser pulse energy control device according to the fourteenth invention, wherein the control in the optical oscillation stage controls a charging voltage Vosc applied to the oscillating capacitor, and the control in the optical amplification stage controls a charging voltage Vamp applied to the amplifying capacitor.

A sixteenth invention is the two-stage laser pulse energy control device according to the fourteenth invention, wherein:

the control in the optical oscillation stage controls at least one of laser gas pressure and laser gas composition in the oscillating chamber in addition to a control of a charging voltage Vosc applied to the oscillating capacitor, and the control in the optical amplification stage controls at least one of laser gas pressure and laser gas composition in the amplifying chamber in addition to a control of a charging voltage Vamp applied to the amplifying capacitor.

The fourteenth through sixteenth inventions will be described. The charging voltage Vosc of the oscillating laser 100 is controlled for every pulse (the second osc spike control processing, the second osc pulse-by-pulse control processing described later) (see FIG. 25A), and the pulse energy Posc (namely, the pulse energy of the seed light injected into the amplifying laser 300) of the oscillating laser 100 measured by the first monitor module 19 becomes the target energy Potgt (see FIG. 25B). And, the pulse energy Pamp of the amplifying laser 300 is measured by the second monitor module 39, and the charging voltage Vamp of the amplifying laser 300 is controlled for every pulse (see FIG. 25C) such that the measured value becomes the target energy Patgt (see FIG. 25D).

The control of the oscillating laser 100 and the amplifying laser 300 can also be made by controlling at least one of the laser gas pressure and the laser gas composition in the oscillating chamber 10 and the amplifying chamber 30 in addition to the control of the charging voltage Vosc and the charging voltage Vamp.

The fourteenth through sixteenth inventions keep the pulse energy of the laser beam (seed light), which is output from the oscillating laser 100 and injected in the amplifying laser 300, at prescribed target energy Potgt. The setting region of the target energy Potgt is arbitrary and may be either a region (region 1 of FIG. 6) with the lower limit energy Es0 of the amplification saturation region or less or a region (region 2 of FIG. 6) with the lower limit energy Es0 or more. And, the pulse energy of the seed light is kept at the target energy Potgt, and the pulse energy after the amplification is determined according to the charging voltage of the amplifying laser 300, namely the charging voltage of the main capacitor C0 disposed in the amplifying high-voltage pulse generator 32.

A seventeenth invention is a two-stage laser system, comprising:

the two-stage laser pulse energy control device according to the first through sixteenth inventions, and an exposure device which exposes an object of light exposure using a laser beam.

An eighteenth invention is the two-stage laser system according to the seventeenth invention, wherein the two-stage laser is any of a KrF laser, an ArF laser and a molecular fluorine laser.

The seventeenth and eighteenth inventions are specific embodiments of the first through sixteenth inventions.

EFFECTS OF THE INVENTION

According to the first invention, the pulse energy of the two-stage laser can be controlled. Therefore, the pulse energy of the two-stage laser can be stabilized.

According to the first invention, the oscillating laser and the amplifying laser can be controlled apparently separately, so that the control can be made stably, and an error does not occur readily. Therefore, the accuracy of the control can be improved.

According to the second through fourth inventions, the same effects as those obtained by the first invention can be obtained.

Especially, according to the second through fourth inventions, the oscillating laser can be controlled by simply controlling the pulse energy of the seed light to the above-described Es0 or more (e.g., a charging voltage of the oscillating laser is kept constant), and it is not necessary to control the pulse energy with high accuracy. Substantially, the amplifying laser is just controlled strictly. The pulse energy Pamp after the amplification is measured, and according to the measured result, the charging voltage Vamp of the amplifying laser is controlled for every pulse, thereby enabling to control the pulse energy of the amplified laser beam with high accuracy.

When the control includes simple control and strict control as in the second through fourth inventions, the control is easy, so that a computation load of the controller is low. Therefore, a high-performance controller is not needed, and the cost can be reduced.

And, joint use of the control to vary a gas pressure and a gas composition of the oscillating laser and the control to vary them of the amplifying laser enables to make pulse energy control for compensating a medium-term (during the gas life) and long-term (laser chamber's life length) output drop, and it becomes possible to control the pulse energy stably for a long period.

As in the fifth through seventh inventions, an influence of a change in Vt product property itself can be decreased by controlling such that a charging voltage applied to the capacitor of the oscillating high-voltage pulse generator is nearly matched with at least one of a charging voltage applied to the capacitor of the amplifying high-voltage pulse generator, a change ratio of both the charging voltages and a change amount of both the charging voltages.

Setting of the relationship of both the charging voltages as in the fifth through seventh inventions enables to decrease a fluctuation range of the pulse energy of the two-stage laser due to a synchronous change of the oscillating laser and the amplifying laser in addition to the provision of the effects that an influence of the output change of the seed light to the pulse energy of the laser beam becomes small and the pulse energy control of the laser beam output from the two-stage laser becomes good.

According to the eighth through thirteenth inventions, the same effects as those of the first invention can be obtained.

Especially, in the eighth through thirteenth inventions, the control of the amplifying laser may be simple control (for example, a charging voltage of the amplifying laser is kept constant) of a level such that amplification intensity (namely, a value of the voltage of the amplifying laser applied between electrodes), by which the pulse energy of the laser beam after the amplification becomes the target energy Patgt by the pulse energy control of the seed light, is kept, and substantially the oscillating laser is just controlled strictly. The pulse energy Pamp after the amplification is measured, and the charging voltage Vosc of the oscillating laser is controlled for every pulse according to the measured result, thereby enabling to realize the high-precision pulse energy control of the laser beam after the amplification.

As in the eighth through thirteenth inventions, a computation load of the controller is small because the control including one simple control and the other strict control is easy. Therefore, a high-performance controller is not needed, and the cost can be reduced.

And, by joint use of the control to vary a gas pressure and a gas composition of the oscillating laser and the amplifying laser, the pulse energy control for compensating a medium-term (during gas life) and long-term (laser chamber's life length) output drop becomes possible, and the pulse energy can be controlled stably for a long period.

According to the fourteenth through sixteenth inventions, the same effects as those in the first invention can be obtained.

Especially, according to the fourteenth through sixteenth inventions, the pulse energy Posc of the laser beam (seed light) which is output from the oscillating laser and injected into the amplifying laser is measured, and according to the measured result, the charging voltage Vosc of the oscillating laser is controlled for every pulse, while the pulse energy Pamp after the amplification is measured, and according to the measured result, the charging voltage Vamp of the amplifying laser is controlled for every pulse, so that the high-precision pulse energy control of the laser beam after the amplification can be realized.

According to the fourteenth through sixteenth inventions, the pulse energy of the seed light is controlled with high accuracy, so that an influence of the laser beam after the amplification upon the pulse energy due to a change in energy of the seed light can be reduced. If the target energy Potgt of the seed light is in the amplification saturation region, the influence of the laser beam after the amplification by a change in the energy of the seed light upon the pulse energy can be additionally reduced in comparison with the second through fourth inventions. Meanwhile, both the oscillating laser and the amplifying laser are controlled very accurately, so that the controller has a large computation load in comparison with those in the second through fourth inventions.

BEST MODES FOR CARRYING OUT THE INVENTION

Embodiments of the present invention will be described with reference to the drawings.

Structure

FIG. 1 is a structure diagram of the laser system according to this embodiment. And, FIG. 2A is a structure diagram of an oscillating chamber and its vicinity, and FIG. 2B is a structure diagram of an amplifying chamber and its vicinity. FIG. 1 shows the two-stage laser apparatus of an MOPO system.

In a two-stage laser apparatus 2, seed light (seed laser beam) is produced and narrow-banded by an oscillating laser (osc) 100. And, the seed light is amplified by an amplifying laser (amp) 300. Specifically, spectral characteristics of laser system as a whole depend on the spectral characteristics of the laser beam output from the oscillating laser 100, and the laser output (energy or power) of the laser system itself depends on the amplifying laser 300. The laser beam output from the amplifying laser 300 is input to an exposure device 3, and this laser beam is used to expose an exposure target (e.g., a wafer).

The oscillating laser 100 is comprised of an oscillating chamber 10, a charger 11, an oscillating high-voltage pulse generator 12, a gas supply/discharge unit 14, a cooling water supply unit 15, an LNM 16, a front mirror 17, a first monitor module 19 and a discharge detecting portion 20.

The amplifying laser 300 is comprised of an amplifying chamber 30, a charger 31, an amplifying high-voltage pulse generator 32, a gas supply/discharge unit 34, a cooling water supply unit 35, a rear mirror 36, an output mirror 37 and a second monitor module 39.

Here, the oscillating laser 100 and the amplifying laser 300 will be described, but their components are partly same, and the same components will be described with reference to the oscillating laser 100.

A pair of electrodes (a cathode electrode and an anode electrode) 10a, 10b which are separated from each other by a prescribed distance, parallel mutually in a longitudinal direction and made to oppose their discharge faces are disposed in the oscillating chamber 10. To these electrodes 10a, 10b are applied a high-voltage pulse by a power source which is comprised of the charger 11 and the oscillating high-voltage pulse generator 12. Then, a discharge is produced between the electrodes 10a and 10b, and laser gas sealed in the oscillating chamber 10 is excited by the discharge. An example of the power source is shown in FIGS. 3A and 3B.

FIGS. 3A and 3B are diagrams showing examples of the circuit structures of the power source and within the chamber.

The oscillating high-voltage pulse generator 12 shown in FIG. 3A is a two-stage magnetic pulse compression circuit using three magnetic switches SR1, SR2, SR3 comprising a saturable reactor. The magnetic switch SR1 is disposed to reduce a switching loss of the solid-state switch SW and also called as the magnetic assist. For example, a semiconductor switching element such as an IGBT is used for the solid-state switch SW. The circuit shown in FIG. 3B may be used instead of the circuit shown in FIG. 3A. FIG. 3B shows a circuit including a voltage increasing transformer Tr1 in addition to the magnetic pulse compression circuit, and FIG. 3B shows an example including a charging reactor L1 for the main capacitor C0 instead of the voltage increasing transformer.

The circuit structure and operation will be described with reference to FIG. 3A. The circuit shown in FIG. 3B operates in the same manner as the circuit shown in FIG. 3A except that the operation to increase the voltage by the voltage increasing transformer is omitted, so that its description is omitted. Because the structures and operations of the power source of the oscillating laser 100 and the power source of the amplifying laser 300 are same, descriptions of the power source of the amplifying laser 300 are omitted.

The voltage of the charger 11 is adjusted to a prescribed value HV, and the main capacitor C0 is charged. At this time, the solid-state switch SW is OFF. When the charging of the main capacitor C0 is completed and the solid-state switch SW becomes ON, the voltage applied to both ends of the solid-state switch SW is mainly applied to both ends of the magnetic switch SR1. When the temporal integrated value of a charging voltage V0 of the main capacitor C0 applied to both ends of the magnetic switch SR1 reaches a limiting value which is determined according to the properties of the magnetic switch SR1, the magnetic switch SR1 is saturated to fall in a conductive state. Then, an electric current flows through a loop of the main capacitor C0, the magnetic switch SR1, the primary side of the voltage increasing transformer Tr1 and the solid-state switch SW. At the same time, an electric current flows through a loop of the secondary side of the voltage increasing transformer Tr1 and a capacitor C1, and electric charge accumulated in the main capacitor C0 transfers to the capacitor C1, and the capacitor C1 is recharged.

When the temporal integrated value of voltage V1 of the capacitor C1 reaches a limiting value which is determined according to the characteristic of the magnetic switch SR2, the magnetic switch SR2 is saturated to fall in a conductive state. Then, an electric current flows through a loop of the capacitor C1, a capacitor C2 and the magnetic switch SR3, and electric charge accumulated in the capacitor C1 transfers to the capacitor C2, and the capacitor C2 is recharged.

When the temporal integrated value of voltage V2 of the capacitor C2 reaches a limiting value which is determined according to the characteristic of the magnetic switch SR3, the magnetic switch SR3 is saturated to fall in a conductive state. Then, an electric current flows through a loop of the capacitor C2, a peaking capacitor Cp and the magnetic switch SR3, and the electric charge accumulated in the capacitor C2 transfers to the peaking capacitor Cp, and the peaking capacitor Cp is recharged.

As shown in FIG. 3A, preliminary ionization means which is comprised of a first electrode 91, a dielectric tube 92 and a second electrode 93 is disposed in the oscillating chamber 10. A corona discharge for preliminary ionization generates on the outer peripheral surface of the dielectric tube 92 with a portion, where the dielectric tube 92, in which the first electrode 91 is inserted, and the second electrode 93 are mutually contacted, as a base point. As the peaking capacitor Cp is recharged, its voltage Vp increases, and when the voltage Vp reaches a prescribed level, a corona discharge generates on the outer peripheral surface of the dielectric tube 92. Ultraviolet rays are generated on the periphery of the dielectric tube 92 by the corona discharge, and the laser gas between the pair of electrodes 10a and 10b is preliminarily ionized.

As the peaking capacitor Cp is further recharged, the voltage Vp of the peaking capacitor Cp increases. When this voltage Vp reaches a prescribed value (breakdown voltage) Vb, the laser gas between the pair of electrodes 10a and 10b is subjected to dielectric breakdown, and main discharge is started. A laser medium is excited by the main discharge. And, the oscillating laser 100 produces seed light, and the amplifying laser 300 (or an amplifier) amplifies the injected seed light. The voltage of the peaking capacitor Cp drops sharply by the main discharge and returns to the state before the start of recharging in due time.

The discharge operation is repeated by the switching operation of the solid-state switch SW to conduct pulse laser oscillation. The switching operation of the solid-state switch SW is conducted according to a trigger signal from the outside. An outside controller which sends out the trigger signal is, for example, a synchronous controller 8 described later.

In this embodiment, a two-stage capacity transfer type circuit is comprised of the magnetic switches SR2, SR3 and the capacitors C1, C2. In the capacity transfer type circuit, when it is determined to decrease the inductance of the individual stages toward the later stages, a pulse compression operation that a pulse width of a current pulse flowing through the individual stages becomes narrow successively can be realized. As a result, a short pulse strong discharge is realized between the pair of electrodes 10a and 10b and between a pair of electrodes 30a and 30b.

Here, another structure will be described with reference to FIG. 1.

A laser gas which is supplied from the gas supply/discharge unit 14 is sealed in the oscillating chamber 10. A gas supply system which supplies the laser gas into the oscillating chamber 10 and a gas exhaust system which discharges the laser gas from the oscillating chamber 10 are disposed on the gas supply/discharge unit 14. Where the laser apparatus is used as a molecular fluorine (F2) laser, the gas supply/discharge unit 14 supplies a fluorine (F2) gas and a buffer gas comprising helium (He), neon (Ne) or the like to the oscillating chamber 10. And, where the laser apparatus is used as a KrF excimer laser, the gas supply/discharge unit 14 supplies krypton (Kr) gas, fluorine (F2) gas and a buffer gas which comprises helium (He), neon (Ne) or the like to the oscillating chamber 10. And, where the laser apparatus is used as an ArF excimer laser, the gas supply/discharge unit 14 supplies argon (Ar) gas, fluorine (F2) gas and a buffer gas which comprises helium (He), neon (Ne) or the like to the oscillating chamber 10. The supply and discharge of the individual gases are controlled by opening and closing of the individual valves of the gas supply/discharge unit 14.

And, a crossflow fan 10c is disposed within the oscillating chamber 10. The laser gas is circulated in the chamber by the crossflow fan 10c and sent between the electrodes 10a and 10b.

A heat exchanger 10d is disposed in the oscillating chamber 10. The heat exchanger 10d exhausts heat in the oscillating chamber 10 with cooling water. The cooling water is supplied from the cooling water supply unit 15. The supply of the cooling water is controlled by opening and closing the valve of the cooling water supply unit 15.

In the oscillating chamber 10, windows 10e, 10f are respectively disposed on the optical axis of the laser beam and at the output portion of the laser beam. The windows 10e, 10f are made of a material, e.g., CaF2, which has a transparency for the laser beam. Both the windows 10e, 10f are disposed with their outside surfaces in parallel to each other at a Brewster's angle with respect to the laser beam in order to reduce a reflection loss and also disposed such that a linear polarizing direction of the laser beam becomes perpendicular to the window planes.

A pressure sensor P1 monitors the gas pressure in the oscillating chamber 10 and outputs a signal indicating the gas pressure to the utility controller 5. The utility controller 5 generates and outputs a signal, which instructs opening and closing of the each valve and its opening degree (or gas flow rate), to the gas supply/discharge unit 14 according to the processing described later. Thus, the gas composition and gas pressure in the oscillating chamber 10 are controlled so that the gas supply/discharge unit 14 can control to open and close the each valve.

The laser output is variable depending on the gas temperature. Accordingly, a temperature sensor T1 monitors the temperature in the oscillating chamber 10, and outputs a signal indicating the temperature to the utility controller 5. The utility controller 5 generates and outputs a signal, which instructs the opening and closing of the valve and its opening angle (or a cooling water flow rate), to the cooling water supply unit 15 in order to have a desired temperature in the oscillating chamber 10. Then, a flow rate, namely, an exhaust heat quantity of the cooling water supplied to the heat exchanger 10d in the oscillating chamber 10 is controlled because the cooling water supply unit 15 controls opening and closing of the valve.

The LNM 16 is disposed outside of the oscillating chamber 10 and on the optical axis of the laser beam on the window 10e side, and the front mirror 17 is disposed on the optical axis of the laser beam on the window 10f side. The LNM 16 is comprised of, for example, a magnifying prism and an optical element which is a wavelength selecting element such as a grating (diffraction grating). And, the LNM 16 may be configured of etalon as the wavelength selecting element and an optical element such as a total reflection mirror. A laser resonator is comprised of the optical element in the LNM 16 and the front mirror 17.

The first monitor module 19 monitors laser beam characteristics such as energy, output line width, center wavelength and the like of the laser beam having passed through the front mirror 17. The first monitor module 19 generates a signal indicating a center wavelength of the laser beam and outputs the signal to a wavelength controller 6. And, the first monitor module 19 measures energy of the laser beam and outputs a signal indicating the energy to an energy controller 7.

The configurations and functions of the electrodes 30a, 30b, a crossflow fan 30c, a heat exchanger 30d, windows 30e, 30f of the amplifying chamber 30 are the same as those of the individual portions of the above-described oscillating chamber 10. And, the configurations and functions of the charger 31, the amplifying high-voltage pulse generator 32, the gas supply/discharge unit 34, the cooling water supply unit 35, the second monitor module 39, a pressure sensor P2, a temperature sensor T2 disposed in the amplifying laser 300 are the same as those of the same elements disposed in the above-described oscillating laser 100.

Meanwhile, the amplifying laser 300 is provided with an unstable resonator described below instead of the resonator comprising the LNM and the like disposed in the oscillating laser 100.

The rear mirror 36 is disposed outside of the amplifying chamber 30 and on the optical axis of the laser beam on the window 30e side, and the output mirror 37 is disposed on the optical axis of the laser beam on the window 30f side. The unstable resonator is comprised of the rear mirror 36 and the output mirror 37. The reflecting surface of the rear mirror 36 is concave and provided with a hole in its center to let the laser beam pass from the rear of the mirror to the reflecting surface side. The reflecting surface of the rear mirror 36 has an HR (High Reflection) coat. The reflecting surface of the output mirror 37 is convex, its center has the HR (High Reflection) coat, and the vicinity of the center has an AR (Anti Reflection) coat. As the rear mirror 36, one having a hole in the center is not used, but a mirror substrate, which has only a portion corresponding to the hole coated with the AR, may be used. And, a stable resonator may be used instead of the unstable resonator.

A beam propagation portion 42 including a reflecting mirror is disposed between the front mirror 17 of the oscillating laser 100 and the rear mirror 36 of the amplifying laser 300.

The laser beam having passed through the front mirror 17 is guided to the rear mirror 36 by the beam propagation portion 42. Besides, the laser beam passes through the hole of the rear mirror 36, passes through the amplifying chamber 30, and is reflected from the center of the output mirror 37. The laser beam reflected by the output mirror 37 passes through the amplifying chamber 30 and is reflected from the vicinity of the hole of the rear mirror 36. Besides, the laser beam reflected by the rear mirror 36 is output after passing through the amplifying chamber 30 and the periphery of the center portion of the output mirror 37. A discharge occurs when the laser beam passes through the discharge portion, namely between the electrodes 30a and 30b of the amplifying chamber 30, and the power of the laser beam is amplified.

To the wavelength controller 6 are input the signals from the monitor modules 19 and 39. The wavelength controller 6 generates a signal to vary a selected wavelength of the wavelength selecting element (grating, etalon, etc.) in the LNM 16 in order to make the laser beam have a desired center wavelength and outputs the signal to a driver 21. The selected wavelength of the wavelength selecting element is varied by, for example, varying an incidence angle of the laser beam which enters the wavelength selecting element. The driver 21 controls a posture angle and the like of the optical element (e.g., a magnifying prism, a total reflection mirror, grating, etc.) in the LNM 16 according to the received signal, so that the incidence angle of the laser beam which enters the wavelength selecting element varies. The wavelength selecting control of the wavelength selecting element is not limited to the above. For example, where the wavelength selecting element is an air gap etalon, an air pressure (nitrogen or the like) in the air gap in the LNM 16 may be controlled, or a gap interval may be controlled.

To the energy controller 7 are input the output signals from the monitor modules 19 and 39. As shown in FIG. 1, an output monitor 51 is disposed in the exposure device 3 and its output signal may be directly input to the energy controller 7. And, the output signal of the output monitor 51 of the exposure device 3 may be input to a controller 52 of the exposure device 3 such that the controller 52 sends a signal to the energy controller 7 mounted in the laser. The energy controller 7 generates a signal indicating next charging voltages Vosc, Vamp in order to adjust the pulse energy to a desired value according to processing described later and outputs the signal to the synchronous controller 8.

The signal from the energy controller 7 and the signals, which are output from the discharge detectors 20, 40 and inform the start of discharge in the individual chambers 10, 30, are input to the synchronous controller 8. The synchronous controller 8 controls a charging voltage of the charger 11 according to the signal from the energy controller 7. If the timings of the discharge of the oscillating chamber 10 and the discharge of the amplifying chamber 30 are deviated, the laser beam output from the oscillating chamber 10 is not amplified efficiently by the amplifying chamber 30. Accordingly, it is necessary to discharge in the amplifying chamber 30 at the timing of filling the laser beam (seed light) output from the oscillating chamber 10 into a discharge region (excitation region) between the pair of electrodes 30a, 30b in the amplifying chamber 30.

Here, the discharge timings of the oscillating laser 100 and the amplifying laser 300 will be described. As described above, the oscillating high-voltage pulse generator 12 and the amplifying high-voltage pulse generator 32 each having the magnetic pulse compression circuit are used to apply a high-voltage pulse with a quick rise time between the electrodes 10a and 10b in the oscillating chamber 10 and between the electrodes 30a and 30b in the amplifying chamber 30. Generally, the magnetic switches SR2, SR3 used in the magnetic pulse compression circuits of the individual high-voltage pulse generators 12, 32 are saturable reactors. Where energy (voltage pulse) is transferred from the main capacitor C0, there is a relationship that a product (Vt product) value of a voltage (V: namely, a charging voltage of the main capacitor C0) applied to the magnetic switches SR2, SR3 and a transfer time (t) of a voltage pulse which is subjected to pulse compression and transferred by the magnetic switches SR2, SR3 is constant. For example, when a charging voltage of the main capacitor C0 becomes high, a transfer time of the voltage pulse (namely, time when the magnetic switch is ON) becomes short.

FIGS. 4 and 5 are diagrams showing relationships between a period from a time when the solid-state switch SW of the high-voltage pulse generator falls in an ON state to a time when a discharge occurs between the electrodes and a charging voltage of the main capacitor C0.

FIG. 4 shows an example that the oscillating laser 100 and the amplifying laser 300 have the same charging voltage setting range. There are shown a charging voltage setting range of the main capacitor C0 disposed in the oscillating high-voltage pulse generator 12, namely a characteristic curve A when the voltage setting range of the charger 11 is Vc1 to Vc2 (Vc1<Vc2), and a charging voltage setting range of the main capacitor C0 disposed in the amplifying high-voltage pulse generator 32, namely a characteristic curve B when the voltage setting range of the charger 31 is Vc1 to Vc2 (Vc1<Vc2).

A difference between the two characteristic curves A and B results from a difference (difference in circuit constant) in design of the magnetic pulse compression circuits possessed by the individual high-voltage pulse generators 12, 32 or an individual difference of circuit elements configuring the magnetic pulse generating circuit even if the design is same.

As apparent from FIG. 4, when a charging voltage of the oscillating laser 100 is Vc2 and a charging voltage of the amplifying laser 300 is Vc1, a difference in time from when the individual solid-state switches SW fall in an ON state to when a discharge occurs between the electrodes becomes a maximum value T1.

And, when a charging voltage of the oscillating laser 100 and a charging voltage of the amplifying laser 300 are the voltage Vc1, a difference in time from when the individual solid-state switches SW fall in an ON state to when a discharge occurs between the electrodes becomes T2, and when they are voltage Vc2, the difference becomes T3 (T2>T3 in the example of FIG. 4).

Meanwhile, FIG. 5 shows an example that the oscillating laser 100 and the amplifying laser 300 have a different charging voltage setting range. Here, there are shown a characteristic curve C when a charging voltage setting range of the main capacitor C0 disposed in the oscillating high-voltage pulse generator 12, namely a voltage setting range of the charger 11, is Vco1 to Vco2 (Vco1<Vco2), and a characteristic curve D when a charging voltage setting range of the main capacitor C0 disposed in the amplifying high-voltage pulse generator 32, namely the voltage setting range of the charger 31, is Vca1 to Vca2 (Vca1<Vca2).

As apparent from FIG. 5, when a charging voltage of the oscillating laser 100 is Vco2 and a charging voltage of the amplifying laser 300 is Vca1, a difference in time from when the individual solid-state switches SW fall in an ON state to when a discharge occurs between the electrodes becomes the maximum value T1.

And, when a charging voltage of the oscillating laser 100 is Vco1 and a charging voltage of the amplifying laser 300 is Vca1, a difference in time from when the individual solid-state switches SW fall in an ON state to when a discharge occurs between the electrodes becomes T2, and when a charging voltage of the oscillating laser 100 is Vco2 and a charging voltage of the amplifying laser 300 is Vca2, the difference becomes T3 (T2>T3 in the example of FIG. 5).

Thus, even if the timing when the solid-state switch SW of the oscillating high-voltage pulse generator 12 falls in the ON state and the timing when the solid-state switch SW of the amplifying high-voltage pulse generator 32 falls in the ON state are constant respectively, timings when discharges occur by the individual lasers are variable depending on the values of the charging voltage Vosc of the oscillating laser 100 and the charging voltage Vamp of the amplifying laser 300.

Therefore, the synchronous controller 8 determines delay times of a trigger signal to the solid-state switch SW of the amplifying high-voltage pulse generator 32 with respect to a trigger signal to the solid-state switch SW of the oscillating high-voltage pulse generator 12 according to a signal (charging voltages Vosc, Vamp) from the energy controller 7 and signals from the discharge detectors 20, 40.

Specifically, the synchronous controller 8 determines a delay time considering the Vt product property of the above-described voltage and the transfer time in view of a charging voltage signal (voltages Vosc, Vamp) for the next discharge received from the energy controller 7.

And, the synchronous controller 8 executes feedback compensation of the delay time according to the signals from the discharge detectors 20, 40, which are the results of measuring the actual discharge timing.

Timings of the occurrence of discharges by the individual lasers are also variable depending on the pressure of the laser gas filled in the individual chambers. Generally, when the laser gas has a high pressure when the discharge occurs between the electrodes, a voltage applied to the electrodes becomes high. Therefore, when the pressure of the laser gas becomes high, a time from when the solid-state switch SW of the individual high-voltage pulse generators 12, 32 falls in an ON state by the trigger signal from the synchronous controller 8 to when a discharge occurs between the electrodes 10a and 10b and between the electrodes 30a and 30b becomes long. The above-described feedback compensation compensates the difference in discharge timing resulting form a factor other than the Vt product property.

And, the synchronous controller 8 outputs a trigger signal to the solid-state switch SW of the amplifying high-voltage pulse generator 32 after a lapse of a prescribed delay tine after the trigger signal is output to the solid-state switch SW of the oscillating high-voltage pulse generator 12.

Naturally, the delay time might be a negative value depending on the value of a charging voltage (namely, setting voltages of the chargers 11, 31) of the main capacitor C0 disposed in the individual high-voltage pulse generators 12, 32. Specifically, the synchronous controller 8 might output a trigger signal to the solid-state switch SW of the oscillating high-voltage pulse generator 12 after a lapse of a determined delay time after the trigger signal is previously output to the solid-state switch SW of the amplifying high-voltage pulse generator 32.

And, in this control embodiment, the synchronous controller 8 has the discharge occurrence timing in the oscillating chamber 10 and the amplifying chamber 30 detected by the discharge detectors 20, 40 as information for determining the delay time, but information is not limited to them.

For example, the timing of outputting the laser beam of the oscillating laser 100 detected by the first monitor module 19 and the timing of outputting the laser beam of the amplifying laser 300 detected by the second monitor module 39 may be used.

And, the timing of outputting the laser beam of the oscillating laser 100 detected by the first monitor module 19 and the timing of the occurrence of a discharge in the amplifying chamber 30 detected by the discharge detector 40 may also be used.

The utility controller 5, the wavelength controller 6 and the energy controller 7 are connected to the main controller 4. Besides, the exposure device 3 (for example, the controller 52) is connected to the main controller 4. The main controller 4 assigns the control to the individual controllers 5 through 7 according to the instruction signal from the exposure device 3. The individual controllers 5 through 7 perform processing according to the instruction.

The structure of the laser apparatus of the MOPO system was described above. But the laser apparatus of the MOPA system has a structure in that the amplifying chamber 30 is not provided with the rear mirror 36 and the output mirror 37. In the MOPA system, the number of times to pass light through the amplifying chamber 30 is one time but not limited to it. For example, a reflecting mirror may be disposed to pass the light through the amplifying chamber a plural number of times. By configuring as above, it becomes possible to obtain a higher power laser beam.

Basic Concept of the Present Invention

Here, a basic concept of the pulse energy control of the present invention will be described with reference to the characteristics of the pulse energy of the seed light injected into the amplifying laser of the two-stage laser and the pulse energy after the amplification.

FIG. 6 is a diagram showing a relationship between a pulse energy of seed light injected into the amplifying laser and pulse energy after the amplification.

In the two-stage laser, a pulse energy of the laser beam (seed light) injected into the amplifying laser 300 and a pulse energy of the laser beam output from the amplifying laser 300 are mutually related as shown in FIG. 6. Curves A through C are characteristics obtained when charging voltages (namely, setting voltages of the charger 31) of the main capacitor C0 disposed in the amplifying high-voltage pulse generator 32 are assumed to be HV1, HV2, HV3 (HV1>HV2>HV3).

As shown in FIG. 6, when the pulse energy of the laser beam (seed light) injected into the amplifying laser 300 is in a region of less than about Es0 (referred to as region 1), the pulse energy after the amplification increases as the energy of the seed light increases. Meanwhile, when the energy of the seed light injected into the amplifying laser 300 is in a region of about Es0 or more (referred to as region 2), the pulse energy after the amplification is substantially constant even if the energy of the seed light increases. Thus, the pulse energy after the amplification is in a saturated state and does not increase substantially in the region 2. Therefore, the region 2 is called as the amplification saturation region. Even if the energy of the seed light varies in the amplification saturation region, an influence on the pulse energy after the amplification is small. Therefore, the easiest control method of the two-stage laser performs the control by the oscillating laser 100 to make the pulse energy of the laser beam to be output to the lower limit energy Es0 or more of the amplification saturation region and performs the control by the amplifying laser 300 to make the pulse energy of the laser beam to be output to the target pulse energy. The first control example to be described later is based on this concept. But, it may also be configured in the same manner as the second and third control examples described later.

According to FIG. 6, it is seen that the pulse energy of the laser beam after the amplification is higher as the charging voltage Vamp of the main capacitor C0 disposed in the amplifying high-voltage pulse generator 32 is higher regardless of the regions 1, 2. Therefore, it can be said that the pulse energy after the amplification can be controlled by controlling the charging voltage Vamp. In other words, high-precision energy control becomes possible by determining the control of the charging voltage Vamp as pulse-by-pulse control (amp spike control processing, amp pulse-by-pulse control processing, and amp exposure amount constant control processing described later). It is not shown but the same curves A through C can be obtained by not controlling the charging voltage Vamp but the controlling laser gas pressure and laser gas composition in the amplifying chamber 30. Specifically, the pulse energy can be increased by increasing a total gas pressure of the laser. For the gas composition control, the laser output can be restored by, for example, supplying a reduced portion of fluorine (F2) gas by the laser oscillation. Therefore, it can be said that the pulse energy of the laser beam to be output can be controlled by controlling the laser gas pressure and the laser gas composition in the same manner as the charging voltage Vamp. But, because the gas control has a slow response in comparison with the charging voltage control, it cannot control the pulse energy of every pulse. The gas control method will be described later.

The two-stage laser of the MOPA system also has the same relationship between the energy of the seed light injected into the amplifier and the pulse energy after the amplification as that of the amplifying laser. Therefore, the pulse energy of the laser beam output from the two-stage laser of the MOPA system can be controlled according to the same basic concept. But, a difference between the MOPO system and the MOPA system is that the lower limit energy Es0 of the amplification saturation region is considerably small for the MOPO system. In other words, the MOPO system may have smaller pulse energy (seed light energy) of the oscillating laser, so that the applied energy (namely, the energy from a commercial power source) for operating the oscillating laser may be small. Accordingly, the two-stage laser as a whole has high operation efficiency.

CONTROL EXAMPLES

Control examples according to the present invention will be described below.

1. First Control Example

FIGS. 7A to 7D are diagrams showing individual charging voltages and individual pulse energies in a first control example. Individual rectangular waves shown in FIGS. 7A to 7D indicate charging voltages and pulse energies in one burst.

The first control example keeps constant a charging voltage (hereinafter referred to as a charging voltage of the oscillating laser 100 or simply a charging voltage) of the main capacitor C0 disposed in the oscillating high-voltage pulse generator 12 of the oscillating laser 100 according to the target pulse energy and also varies a charging voltage (hereinafter referred to as a charging voltage of the amplifying laser 300 or simply a charging voltage) of the main capacitor C0 disposed in the amplifying high-voltage pulse generator 32 of the amplifying laser 300.

The first control example will be described briefly. As a rule, a charging voltage Vosc of the oscillating laser 100 is controlled to be constant such that the pulse energy (namely, pulse energy of seed light injected into the amplifying laser 300) Posc of the oscillating laser 100 becomes the lower limit energy Es0 or more of the amplification saturation region of the amplifying laser 300 (see FIG. 7B). In other words, the charging voltage Vosc is not controlled for each pulse (see FIG. 7A). But, only when the pulse energy Posc of the oscillating laser 100 being monitored by the first monitor module 19 becomes lower than the lower limit energy Es0 of the amplification saturation region, the charging voltage Vosc of the oscillating laser 100 is increased. And, the pulse energy Pamp of the amplifying laser 300 is measured by the second monitor module 39, and the charging voltage Vamp of the amplifying laser 300 is controlled for every pulse (see FIG. 7C) so that this measured value becomes the target energy Patgt (see FIG. 7D).

The detection of the laser beam is not limited to the outlet of the amplifying laser 300. The amplifying laser 300 can also be controlled based on the measured results by measuring the pulse energy Pamp by detecting the laser beam at an arbitrary point on a light path from the amplifying laser 300 to an exposure target (for example, a wafer) of the exposure device 3.

It is desirable to detect the laser beam not near the outlet of the amplifying laser 300 but in the above-described light path, particularly a point as close as possible to the exposure target (for example, a wafer). The laser beam output from the amplifying laser 300 passes through plural optical elements and slits to reach from the outlet of the amplifying laser 300 to the exposure target. Here, for example, if a beam profile of the laser beam or an output axis of the laser beam varies, a pulse energy of the output laser beam does not vary substantially near the outlet of the amplifying laser 300, but the pulse energy on the exposure target varies prominently. Therefore, a change in pulse energy Pamp of the laser beam affecting on the exposure target can be detected with high accuracy by detecting the laser beam at a point not near the outlet of the amplifying laser 300 and measuring the pulse energy Pamp. Especially, by detecting the laser beam at a point as close as possible to the exposure target and controlling the two-stage laser according to the pulse energy Pamp, the exposure amount can be controlled with high accuracy by the exposure device as a result.

The first control example will be described with reference to two operation methods ([1-1], [1-2]). Here, the two-stage laser of the MOPO system will be described, but the same control is also applied to the two-stage laser of the MOPA system.

[1-1. Amplifying Laser: Spike Control and Pulse-by-pulse Control]

FIGS. 8A and 8B are diagrams showing a control flow of the oscillating laser and the amplifying laser.

In the control of the amplifying laser shown in FIGS. 8A and 8B, spike control processing (hereinafter referred to as the amp spike control processing) is executed from the 1-st pulse to the N-th pulse in one burst by the amplifying laser 300, and pulse-by-pulse control processing (hereinafter referred to as the amp pulse-by-pulse control processing) is executed from the N+1-st pulse to the M-th pulse by the amplifying laser 300. In the individual processing descriptions, numeric values N=3, M=1000 are used as specific pulse numbers.

The oscillating laser 100 and the amplifying laser 300 are synchronously operated, and oscillation timing of the oscillating laser 100 and the amplifying laser 300 is controlled by the synchronous controller 8. Specifically, the seed light output by discharging between the electrodes 10*a* and 10*b* of the oscillating chamber 10 is injected into the amplifying chamber 30 of the amplifying laser 300 and filled in the discharge region (excitation region) between the electrodes 30*a* and 30*b*, then the seed light is amplified most efficiently by generating a discharge between the electrodes 30*a* and 30*b*. In order to amplify the seed light efficiently, the synchronous controller 8 provides a delay time between a trigger signal output to the solid-state switch SW of the oscillating high-voltage pulse generator 12 and a trigger signal output to the solid-state switch SW of the amplifying high-voltage pulse generator 32.

The control of the oscillating laser 100 will be described with reference to FIG. 8A.

As shown in FIG. 8A, the oscillating laser 100 first sets a laser oscillation pulse counter (hereinafter referred to as the pulse counter) ko to zero (step S511). The energy controller 7 is set the initial value which is previously set for the charging voltage Vosc of the oscillating laser 100 (step S512), and the pulse counter ko is increased by one increment (step S513). Here, if the pulse counter ko is less than M+1 (=1001), the laser oscillation is executed with the set charging voltage Vosc (YES in step S514; step S515). The pulse energy Posc(ko) is measured by the first monitor module 19, and the signal indicating the pulse energy Posc(ko) is output to the energy controller 7 (step S516).

Where the pulse energy Posc(ko) is the lower limit energy Es0 or more of the amplification saturation region, the above-described step S513 and following steps are executed, and the laser oscillation is continued with the same charging voltage Vosc as that of the previous pulse (YES in step S517). But, the laser gas is deteriorated with the continuation of the laser oscillation, and when the charging voltage Vosc is kept at a constant value and the laser gas control described later is not executed, the pulse energy Posc lowers. Accordingly, if the pulse energy Posc (ko) becomes lower than the lower limit energy Es0, a previously determined correction value ΔV is added to the charging voltage Vosc to make the pulse energy Posc the lower limit energy Es0 or more (NO in step S517; step S518). Because the charging voltage Vosc is increased by the correction value ΔV only, the pulse energy Posc increases to return to a state of the lower limit energy Es0 or more.

If the laser gas is further deteriorated with the continuation of the laser oscillation, the pulse energy Posc cannot be kept in a state of the lower limit energy Es0 or more by the above-described control of the charging voltage Vosc only. Accordingly, the charging voltage Vosc compensated by the addition of the correction value ΔV and the upper-limit charging voltage Vomax are compared for judgment (step S519). The upper limit charging voltage Vomax is a maximum charging voltage in a charging voltage setting range (namely, a voltage setting range of the charger 11) of the main capacitor C0 disposed in the oscillating high-voltage pulse generator 12.

When the charging voltage Vosc compensated by the addition of the correction value ΔV is less than the upper limit charging voltage Vomax, the above-described step S513 and following steps are executed with the compensated charging voltage Vosc (YES in step S519). Meanwhile, if the charging voltage Vosc compensated by the addition of the correction value ΔV becomes the upper limit charging voltage Vomax or more, the laser gas in the oscillating chamber 10 is controlled by gas control processing described later (NO in step S519; step S520). When the gas control processing is completed, the above-described step S512 and following steps are executed furthermore.

The gas control processing flow will be described later but, when it is executed, the pulse energy Posc of the laser beam (seed light) returns to the sate of the lower limit energy Es0 or more. Thus, it becomes possible to return the value of the charging voltage Vosc of the oscillating laser 100 to the vicinity of the initial value at the time when the operation was started.

Then, when the laser oscillation is continued furthermore, the pulse energy of the laser beam cannot be kept even if the gas control is executed, and it is necessary to entirely exchange the laser gas in the chamber. Thus, the period from the time when the laser gas is filled in the chamber to the total replacement is called the gas life. By repeating this total replacement of the laser gas, it becomes that the pulse energy of the laser beam is not restored to the desired value due to abrasion or the like of the electrodes in the chamber even if the laser gas is totally replaced. As a result, it becomes impossible to control the laser. The process up to this point is called the life of the chamber.

By executing the above-described control of the laser gas in addition to the control of the charging voltage Vosc of the oscillating laser 100, it becomes possible to suppress the pulse energy Posc from lowering in view of a medium term (during the gas life) and a long term (the life of the laser chamber) and to execute the stable pulse energy control.

Processing of step S512 through step S520 is repeated, and when the pulse counter ko exceeds M (=1000), namely when it becomes the M+1-st pulse (=the 1001-st pulse), the laser oscillation is stopped, and the laser oscillation in one burst is terminated (NO in step S514).

FIG. 9 is a diagram showing a processing flow of gas control processing.

In the case of the oscillating laser 100, the laser gas is additionally supplied into the oscillating chamber 10 by the gas supply/discharge unit 14, and in the case of the amplifying laser 300, the laser gas is additionally supplied into amplifying chamber 30 by the gas supply/discharge unit 34 (step S601). The additional amount, pressure and composition of the laser gas are previously determined, and it is determined such that the pulse energy becomes a prescribed level or more by adding one time.

Here, there is described an example of supplying a prescribed amount of the laser gas into the chamber, but it is not exclusive. For example, if a F2 gas concentration is decreased, a mixture gas of the F2 gas and a buffer gas, or a mixture gas of the F2 gas, a buffer gas and a rare gas may be supplied into the chamber. Besides, the laser gas may be discharged by an amount equivalent to the amount of the laser gas, the F2 mixture gas or the like supplied into the chamber. In this example, the supply and the discharge of the laser gas are executed by a single action, but the supply and the discharge may be executed gradually by means of a mass flow controller and an orifice in the laser gas supply/exhaust path.

Then, the control of the amplifying laser 300 will be described with reference to FIGS. 8B, 10 and 11.

As shown in FIG. 8B, in the amplifying laser 300, the amp spike control processing is executed from the start of the laser oscillation to the N-th pulse (=the 3-rd pulse) (step S531), and the amp pulse-by-pulse control processing is executed from the N+1-st pulse (=the 4-th pulse) to the M-th pulse (=the 1000-th pulse) (step S532).

FIG. 10 is a diagram showing a processing flow of the amp spike control processing.

The following preprocessing is executed before the start of the laser oscillation. The main controller 4 or the energy controller 7 counts a laser downtime between bursts by an unshown downtime counter T (step S701). When an oscillation instruction is output from the exposure device 3, the counting of the downtime is stopped (step S702).

This laser system is provided with an unshown database, in which the target energy Patgt of the amplifying laser 300 and the downtime of the amplifying laser 300 are stored in correspondence with a Vtamp-Ptamp data table. The Vtamp-Ptamp data table includes data record of every pulse in the amp spike control processing and is comprised of the data Vtamp of the charging voltage Vamp of the amplifying laser 300 and the data Ptamp of the laser pulse energy Pamp after the amplification. The downtime is specified by the downtime counter T, and the Vtamp-Ptamp data table corresponding to the downtime T and the target energy Patgt is retrieved and taken into the energy controller 7 (step S703). Then, the downtime counter T is reset (step S704).

When the above preprocessing is completed, the laser oscillation pulse counter ka is set to the initial value 1 (step S705), and the following processing is repeated until the pulse counter ka exceeds N (=3), namely between one to three pulses (YES in step S706).

Difference $\Delta Ptamp(ka)$ (=Ptamp(ka)−Patgt) between the pulse energy Ptamp(ka) of the ka-th pulse in the Vtamp-Ptamp data table and target energy Patgt is calculated, and the calculated result $\Delta Ptamp(ka)$ is used to calculate a correction value $\Delta Vtamp(ka)$ (=c×$\Delta Ptamp(ka)$, where c is constant) of a charging voltage of the ka-th pulse of the amplifying laser 300. Then, a charging voltage Vtamp of the ka-th pulse and the correction value $\Delta Vtamp(ka)$ in the Vtamp-Ptamp data table are used to calculate a charging voltage Vamp(ka) (=Vtamp(ka)+$\Delta Vtamp(ka)$) of the actual ka-th pulse (step S707).

And, the laser oscillation of the ka-th pulse is executed with a charging voltage Vamp(ka), and its pulse energy Pamp(ka) is measured (step S708, step S709). With the laser oscillation and the energy measurement, a charging voltage Vtamp(k) of the ka-th pulse and the pulse energy Ptamp(ka) in data of the Vtamp-Ptamp data table corresponding to the previous downtime and target energy Patgt are updated by the calculated actual charging voltage Vamp(ka) and the measured pulse energy Pamp(ka) (step S710), and the pulse counter ka is increased by one increment (step S711).

Processing of step S706 through step S711 is repeated, and when the pulse counter ka exceeds N (=3), namely when it becomes the N+1-st pulse (=the 4-th pulse), the amp spike control processing moves to the amp pulse-by-pulse control processing (NO in step S706).

FIG. 11 is a diagram showing a processing flow of the amp pulse-by-pulse control processing.

The pulse counter ka used in the amp pulse-by-pulse control processing is the same to the pulse counter ka used in the amp spike control processing. Therefore, the number of pulses counted by the amp spike control is transferred to the amp pulse-by-pulse control processing.

Difference $\Delta Pamp(ka)$ (=Pamp(ka−1)−Patgt) between the amplified pulse energy Pamp(ka−1) earlier by one pulse and the target energy Patgt is calculated, and the calculated result $\Delta Pamp(ka)$ is used to calculate a correction value $\Delta Vamp(ka)$ (=a×$\Delta Pamp(ka)$, where a is constant) of the charging voltage of the amplifying laser 300 of the ka-th pulse (step S801). This correction value $\Delta Vamp(ka)$ and the charging voltage Vamp(ka−1) earlier by one pulse are used to calculate the charging voltage Vamp(ka) (=$\Delta Vamp(ka)$+Vamp(ka−1)) of the ka-th pulse (step S802). And, the laser oscillation of the ka-th pulse is executed with the charging voltage Vamp(ka) (step S803), and the pulse energy Pamp(ka) after the amplification is measured (step S804). With the laser oscillation and energy measurement, the pulse counter ka is increased by one increment (step S805).

If the pulse counter ka does not exceed M (=1000) in this stage, the charging voltage of the amplifying laser 300 is checked (YES in step S806). The charging voltage of the amplifying laser 300, namely an upper limit value Vamax of the charging voltage of the main capacitor C0 disposed in the amplifying high-voltage pulse generator 32 is previously determined, and when the latest charging voltage Vamp (ka−1) is less than the upper limit charging voltage Vamax, the above-described step S801 and following steps are executed again (YES in step S807). If the laser gas of the amplifying laser 300 is deteriorated, the pulse energy of the laser lowers. To prevent the pulse energy from lowering, the charging voltage Vamp is increased gradually. If the latest charging voltage Vamp (ka−1) is the upper limit charging voltage Vamax or more, the laser gas in the amplifying chamber 30 is controlled (NO in step S807; step S808). When the gas control processing is completed, the above-described step S801 and following steps are executed furthermore.

The execution of the above-described gas control processing restores the pulse energy of the amplifying laser 300. Accordingly, it becomes possible to return the value of the charging voltage Vamp of the amplifying laser 300 to the vicinity of the initial value of the operation.

By executing the above-described laser gas control in addition to the charging voltage Vamp control of the amplifying laser 300, the pulse energy Pamp is suppressed from lowering in view of the medium term (during the gas life) and the long term (the life of the laser chamber), and the stable pulse energy control becomes possible.

Processing of step S801 through step S808 is repeated, and when the pulse counter ka exceeds M (=1000), namely when it becomes the M+1-st pulse (=the 1001-st pulse), the laser oscillation is stopped, and the laser oscillation in one burst is terminated (NO in step S806).

[1-2. Amplifying Laser: Spike Control, Pulse-by-pulse Control and Exposure Amount Constant Control]

FIGS. 12A and 12B are diagrams showing control flows of the oscillating laser and the amplifying laser.

In the control shown in FIGS. 12A and 12B, the amplifying laser executes the amp spike control processing from the 1-st pulse to the N-th pulse in one burst, executes the amp pulse-by-pulse control processing from the N+1-st pulse to the M-th pulse, and executes exposure amount constant control processing (hereinafter referred to as the amp exposure amount constant control processing) by the amplifying laser 300 from the M+1-st pulse to the O-th pulse such that cumulative energy for S pulses becomes constant. In the description of the individual processes, the numerals N=3, M=39, O=1000 and S=40 are used as specific pulse numbers.

The oscillating laser 100 and the amplifying laser 300 are synchronously operated in the same way as in the above-described (1-1). The oscillating laser control is executed in the same way as the control flow of FIG. 8A described in (1-1), so that its description is omitted. It is described in (1-1)with the final pulse determined as M, but it is described in (1-2) with the final pulse determined as O.

Then, the control of the amplifying laser 300 will be described with reference to FIGS. 12B and 13.

As shown in FIG. 12B, the amplifying laser 300 executes amp spike control processing from the start of the laser oscillation to the N-th pulse (=the 3-rd pulse) (step S931), executes amp pulse-by-pulse control processing from the N+1-st pulse (=the 4-th pulse) to the M-th pulse (=the 39-th pulse) (step S932), and executes amp exposure amount constant control processing from the M+1-st pulse (=the 40-th pulse) to the O-th pulse (=the 1000-th pulse) to make the exposure amount for the S pulses (=40 pulses) constant (step S933).

The amp spike control processing (step S931) and the amp pulse-by-pulse control processing (step S932) were already described in the above (1-1), so that the amp exposure amount constant control processing (step S933) will be mainly described here.

In the amp pulse-by-pulse control processing, if the pulse counter ka exceeds M (=39), namely when it becomes the M+1-st pulse (=the 40-th pulse), the amp pulse-by-pulse control processing moves to the amp exposure amount constant control processing (NO in step S806).

FIG. 13 is a diagram showing a processing flow of amp exposure amount constant control processing.

In this specification, the integration start pulse number at the time of adding up the pulse energies of the S pulses (=40 pulses) is indicated by i, and the integration end pulse number is indicated by j.

At the time of executing the amp exposure amount constant control processing, the following preparation step is executed along the amp spike control processing of step S931 shown in FIG. 12B and the amp pulse-by-pulse control processing of step S932 to conduct first integration.

In the preparation step, 1 is previously stored in integration start pulse number i, and i+(S−1) (=40) is stored in integration end pulse number j (step S1001). And, the laser oscillation of the ka-th pulse is executed (step S1002). The processing in step S1002 is the same as that in step S708 of the amp spike control processing shown in FIG. 10 when the pulse counter ka is from the 1-st pulse to the N-th pulse (=the 3-rd pulse). When the pulse counter ka is from the N+1-st pulse (=the 4-th pulse) to the M-th pulse (=the 39-th pulse), processing is the same as that in step S803 of the amp pulse-by-pulse control processing shown in FIG. 11.

Then, the measured pulse energy Pamp (ka) is stored. Specifically, when the pulse counter ka is from the 1-st pulse to the N-th pulse (=the 3-rd pulse), the pulse energy Pamp (ka) measured in step S709 of the amp spike control processing shown in FIG. 10 is stored. And, when the pulse counter ka is from the N+1-st pulse (=the 4-th pulse) to the M-th pulse (=the 39-th pulse), the pulse energy Pamp(ka) measured in step S804 of the amp pulse-by-pulse control processing shown in FIG. 11 is stored (step S1003).

And, the pulse counter ka is increased by one increment (step S1004). Processing in step S1004 is the same as that in step S711 of the amp spike control processing shown in FIG. 10 when the pulse counter ka is from the 1-st pulse to the N-th pulse (=the 3-rd pulse). And, when the pulse counter ka is from the N+1-st pulse (=the 4-th pulse) to the M-th pulse (=the 39-th pulse), processing is the same as that in step S805 of the amp pulse-by-pulse control processing shown in FIG. 11. The above-described laser oscillation and pulse energy measurement are repeated until the pulse counter ka becomes j−1 (YES in step S1005).

When the pulse counter ka becomes integration end pulse number j, namely when it becomes an oscillation stage of the integration end pulse, the procedure moves to the main step of the amp exposure amount constant control processing (NO in step S1005).

In the main step, the cumulative energy from the i-th pulse to the j−1-st pulse, namely cumulative energy D (i) of S−1 pulses, is calculated. The cumulative energy D (I) of the S−1 pulses from the itch pulse is calculated according to the following equation (1) (step S1006).

[Equation 1]

$$D(i) = \sum_{n=i}^{j-1} P_{amp}(n) \quad (1)$$

The target cumulative energy of the S pulses (=40 pulses) is previously determined as D0, and a difference P(ka) (=D0−D(i)) between the target cumulative energy D0 and the cumulative energy D(i) of S−1 pulses (=39 pulses) calculated by the above equation (1) is calculated. The calculated P(ka) is target energy of the ka-th (=j) pulse for determining the cumulative energy of the S pulses as D0 (step S1007).

Difference ΔP(ka) (=P(ka)−Pamp(ka−1)) between the target energy P(ka) and the pulse energy Pamp(ka−1) earlier by one pulse is calculated. Using the calculated result ΔP(ka), the ka-th pulse, namely correction value ΔV(ka) (=e×ΔP(ka), where e is constant) of a charging voltage of integration end pulse j, is calculated. This correction value ΔV(ka) and a charging voltage Vamp(ka−1) earlier by one pulse are used to calculate a charging voltage Vamp(ka) (=ΔV(ka)+Vamp(ka−1)) of the ka-th pulse (step S1008).

And, the laser oscillation of the ka-th pulse is executed with the charging voltage Vamp (ka) (step S1009). The pulse energy Pamp (ka) is measured with the laser oscillation, and the measured result is stored (step S1010).

To evaluate the exposure amount stability on the side of the exposure device 3, the cumulative energy D(i) of the S−1 pulses [=39 pulses] calculated in step S1006 and the pulse energy Pamp(ka) are used to calculate a cumulative energy D(ka) [=D(i)+Pamp(ka)] of the S pulses [=40 pulses], and the calculated data is transmitted to the exposure device 3 (step S1011). The exposure device 3 stops light exposure if the calculated data is outside of the specifications of the exposure amount stability as the evaluated result. Step S1011 may be omitted when the exposure amount stability is not evaluated on the side of the exposure device 3.

In this stage, if the pulse counter ka is less than O [=1000], the pulse counter ka is increased by one increment (YES in step S1012; step S1013). If the charging voltage Vamp (ka−1) of the latest amplifying laser 300 is less than the upper limit charging voltage Vamax, the integration start pulse number i is increased by one increment, the integration end pulse number j is increased by one increment, and the above-described step S1006 and following steps are executed (YES in step S1014; step S1016). Meanwhile, if the latest charging voltage Vamp (ka−1) is the upper limit charging voltage Vamax or more, the laser gas in the amplifying chamber 30 is controlled, the integration start pulse number i is increased by one increment, the integration end pulse number j is increased by one increment, and the above-described step S1006 and following steps are further executed (NO in step S1014; step S1015, step S1016).

Processing of step S1006 through step S1016 is repeated, and when the pulse counter ka becomes O [=1000], the laser oscillation is stopped, and the laser oscillation in one burst is terminated (NO in step S1012).

According to the first control example described above, the pulse energy control of the two-stage laser can be executed with high accuracy. Therefore, the pulse energy of the two-stage laser can be stabilized.

The first control example uses the characteristic that the pulse energy after the amplification is substantially constant even if the pulse energy of the seed light changes when the pulse energy of the laser beam (seed light) which is output from the oscillating laser 100 and injected into the amplifying laser 300 is in an amplification saturation region of about Es0 or more (region 2 in FIG. 6). Thus, the pulse energy after the amplification is determined according to a charging voltage of the amplifying laser, namely a charging voltage of the main capacitor C0 of the amplifying high-voltage pulse generator 32.

In the first control example, the control of the oscillating laser 100 may be simple control (for example, to make a charging voltage of the oscillating laser constant) to simply make the pulse energy of seed light to the above-described Es0 or more, and the high-precision pulse energy control is not required. Actually, the amplifying laser 300 is just controlled strictly. The pulse energy Pamp after the amplification is measured, and according to the measured result, the charging voltage Vamp of the amplifying laser 300 is controlled (amp spike control processing, amp pulse-by-pulse control processing, amp exposure amount constant control processing) for every pulse, thereby enabling to realize the high-precision pulse energy control of the laser beam after the amplification.

Thus, the first control example can control the oscillating laser 100 and the amplifying laser 300 with their control clearly divided, so that the control is stable, and an error does not occur easily. Thus, it can be said that the control accuracy can be improved.

As in this control example, a computation load of the controller is small because the control including one simple control and the other strict control is easy. Therefore, a high-performance controller is not needed, and the cost can be reduced.

And, by joint use of the control to vary a gas pressure and a gas composition of the oscillating laser and the amplifying laser, the pulse energy control for compensating a medium-term (during gas life) and long-term (laser chamber's life length) output drop becomes possible, and the pulse energy can be controlled stably for a long period.

[1-3. Modified Example of 1-1 and 1-2]

In the above-described control examples [1-1] and [1-2], it is controlled to make the charging voltage of the oscillating laser 100 constant, so that the energy of the laser beam (seed light), which is output from the oscillating laser 100 and injected into the amplifying laser 300, becomes an amplification saturation region of about Es0 or more (region 2 of FIG. 6). According to the control examples [1-1] and [1-2], an influence of the change (pulse energy variation) in output of the seed light output from the oscillating laser 100 on the pulse energy of the laser beam output from the amplifying laser 300 becomes small, and the pulse energy control of the laser beam output from the two-stage laser has become fine.

In this modified example, while keeping the conditions that the pulse energy of the seed light output from the oscillating laser 100 becomes the lower limit energy Es0 or more of the amplification saturation region, a relationship between a charging voltage (namely, the set voltage of the charger 11) of the oscillating laser 100 and a charging voltage (namely, the set voltage of the charger 31) of the amplifying laser 300 is determined as follows.

(1) A charging voltage value of the oscillating laser 100 and a charging voltage value of the amplifying laser 300 are nearly matched.

(2) Voltage change ratios or voltage change amounts of both the charging voltages are nearly matched.

Thus, in addition to the effects that an influence of the output change of the seed light on the pulse energy of the laser beam becomes small and the pulse energy control of the laser beam output from the two-stage laser becomes good by setting the relationship between both the charging voltages, a fluctuation range of the pulse energy of the two-stage laser due to a synchronous change of the oscillating laser 100 and the amplifying laser 300 can be decreased as described later.

The reason why the fluctuation range of the pulse energy can be decreased by determining the relationship between both the charging voltages as described in (1) and (2) above will be described.

(1) Nearly Matching Both the Charging Voltages

As described with reference to FIGS. 4 and 5, even if a timing that the solid-state switch SW of the oscillating high-voltage pulse generator 12 falls in the ON state and a timing that the solid-state switch SW of the amplifying high-voltage pulse generator 32 falls in the ON state are constant, a timing of the occurrence of a discharge in the individual lasers is variable according to the values of the charging voltage Vosc of the oscillating laser 100 and the charging voltage Vamp of the amplifying laser 300. It depends on a difference in Vt product property of the magnetic switch included in the magnetic pulse compression circuit disposed in the high-voltage pulse generators 12, 32.

Therefore, the synchronous controller 8 receives a signal instructing the charging voltages (voltages Vosc, Vamp) of the next discharge from the energy controller 7 and decides a delay time considering the Vt product property in view of the instructed content. For example, the characteristic curves A, B shown in FIG. 4 are used to compensate the charging voltage setting value for the individual lasers, and it is controlled to make the tine from the switching of the solid-state switch SW to the occurrence of the discharge constant.

As shown in FIG. 4, the oscillating laser 100 and the amplifying laser 300 are determined to have a charging voltage setting range of Vc1 to Vc2 (Vc1<Vc2). When the oscillating laser 100 has a charging voltage Vosc of Vc2 and the amplifying laser 300 has a charging voltage Vamp of Vc1, a time lag from when the individual solid-state switches SW of the individual lasers 100, 300 fall in the ON state to when the discharge occurs between the electrodes, namely a synchronization lag, becomes a maximum value T1. At this time, for example, when the synchronous controller 8 compensates a delay time so that the time from the switching of the individual solid-state switches SW to the occurrence of the discharge becomes constant, it is possible to set the above T1 to 0.

But, if the temperatures of the component elements (capacitor, magnetic switch, etc.) of the magnetic pulse compression circuit possessed by the individual high-voltage pulse generators 12, 32 change under the operation conditions (repetition frequency, operation time, operation duty, downtime, etc.) of the oscillating laser 100 and the amplifying laser 300, the characteristic curves A, B (solid lines) change as indicated by characteristic curves A', B' (broken line) as shown in FIG. 14.

Therefore, even if the synchronous controller 8 compensates to change the above T1 to 0 considering the characteristic curves A, B, a synchronization lag of T1-Tr occurs in practice because the lag is Tr1 when the actual characteristic curves are A', B' as apparent from FIG. 14. Generally, the absolute value of a time change due to a temperature is larger as the charging voltage is lower. Where both the lasers are used with an arbitrary charging voltage in a charging voltage setting range of Vc1 to Vc2, T1-Tr1 becomes a maximum synchronization lag.

Here, the charging voltage Vosc of the oscillating laser 100 and the charging voltage Vamp of the amplifying laser 300 are nearly matched. Specifically, the oscillating laser 100 and the amplifying laser 300 are used with an arbitrary charging voltage Ve in the charging voltage setting range of Vc1 to Vc2 as shown in FIG. 14. As described above, the synchronization lag T1-Tr1 is maximum. Therefore, a synchronization lag Te-Tre which might occur when the oscillating laser 100 and the amplifying laser 300 are used at the charging voltage Ve becomes always T1-Tr1 or less. Accordingly, synchronization accuracy of the oscillating laser 100 and the amplifying laser 300 becomes high.

In addition to the effects that an influence of the output change of the seed light upon the pulse energy of the laser beam becomes small and the pulse energy control of the laser beam output from the two-stage laser becomes good, a fluctuation range of the pulse energy of the two-stage laser due to a synchronous change of the oscillating laser 100 and the amplifying laser 300 can be decreased by nearly matching the value of a charging voltage of the oscillating laser 100 with the value of a charging voltage of the amplifying laser 300.

(2) Nearly Matching Voltage Change Ratios or Voltage Change Amounts of Both the Charging Voltages As shown in FIG. 5, it is assumed that the oscillating laser 100 and the amplifying laser 300 have a different charging voltage setting range, the oscillating laser 100 has a charging voltage setting range of Vco1 to Vco2 (Vco1<Vco2), and the amplifying laser 300 has a charging voltage setting range of Vca1 to Vca2 (Vca1<Vca2) and Vca1<Vco2<Vca2. Where the oscillating laser 100 has a charging voltage Vosc of Vco2 and the amplifying laser 300 has a charging voltage Vamp of Vca1, a time lag from when the individual solid-state switches of the individual lasers 100, 300 fall in the ON state to when a discharge occurs between the electrodes, namely the synchronization lag, has a maximum value T1. Similar to what are described above, for example, when the synchronous controller 8 compensates the delay time to make a time from switching of the individual solid-state switches SW to the occurrence of the discharge constant, the above-described T1 can be made 0.

But, when the temperatures of the component elements of the magnetic pulse compression circuits possessed by the individual high-voltage pulse generators 12, 32 change under the operation conditions of the oscillating laser 100 and the amplifying laser 300 as described above, the characteristic curves C, D vary as indicated by the characteristic curves C', D' as shown in FIG. 15.

Therefore, even if it is compensated by the synchronous controller 8 to change the above T1 to 0 considering the characteristic curves C, D, a synchronization lag of T1-Tr1 occurs in practice as apparent from FIG. 15 because the lag is Tr1 when the actual characteristic curves are C', D'. Generally, the absolute value of a time change due to the temperatures is larger as a charging voltage is lower. T1-Tr1 becomes a maximum synchronization lag similar to the case of FIG. A.

As shown in the example of FIG. 15, if the oscillating laser 100 and the amplifying laser 300 have a different charging voltage setting region, it is hard to match the charging voltages. Therefore, the change ratios of the charging voltages are matched.

Specifically, both the oscillating laser 100 and the amplifying laser 300 are determined to have maximum charging voltage setting values (Vco2, Vca2) of 100%, and the ratios (%) of the charging voltage values of both the lasers with respect to the maximum charging voltage setting values are nearly matched. In other words, as shown in FIG. 15, the oscillating laser 100 is used at a charging voltage Vcoe in the charging voltage setting range of Vco1 to Vco2, and the amplifying laser 300 is used at a charging voltage Vcae in the charging voltage setting range of Vca1 to Vca2. Here, it is assumed that Vcoe/Vco2×100 (%)=Vcae/Vca2×100 (%).

As described above, because the synchronization lag T1-Tr1 is maximum, the synchronization lag Te-Tre, which might be generated when the oscillating laser 100 and the amplifying laser 300 are used at the same change ratio (namely, the oscillating laser 100 has a charging voltage Voe, the amplifying laser 300 has a charging voltage Vae), becomes always T1-Tr1 or less. Therefore, synchronization accuracy of the oscillating laser 100 and the amplifying laser 300 becomes high.

Where the characteristics are as shown in FIG. 5, it may be controlled to make the change amount constant because Vca2-Vca1 and Vco2-Vco1 are at the same level (namely, a charging voltage setting range is nearly same).

In addition to the effects that an influence of the output variation of the seed light upon the pulse energy of the laser beam becomes small and the pulse energy control of the laser beam output from the two-stage laser becomes good by nearly matching the change ratios or the change amounts of the charging voltage of the oscillating laser 100 and the charging voltage of the amplifying laser 300, it becomes possible to decrease a fluctuation range of the pulse energy of the two-stage laser due to the synchronous change of the oscillating laser 100 and the amplifying laser 300.

Control ([1-3-1]) for nearly matching the value of a charging voltage of the oscillating laser 100 with the value of a charging voltage of the amplifying laser 300 and control ([1-3-2]) for nearly matching the voltage change ratios of both the charging voltages or the voltage change amounts of charging voltages will be described.

[1-3-1. Control for Nearly Matching the Value of a Charging Voltage of the Oscillating Laser 100 with the Value of a Charging Voltage of the Amplifying Laser 300]

Control for nearly matching the value of a charging voltage of the oscillating laser 100 with the value of a charging voltage of the amplifying laser 300 will be described.

This control example is a modified example of the control examples described in [1-1] and [1-2], and the control of the amplifying laser 300 is same. Specifically, the amplifying laser 300 executes in the same manner as in the control example [1-1] the amp spike control processing from the 1-st pulse to the N-th pulse in one burst, and the amp pulse-by-pulse control processing from the N+1-st pulse to the M-th pulse. Otherwise, the amplifying laser 300 executes in the same manner as in the control example [1-2] the amp spike control processing from the 1-st pulse to the N-th pulse one burst, the amp pulse-by-pulse control processing from the N+1-st pulse to the M-th pulse, and the amp exposure amount constant control processing from the M+1-st pulse to the O-th pulse such that the cumulative energy of S pulses becomes constant. The control of the amplifying laser 300 is executed as described above and, therefore, its description is omitted. The control example of the oscillating laser 100 will be described below with reference to FIG. 16.

FIG. 16 is a diagram showing a control flow of the oscillating laser.

As shown in FIG. 16, the oscillating laser 100 first has the pulse counter ko set to zero (step S2511). Then, the pulse counter ko is increased by one increment (step S2512).

The energy controller 7 sets the charging voltage Vosc of the oscillating laser 100 to the same voltage as that set as the charging voltage Vamp of the amplifying laser 300. Specifically, when the processing being executed by the amplifying laser 300 is in the amp spike control processing stage, the charging voltage Vamp (ka) set in step S707 of the control processing flow shown in FIG. 10 is set to a charging voltage Vosc (ko). And, when the processing being executed by the amplifying laser 300 is in the amp pulse-by-pulse control processing stage, the charging voltage Vamp (ka) set in step S802 of the control processing flow shown in FIG. 11 is set to a charging voltage Vosc (ko). Besides, when the processing being executed by the amplifying laser 300 is in the amp exposure amount constant control processing stage, the charging voltage Vamp (ka) set in step S1008 of the control processing flow shown in FIG. 13 is set to a charging voltage Vosc (ko). Here, ko=ka (step S2513).

Here, if the pulse counter ko is less than M+1 (=1001), laser oscillation is executed at the charging voltage Vosc set in step S2513 (YES in step S2514; step S2515). In the first monitor module 19, a pulse energy Posc (ko) is measured, and a signal indicating the pulse energy Posc (ko) is output to the energy controller 7 (step S2516).

When the pulse energy Posc (ko) is the lower limit energy Es0 or more of the amplification saturation region, the above-described step S2512 and following steps are executed. In other words, the laser oscillation is continued at the charging voltage Vosc which is set to the same value as that of the charging voltage Vamp set by the amplifying laser 300 in the same manner as in the case of the previous pulse (YES in step S2517).

But, the laser gas is deteriorated as the laser oscillation is continued, and the pulse energy Posc (ko) with the charging voltage Vosc set to the same value as that of the charging voltage Vamp set by the amplifying laser 300 might become lower than the lower limit energy Es0.

In the control examples [1-1] and [1-2], the previously determined correction value $\Delta V$ was added to the charging voltage Vosc to increase the charging voltage Vosc by the correction value $\Delta V$ so as to make the pulse energy Posc to the lower limit energy Es0 or more. But, in this control example, the charging voltage Vosc (ko) is set to the same value as that of the charging voltage Vamp (ka) set by the amplifying laser 300, so that the correction value $\Delta V$ of the charging voltage cannot be added.

Accordingly, the laser gas in the oscillating chamber 10 is controlled by the gas control processing shown in FIG. 9 (NO in step S2517, step S2518). When the gas control processing is completed, the above-described step S512 and following steps are executed furthermore. By executing the gas control, the pulse energy Posc of the laser beam (seed light) is restored to return to the state of the lower limit energy Es0 or more.

By executing the above-described laser gas control, it becomes possible to suppress the pulse energy Posc from decreasing in view of a medium term (during gas life) and long term (life of laser chamber), and to control the pulse energy stably.

The processing of step S2512 through step S2518 is repeated, and when the pulse counter ko exceeds M (=1000), namely when it becomes the M+1-st pulse (=the 1001-st pulse), the laser oscillation is stopped, and the laser oscillation in one burst is terminated (NO in step S2514).

This control mainly controls the charging voltage Vamp of the amplifying laser 300. Therefore, if the gas control processing of the oscillating laser 100 is executed prior to the gas control processing of the amplifying laser 300 (for example, step S808 in the amp pulse-by-pulse control processing or step S1015 in the amp exposure amount constant control processing), the operation of the amplifying laser 300 is stopped. Therefore, it is desirable that the gas control of the oscillating laser 100 is executed after the gas control processing of the amplifying laser 300.

Generally, the pulse energy of the laser beam tends to become larger as the laser gas filled in the chamber has a higher pressure. Accordingly, for example, the laser gas pressure in the oscillating chamber 10 of the oscillating laser 100 is set higher such that the output of the laser beam of the oscillating laser 100 is adequately high in comparison with the above-described lower limit energy Es0 even when a charging voltage Vosc (ko) (namely, the initial charging voltage Vamp (ka) of the amplifying laser 300) has a low value.

Then, even if the laser gas in the oscillating chamber 10 is deteriorated and the pulse energy Posc lowers, the pulse number until the pulse energy Posc becomes lower than the above-described lower limit energy Es0 can be made large.

By adjusting in this way, the oscillating laser 100 can be prevented from entering the gas control processing flow earlier than the amplifying laser 300.

When the processing executed by the amplifying laser 300 moves to the gas control processing (namely, movement to step S808 in the amp pulse-by-pulse control processing or step S1015 in the amp exposure amount constant control processing), it is desirable to shift the operation of the oscillating laser 100 to the gas control processing (step S2517) in conjunction with the operation of the amplifying laser 300 even if the pulse energy of seed light output from, for example, the oscillating laser 100 is larger than the above-described lower limit energy Es0.

As described above, when the pressure of the laser gas becomes high, the time from when the solid-state switches (semiconductor switches) SW of the oscillating high-voltage pulse generator 12 and the amplifying high-voltage pulse generator 32 are turned on by the trigger signal from the synchronous controller 8 until when the discharge occurs between the electrodes 10a, 10b and between the electrodes 30a, 30b becomes long.

Where the laser gas is additionally supplied to the chamber by the laser gas control, the laser gas pressure in the amplifying chamber 30 increases earlier when the processing executed by the amplifying laser 300 moves to the gas control processing earlier than the processing executed by the oscillating laser 100. The timings of the generation of a discharge by both the lasers are varied depending on a change in the laser gas pressure in one of the chambers though also variable depending on the distance between the electrodes and the laser gas pressure at the time of filling the laser gas. In this control example, the oscillating laser 100 and the amplifying laser 300 have almost the same charging voltage. Therefore, the change in the laser gas pressure has a large influence upon the change in discharge timing.

As described above, the change in discharge timing is subjected to feedback compensation according to information on the discharge generation timings in the oscillating chamber 10 and the amplifying chamber 30 detected by the discharge detectors 20, 40. But, the timing compensation tends to be made with high accuracy when the difference is smaller between the discharge timings of both the lasers.

Therefore, when the timing to move to the gas control processing on the side of the amplifying laser 300 and the timing to move to the gas control processing on the side of the oscillating laser 100 are linked, the laser gas pressure increases in both the oscillating chamber 10 and the amplifying chamber 30. As a result, it becomes possible to reduce the difference in discharge timing of both the lasers in comparison with the case that the moving timing to the gas control processing is not linked. Thus, the precision of the feedback compensation can be made higher.

[1-3-2. Control to Nearly Match Voltage Change Ratios or Voltage Change Amounts of Both Charging Voltages]

There will be described below a control example (A) to nearly match a voltage change ratio of a charging voltage of the oscillating laser 100 with a voltage change ratio of a charging voltage of the amplifying laser 300, and a control example (B) to nearly match a voltage change amount of a charging voltage of the oscillating laser 100 with a voltage change amount of a charging voltage of the amplifying laser 300.

This control example is also a modified example of the control examples described in [1-1] and [1-2], and the amplifying laser 300 is controlled in the same manner. Specifically, the amplifying laser 300 executes, in the same manner as in the control example [1-1], the amp spike control processing from the 1-st pulse to the N-th pulse in one burst, and the amp pulse-by-pulse control processing from the N+1-st pulse to the M-th pulse. Otherwise, the amplifying laser 300 executes, in the same manner as in the control example [1-2], the amp spike control processing from the 1-st pulse to the N-th pulse in one burst, the amp pulse-by-pulse control processing from the N+1-st pulse to the M-th pulse, and the amp exposure amount constant control processing from the M+1-st pulse to the O-th pulse such that the cumulative energy for the S pulses becomes constant.

(A) Control to Nearly Match the Voltage Change Ratio of the Charging Voltage of the Oscillating Laser 100 with the Voltage Change Ratio of the Charging Voltage of the Amplifying Laser 300

FIG. 17 is a diagram showing a control flow of the oscillating laser.

This control is substantially same to the control described in [1-3-1], namely the control of the oscillating laser 100 to nearly match the value of a charging voltage of the oscillating laser 100 and the value of a charging voltage of the amplifying laser 300. Therefore, the description about the same processing is omitted, and only differences are described here. The difference is only step S2513' shown in FIG. 17.

In step S2513', the energy controller 7 determines maximum charging voltage setting values (Vco2, Vca2) of 100% for both the oscillating laser 100 and the amplifying laser 300 and nearly matches the ratios (%) of the charging voltage values of both the lasers with respect to the above setting values.

It is determined that where the oscillating laser 100 is used at a charging voltage Vcoe in a charging voltage setting range of Vco1 to Vco2 and the amplifying laser 300 is used at a charging voltage Vcoe in a charging voltage setting range of Vca1 to Vca2, Vcoe/Vco2×100 (%)=Vcae/Vca2×100 (%).

Specifically, where the processing being executed by the amplifying laser 300 is in the amp spike control processing stage, the charging voltage Vamp (ka) set in step S707 of the control processing flow shown in FIG. 10 is used such that the charging voltage Vosc (ko) becomes Vosc (ko)=Vamp (ka)×Vco2/Vca2. Where the processing being executed by the amplifying laser 300 is in the amp pulse-by-pulse control processing stage, the charging voltage Vamp (ka) set in step S802 of the control processing flow shown in FIG. 11 is used such that the charging voltage Vosc (ko) is Vamp (ka)×Vco2/Vca2. Besides, where the processing being executed by the amplifying laser 300 is in the amp exposure amount constant control processing stage, the charging voltage Vamp (ka) set in step S1008 of the control processing flow shown in FIG. 13 is used to set the a charging voltage Vosc (ko) to be Vosc (ko)=Vamp (ka)×Vco2/Vca2 (step S2513').

Other control steps are same to those shown in FIG. 16, and their descriptions are omitted here.

(B) Control to Nearly Match a Voltage Change Amount of a Charging Voltage of the Oscillating Laser 100 with a Voltage Change Amount of a Charging Voltage of the Amplifying Laser 300

As described above, the characteristics shown in FIG. 5 indicate that Vca2−Vca1 and Vco2−Vco1 are in the similar level (namely, the charging voltage setting ranges are nearly equal). Therefore, the control may be executed to make the change amount constant instead of the above control (A).

The control of the amplifying laser 300 is same as the control examples described in the above-described (1-1) and (1-2), and its description is omitted. The control example of the oscillating laser 100 will be described with reference to FIG. 18.

FIG. 18 is a diagram showing a control flow of the oscillating laser.

As shown in FIG. 18, the oscillating laser 100 first sets the laser oscillation pulse counter ko to zero (step S3511). The energy controller 7 sets a charging voltage Vosc of the oscillating laser 100 to the previously determined initial value (step S3512). For example, the initial value is set to (Vco1+Vco2)/2. Then, the pulse counter ko is increased by one increment (step S3513).

The energy controller 7 compensates the charging voltage Vosc of the oscillating laser 100 by the same compensation amount as the correction value ΔVamp (namely, the change amount of the charging voltage Vamp) of the charging voltage Vamp of the amplifying laser 300 (the change amount of the charging voltage Vosc is matched with the change amount of the charging voltage Vamp). Specifically, a charging voltage Vosc (ko−1) earlier by one pulse is compensated by ΔVamp (ko) to determine Vosc (ko)=Vosc (ko−1)+ΔVamp (ko). When the processing executed by the amplifying laser 300 is in an amp spike control processing stage, the correction value ΔVtamp (ka) of the charging voltage of the amplifying laser 300 which is calculated in step S707 of the control processing flow shown in FIG. 10 is determined to be ΔVamp (ko). And, when the processing executed by the amplifying laser 300 is in the amp pulse-by-pulse control processing stage, the correction value ΔVamp (ka) of a charging voltage of the amplifying laser 300 calculated in step S801 of the control processing flow shown in FIG. 11 is set to ΔVamp (ko). Besides, when the processing executed by the amplifying laser 300 is the amp exposure amount constant control processing stage, the correction value ΔV (ka) of the charging voltage of the amplifying laser 300 that is calculated in step S1008 of the control processing flow shown in FIG. 13 is determined to be ΔVamp (ko). Here, ko=ka (step S3514).

When the pulse counter ko is less than M+1 (=1001) here, the laser oscillation is executed at the determined charging voltage Vosc (YES in step S3515; step S3516). The pulse energy Posc (ko) is measured by the first monitor module 19, and a signal indicating the pulse energy Posc (ko) is output to the energy controller 7 (step S3517).

And, the pulse energy Posc (ko) and the lower limit energy Es0 of the amplification saturation region are compared for judgment, and the charging voltage Vosc compensated by the addition of the change amount ΔVamp and the upper limit charging voltage Vomax are compared for judgment (step S3518).

When the pulse energy Posc (ko) is the lower limit energy Es0 or more of the amplification saturation region and the charging voltage Vosc is less than the upper limit charging voltage Vomax, the above-described step S3513 and following steps are executed, and the laser oscillation is continued at the charging voltage Vosc set in step S3514 (YES in step S3518).

When the pulse energy Posc (ko) is lower than the lower limit energy Es0 of the amplification saturation region or the charging voltage Vosc is the upper limit charging voltage Vomax or more, it is judged that the laser gas in the oscillating chamber 10 is deteriorated, and the laser gas in the oscillating chamber 10 is controlled by the gas control processing (NO in step S3518; step S3519). When the gas control processing is completed, the above-described step S3512 and following steps are executed.

By executing the gas control processing, the pulse energy Posc of the laser beam (seed light) is restored and returned to the state of the lower limit energy Es0 or more. Thus, it becomes possible to return the value of the charging voltage Vosc of the oscillating laser 100 to near the initial value at the time of the initiation of the operation.

By executing the above-described laser gas control in addition to the control of the charging voltage Vosc of the oscillating laser 100, it becomes possible to suppress the pulse energy Posc from deteriorating in view of the medium term (during gas life) and long term (life of the laser chamber) and to control the pulse energy stably.

The processing of step S3512 through step S3519 is repeated, and when the pulse counter ko exceeds M (=1000), namely when it becomes the M+1-st pulse (=the 1001-st pulse), the laser oscillation is stopped, and the laser oscillation in one burst is terminated (NO in step S3515).

In controlling to nearly match a voltage change ratio of a charging voltage of the oscillating laser 100 with a voltage change ratio of a charging voltage of the amplifying laser 300 or in controlling to nearly match a voltage change amount of a charging voltage of the oscillating laser 100 with a voltage change amount of a charging voltage of the amplifying laser 300, it is desirable to execute the gas control processing of the oscillating laser 100 after the gas control processing of the amplifying laser 300 similar to the control to nearly match the value of the charging voltage of the above-described oscillating laser 100 with the value of the charging voltage of the amplifying laser 300.

And, when the amplifying laser 300 moves to the gas control processing (namely, the movement to step S808 in the amp pulse-by-pulse control processing or step S1015 in the amp exposure amount constant control processing), it is desirable that the operation of the oscillating laser 100 is also shifted to the gas control processing (step S2518 or step S3519) in conjunction with the operation of the amplifying laser 300 even if the pulse energy of the seed light output from the oscillating laser 100 is larger than the above-described lower limit energy Es0.

2. Second Control Example

FIGS. 19A to 19D are diagrams showing individual charging voltages and individual pulse energies in a second control example. The individual rectangular waves shown in FIGS. 19A to 19D indicate the charging voltages and pulse energies in one burst.

The second control example varies a charging voltage of the oscillating laser 100 and keeps a charging voltage of the amplifying laser 300 constant according to a target pulse energy.

The second control example will be described briefly. A pulse energy Posc (namely, pulse energy of seed light injected into the amplifying laser 300) of the oscillating laser 100 is operated in a region of a lower limit energy Es0 or less of the amplification saturation region of the amplifying laser 300. In this operation region, the pulse energy after the amplification varies according to a change in pulse energy of the seed light output from the oscillating laser 100 (see FIG. 6).

As a rule, a charging voltage Vamp of the amplifying laser 300 is controlled to be constant (not controlled for each pulse: see FIG. 19C). But, if a charging voltage Vosc of the oscillating laser 100 exceeds the upper limit charging voltage Vomax or if a pulse energy Pamp of the amplifying laser 300 is not a target energy Patgt, the charging voltage Vamp of the amplifying laser 300 is increased.

The pulse energy Pamp of the amplifying laser 300 is measured by the second monitor module 39, the charging voltage Vosc of the oscillating laser 100 is controlled for each pulse (see FIG. 19A) such that the measured value becomes the target energy Patgt (FIG. 19D).

The second control example will be described with reference to two operation methods ([2-1], [2-2]). Here, the two-stage laser of the MOPO system will be described, but the same control is also applied to the two-stage laser of the MOPA system.

[2-1. Oscillating Laser: Spike Control and Pulse-by-pulse Control]

FIGS. 20A and 20B are diagrams showing control flows of the oscillating laser and the amplifying laser.

In the control of the oscillating laser shown in FIGS. 20A and 20B, spike control processing (hereinafter referred to as the osc spike control processing) is executed from the 1-st pulse to the N-th pulse in one burst by the oscillating laser 100, and pulse-by-pulse control processing (hereinafter referred to as the osc pulse-by-pulse control processing) is executed from the N+1-st pulse to the M-th pulse by the oscillating laser 100. In the descriptions of the individual processings, numeric values N=3, M=1000 are used as specific pulse numbers.

The oscillating laser 100 and the amplifying laser 300 are synchronously operated, and the oscillation timings of the oscillating laser 100 and the amplifying laser 300 are controlled by the synchronous controller 8. Specifically, seed light which is output by a discharge caused between the electrodes 10a, 10b of the oscillating chamber 10 is injected into the amplifying chamber 30 of the amplifying laser 300, and when it is filled in the discharge region (excitation region) between the electrodes 30a, 30b to cause a discharge between the electrodes 30a, 30b, and the seed light is amplified most efficiently. To efficiently amplify the seed light, the synchronous controller 8 provides a delay time between a trigger signal which is output to the solid-state switch SW of the oscillating high-voltage pulse generator 12 and a trigger signal which is output to the solid-state switch SW of the amplifying high-voltage pulse generator 32.

First, the control of the oscillating laser 100 will be described with reference to FIGS. 20A, 21 and 22.

As shown in FIG. 20A, in the oscillating laser 100, osc spike control processing is executed from the start of the laser oscillation to the N-th pulse (=the 3-rd pulse) (step S1211), and osc pulse-by-pulse control processing is executed from the N+1-st pulse (=the 4-th pulse) to the M-th pulse (=the 1000-th pulse) (step S1212).

FIG. 21 is a diagram showing a processing flow of the osc spike control processing.

The osc spike control processing executes the following preprocessing before the start of the laser oscillation. The main controller 4 or the energy controller 7 counts a laser downtime between the bursts by an unshown downtime counter T (step S1301). When an oscillation instruction is output from the exposure device 3, the downtime counting is stopped (step S1302).

In this control example, the oscillating laser 100 is controlled such that the pulse energy Pamp of the laser beam after the amplification becomes a target value Patgt. Therefore, the oscillating laser 100 is controlled according to the measured value of the pulse energy Pamp of the laser beam after the amplification such that the pulse energy of the laser beam after the amplification becomes the target energy Patgt of the amplifying laser 300.

This laser system is provided with an unshown database, in which the target energy Patgt of the amplifying laser 300 and downtime of the oscillating laser 100 are stored in correspondence with a Vtosc-Ptamp data table. The Vtosc-Ptamp data table includes data records of every pulse in the osc spike control processing and is comprised of data Vtosc of the charging voltage Vosc of the oscillating laser 100 and data Ptamp of the laser pulse energy Pamp after the amplification. The downtime of the oscillating laser 100 is specified by the downtime counter T, and the Vtosc-Ptamp data table corresponding to the downtime T and the target energy Patgt is retrieved and taken into the energy controller 7 (step S1303). Then, the downtime counter T is reset (step S1304).

When the above preprocessing is completed, the laser oscillation pulse counter ko is set to the initial value 1 (step S1305), and the following processing is repeated until the pulse counter ko exceeds N (=3), namely between one to three pulses (YES in step S1306).

Difference $\Delta Ptamp(ko)$ (=Ptamp(ko)−Patgt) between the pulse energy Ptamp(ko) of the ko-th pulse in the Vtosc-Ptamp data table and the target energy Patgt is calculated, and the calculated result $\Delta Ptamp(ko)$ is used to calculate correction value $\Delta Vtosc(ko)$ (=c×$\Delta Ptamp(ko)$, where c is constant) of the charging voltage of the oscillating laser 100 of the ko-th pulse. Then, the charging voltage Vtosc of the ko-th pulse in the Vtosc-Ptamp data table and the correction value $\Delta Vtosc(ko)$ are used to calculate a charging voltage Vosc(ko) (=Vtosc(ko)+$\Delta Vtosc(ko)$) of the actual ko-th pulse (step S1307).

And, the laser oscillation of the ko-th pulse is executed with the charging voltage Vosc (ko), and the pulse energy Pamp (ko) after the amplification is measured (step S11308, step S1309). With the laser oscillation and the measurement of energy, the charging voltage Vtosc (ko) of the ko-th pulse and the pulse energy Ptamp (ko) in the data of the Vtosc-Ptamp data table corresponding to the previous downtime and the target energy Patgt are updated by the calculated actual charging voltage Vosc (ko) and the measured pulse energy Pamp (ko) (step S1310), and the pulse counter ko is increased by one increment (step S1311).

Processing of step S1306 through step S1311 is repeated, and when the pulse counter ko exceeds N (=3), namely when it becomes the N+1-st pulse (=the 4-th pulse), the osc spike control processing shifts to the osc pulse-by-pulse control processing (NO in step S1306).

FIG. 22 is a diagram showing a processing flow of the osc pulse-by-pulse control processing.

The pulse counter ko used in the osc pulse-by-pulse control processing is same to the pulse counter ko used in the osc spike control processing. Therefore, the pulse number counted by the osc spike control is transferred to the osc pulse-by-pulse control processing.

Difference $\Delta Pamp(ko)$ (=Pamp(ko−1)−Patgt) between the amplified pulse energy Pamp(ko−1) earlier by one pulse and the target energy Patgt is calculated. The calculated result $\Delta Pamp(ko)$ is used to calculate a correction value $\Delta Vosc(ko)$ (=b×$\Delta Pamp(ko)$, where b is constant) of the charging voltage of the oscillating laser 100 of the ko-th pulse (step S1401). This correction value $\Delta Vosc(ko)$ and the charging voltage Vosc(ko−1) earlier by one pulse are used to calculate a charging voltage Vosc(ko) (=$\Delta Vosc(ko)$+Vosc(ko−1)) of the ko-th pulse (step S1402). And, the laser oscillation of the ko-th pulse is executed at a charging voltage Vosc (ko) (step S1403), and the pulse energy Pamp (ko) after the amplification is measured (step S1404). In accordance with the laser oscillation and the energy measurement, the pulse counter ko is increased by one increment (step S1405).

In this stage, if the pulse counter ko does not exceed M (=1000), the charging voltage of the oscillating laser 100 is checked (YES in step S1406). The charging voltage of the oscillating laser 100, namely the upper limit value Vomax of the charging voltage of the main capacitor C0 disposed in the oscillating high-voltage pulse generator 12, is previously determined, and if the latest charging voltage Vosc (ko−1) is less than the upper limit charging voltage Vomax, the above-described step S1401 and following steps are executed again (YES in step S1407). When the laser gas of the oscillating laser 100 is deteriorated, the pulse energy of the laser is deteriorated. In order to prevent the pulse energy from deteriorating, the charging voltage Vosc is increased gradually. When the latest charging voltage Vosc (ko−1) is the upper limit charging voltage Vomax or more, the laser gas in the oscillating chamber 10 is controlled (NO in step S1407; step S1408). When the gas control processing is completed, the above-described step S1401 and following steps are executed furthermore.

By executing the above-described gas control processing, the pulse energy of the oscillating laser 100 is restored. Accordingly, it becomes possible to return the value of the charging voltage Vosc of the oscillating laser 100 to near the initial value at the time of initiation of the operation.

The processing of step S1401 to step S1408 is repeated, and if the pulse counter ko exceeds M (=1000), namely if it becomes the M+1-st pulse (=the 1001-st pulse) the laser oscillation is stopped, and the laser oscillation in one burst is terminated (NO in step S1406).

Then, the control of the amplifying laser 300 will be described with reference to FIG. 20B.

As shown in FIG. 20B, the pulse counter ka is first set to zero in the amplifying laser 300 (step S1231). The energy controller 7 sets the charging voltage Vamp of the amplifying laser 300 to the previously determined initial value (step S1232), and the pulse counter ka is increased by one increment (step S1233). Here, if the pulse counter ka is less than M+1 (=1001), the laser oscillation is executed at the set charging voltage Vamp (YES in step S1234; step S1235). The pulse energy Pamp (ka) is measured by the second monitor module 39, and a signal indicating the pulse energy Pamp (ka) is output to the energy controller 7 (step S1236).

Here, when the charging voltage Vosc (ko) of the oscillating laser 100 is less than the upper limit charging voltage Vomax and the pulse energy Pamp (ka) of the amplifying laser 300 is the target energy Patgt, the above-described step S1233 and following steps are executed, the laser oscillation is continued at the same charging voltage Vamp as that of the previous pulse (YES in step S1237). Meanwhile, if the charging voltage Vosc (ko) of the oscillating laser 100 exceeds the upper limit charging voltage Vomax or the pulse energy Pamp (ka) of the amplifying laser 300 is not the target energy Patgt, a previously determined correction value ΔV is added to the charging voltage Vamp to prevent the pulse energy Pamp from decreasing (NO in step S1237; step S1238). The charging voltage Vamp is increased by only the correction value ΔV, so that the pulse energy Pamp after the amplification increases.

When the deterioration of the laser gas proceeds with the continuation of the laser oscillation, it is hard to prevent the pulse energy Pamp from decreasing by the control of only the above-described charging voltage Vamp if the charging voltage Vosc (ko) exceeds the upper limit charging voltage Vomax or the pulse energy Pamp (ka) of the amplifying laser 300 is not the target energy Patgt. Accordingly, the charging voltage Vamp which is compensated by the addition of the correction value ΔV and the upper limit charging voltage Vamax are compared for judgment (step S1239). The upper limit charging voltage Vamax indicates the maximum charging voltage in the charging voltage setting range (namely, the voltage setting range of the charger 31) of the main capacitor C0 disposed in the amplifying high-voltage pulse generator 32.

If the charging voltage Vamp which is compensated by the addition of the correction value ΔV is less than the upper limit charging voltage Vamax, the above-described step S1232 and following steps are executed at the compensated charging voltage Vamp (YES in step S1239). Meanwhile, if the charging voltage Vamp compensated by the addition of the correction value ΔV becomes the upper limit charging voltage Vamax or more, the laser gas in the oscillating chamber 10 is controlled by the gas control processing (NO in step S1239; step S1240). When the gas control processing is completed, the above-described step S1232 and following steps are executed furthermore.

By executing the gas control processing, it becomes possible to prevent the pulse energy Pamp from decreasing by simply controlling the charging voltage Vamp, when the charging voltage Vosc (ko) exceeds the upper limit charging voltage Vomax or the pulse energy Pamp (ka) of the amplifying laser 300 is not the target energy Patgt. In accordance with the gas control processing, it becomes possible to return the value of the charging voltage Vamp of the amplifying laser 300 to near the initial value at the tine of initiation of the operation.

Thus, by executing the above-described laser gas control in addition to the control of the charging voltage Vamp of the amplifying laser 300, it becomes possible to suppress the pulse energy Pamp from decreasing in view of the medium term (during the gas life) and the long term (life of the laser chamber) and to control the pulse energy stably.

The processing of step S1232 to step S1240 is repeated, and when the pulse counter ka exceeds M (=1000), namely when it becomes the M+1-st pulse (=the 1001-st pulse), the laser oscillation is stopped, and the laser oscillation in one burst is terminated (NO in step S1234).

(2-2. Oscillating Laser: Spike Control, Pulse-by-pulse Control and Exposure Amount Constant Control)

FIGS. 23A and 23B are diagrams showing control flows of the oscillating laser and the amplifying laser.

In the control of the oscillating laser shown FIGS. 23A and 23B, osc spike control processing is executed from the 1-st pulse to the N-th pulse in one burst, osc pulse-by-pulse control processing is executed from the N+1-st pulse to the M-th pulse, and exposure amount constant control processing (hereinafter referred to as the osc exposure amount constant control processing) is executed from the M+1-st pulse to the O-th pulse by the oscillating laser 100 such that the cumulative energy after the amplification for S pulses becomes constant. In the descriptions of the individual processings, numeric values N=3, M=39, O=1000 and S=40 are used as specific pulse numbers.

Similar to the above (2-1), the oscillating laser 100 and the amplifying laser 300 are operated synchronously. The amplifying laser is controlled as indicated by the control flow of FIG. 20B described in (2-1) so that its description is omitted.

Then, the control of the oscillating laser 100 will be described with reference to FIGS. 23A and 24.

As shown in FIG. 23A, the oscillating laser 100 executes the osc spike control processing from the start of the laser oscillation to the N-th pulse (=3-rd pulse) (step S1511), executes the osc pulse-by-pulse control processing from the N+1-st pulse (=the 4-th pulse) to the M-th pulse (=the 39-th pulse) (step S1512) and executes the osc exposure amount constant control processing from the M+1-st pulse (=the 40-th pulse) to the O-th pulse (=the 1000-th pulse) to make the exposure amount of S pulses (=40 pulses) constant (step S1513).

The osc spike control processing (step S1511) and the osc pulse-by-pulse control processing (step S1512) are described in the above [2-1]. Therefore, the osc exposure amount constant control processing (step S1513) will be described mainly.

In the osc pulse-by-pulse control processing, if the pulse counter ko exceeds M (=39), namely if it becomes the M+1-st pulse (=the 40-th pulse), the osc pulse-by-pulse control processing shifts to the osc exposure amount constant control processing (NO in step S1406).

FIG. 24 is a diagram showing a processing flow of the osc exposure amount constant control processing.

Where the osc exposure amount constant control processing is executed, the following preparation process is conducted in parallel with the osc spike control processing of step S1511 and the osc pulse-by-pulse control processing of step S1512 shown in FIG. 23A to conduct a first integration.

In the preparation process, 1 is stored in the integration start pulse number i, and i+(S−1) (=40) is stored in the integration end pulse number j in advance (step S1601). And, the laser oscillation of the ko-th pulse (=the 41-st pulse) is executed (step S1602). The processing in step S1002 is the same to the processing of step S1308 of the osc spike control processing shown in FIG. 21 when the pulse counter ka is between the 1-st pulse and the N-th pulse (=the 3-rd pulse). And, it is same to the processing of step S1403 of the amp pulse-by-pulse control processing shown in FIG. 22 when the pulse counter ka is between the N+1-st pulse (=the 4-th pulse) and the M-th pulse (=the 39-th pulse).

Then, the measured pulse energy Pamp (ko) of the amplifying laser 300 is stored. Specifically, when the pulse counter ko is from the 1-st pulse to the N-th pulse (=the 3-rd pulse), the pulse energy Pamp(ko) measured in step S1309 of the osc spike control processing shown in FIG. 21 is stored. When the pulse counter ko is from the N+1-st pulse (=the 4-th pulse) to the M-th pulse (=the 39-th pulse), the pulse energy Pamp(ko) measured in step S1404 of the osc pulse-by-pulse control processing shown in FIG. 22 is stored (step S1603).

And, the pulse counter ko is increased by one increment (step S1604). The processing in step S1604 is the same to the processing of step S1311 of the osc spike control processing shown in FIG. 21 when the pulse counter ko is from the 1-st pulse to the N-th pulse (=the 3-rd pulse). When the pulse counter ka is from the N+1-st pulse (=the 4-th pulse) to the M-th pulse (=the 39-th pulse), it is same to the processing of step S1405 in the osc pulse-by-pulse control processing shown in FIG. 22. The measurement of the laser oscillation and pulse energy is repeated until the pulse counter ko becomes j−1 (YES in step S1605).

When the pulse counter ko becomes the integration end pulse number j, namely when it falls in an oscillation stage of an integration end pulse, the process shifts to the main step of the osc constant control processing (NO in step S1605).

In the main step, the cumulative energy from the i-th pulse to the j−1-st pulse, namely the cumulative energy D (i) for S−1 pulses, is calculated. The cumulative energy D(i) for the S−1 pulses from the i-th pulse is calculated by the following formula (1) (step S1606).

[Formula 2]

$$D(i) = \sum_{n=i}^{j-1} P_{amp}(n) \qquad (1)$$

Target cumulative energy for the S pulses (=40 pulses) is previously determined as D0, and difference P(ko) (=D0−D(i)) between this target cumulative energy D0 and the cumulative energy D(i) for the S−1 pulses (=39 pulses) calculated from the above formula (1) is calculated. The calculated P(ko) is the target energy of the ko-th (=j-th) pulse to determine the cumulative energy for S pulses as D0 (step S1607).

Difference ΔP(ko) (=P(ko)−Pamp(ko−1)) between the target energy P(ko) and the pulse energy Pamp(ko−1) earlier by one pulse of the amplifying laser 300 is calculated. The calculated result ΔP(ko) is used to calculate a correction value ΔV(ko) (=e×ΔP(ko), where e is constant) of the charging voltage of the oscillating laser 100 of the ko-th pulse, namely the integration end pulse j. This correction value ΔV(ko) and a charging voltage Vosc(ko−1) earlier by one pulse are used to calculate a charging voltage Vosc(ko) (=ΔV(ko)+Vosc(ko−1)) of the ko-th pulse (step S1608).

And, the laser oscillation of the ko-th pulse is executed at a charging voltage Vosc (ko) (step S1609). In accordance with the laser oscillation, the pulse energy Pamp (ko) after the amplification is measured and stored (step S1610).

Where the exposure amount stability is evaluated on the side of the exposure device 3, the cumulative energy D(i) for S−1 pulses (=39 pulses) calculated in step S1606 and the pulse energy Pamp(ko) after the amplification are used to calculate a cumulative energy D(ko) (=D(i)+Pamp(ko)) for S pulses (=40 pulses), and the calculated data is transmitted to the exposure device 3 (step S1611). For example, if the calculated data is outside of the specifications of exposure amount stability as the evaluated result, the exposure device 3 stops the light exposure. If the exposure amount stability is not evaluated on the side of the exposure device 3, step S1611 may be omitted.

In this stage, the pulse counter ko is increased by one increment if the pulse counter ko is less than O (=1000) (YES in step S1612; step S1613). If a charging voltage Vosc (ko−1) of the latest oscillating laser 100 is less than the upper limit charging voltage Vomax, the integration start pulse number i is increased by one increment, the integration end pulse number j is increased by one increment, and the above-described step S1606 and following steps are executed (YES in step S1614; step S1616). Meanwhile, if the latest charging voltage Vosc (ko−1) is the upper limit charging voltage Vomax or more, the laser gas in the oscillating chamber 10 is controlled. Then, the integration start pulse number i is increased by one increment, the integration end pulse number j is increased by one increment, and the processing of the above-described step S1606 and following is executed (NO in step S1614; step S1615, step S1616).

The processing of step S1606 to step S1616 is repeated, and when the pulse counter ko becomes O (=1000), the laser oscillation is stopped, and the laser oscillation in one burst is terminated (NO in step S1612).

According to the second control example described above, the pulse energy control of the two-stage laser can be executed with high accuracy. Therefore, the pulse energy of the two-stage laser can be stabilized.

The second control example uses the characteristics that when the pulse energy of the laser beam (seed light), which is output from the oscillating laser 100 and injected into the amplifying laser 300, is a region (region 1 of FIG. 6) of the lower limit energy Es0 or less of the amplification saturation region, the pulse energy after the amplification depends on a change in energy of the seed light. Therefore, the pulse energy after the amplification is determined by a charging voltage of the oscillating laser 100, namely a charging voltage of the main capacitor C0 disposed in the oscillating high-voltage pulse generator 12.

In the second control example, the control of the amplifying laser 300 is adequately simple control (for example, to make a charging voltage of the amplifying laser constant) of a level to keep the amplification intensity (namely, the value of a voltage applied between the electrodes of the amplifying laser 300) such that the pulse energy of the laser beam after the amplification becomes a target energy Patgt by the pulse energy control of the seed light, and substantially, the control of the oscillating laser 100 is merely executed strictly. The pulse energy Pamp after the amplification is measured, and according to the measured result, the charging voltage Vosc of the oscillating laser 100 is controlled (osc spike control processing, osc pulse-by-pulse control processing and osc exposure amount constant control processing) for each pulse. Thus, the high-precision pulse energy control of the amplified laser beam can be realized.

Thus, similar to the first control example, the second control example can control the oscillating laser 100 and the amplifying laser 300 with their control allocation divided apparently, so that the control stability is good, and an error does not occur easily. Therefore, it can be said that the control precision can be improved. And, the control in that one is simple while the other is strict as in this control example is simple, so that a computation load of the controller is small. Therefore, a high-performance controller is not needed, and the cost can be reduced.

And, it becomes possible to control a pulse energy for compensating an output drop of in a medium term (during the gas life) and a long term (life length of the laser chamber) by combined use of the control to change the gas pressure and the gas composition of the oscillating laser and the amplifying laser, and it becomes possible to control the pulse energy stably for a long period.

3. Third Control Example

FIGS. 25A to 25D are diagrams showing individual charging voltages and individual pulse energies in the third control example. Individual rectangular waves shown in FIGS. 25A to 25D indicate charging voltages and pulse energies in one burst.

The third control example varies the charging voltage of the oscillating laser 100 and the charging voltage of the amplifying laser 300 according to the target pulse energy.

An outline of the third control example will be described. A charging voltage Vosc of the oscillating laser 100 is controlled for each pulse (the second osc spike control processing, the second osc pulse-by-pulse control processing to be described later) (see FIG. 25A), and a pulse energy Posc of the oscillating laser 100 (namely, pulse energy of seed light injected into the amplifying laser 300) measured by the first monitor module 19 is determined as a target energy Potgt (see FIG. 25B). And, a pulse energy Pamp of the amplifying laser 300 is measured by the second monitor module 39, and a charging voltage Vamp of the amplifying laser 300 is controlled for each pulse (the above-described amp spike control processing, amp pulse-by-pulse control processing, and amp exposure amount constant control processing) (see FIG. 25C) so that the measured value becomes a target energy Patgt (see FIG. 25D).

Control flows of the third control example are as shown in FIGS. 26A, 26B and FIGS. 29A, 29B. Here, a two-stage laser of the MOPO system is described as an example, but a two-stage laser of the MOPA system is also controlled in the same way.

FIGS. 26A and 26B are diagrams showing control flows of the oscillating laser and the amplifying laser.

In the control shown in FIGS. 26A and 26B, the oscillating laser executes the second osc spike control processing from the 1-st pulse to the No-th pulse in one burst and executes the second osc pulse-by-pulse control processing from the No+1-st pulse to the M-th pulse. And, the amplifying laser executes the amp spike control processing from the 1-st pulse to the Na-th pulse in one burst and executes the amp pulse-by-pulse control processing from the Na+1-st pulse to the M-th pulse. The amp spike control processing and the amp pulse-by-pulse control processing are described above and their descriptions are omitted below.

FIGS. 29A and 29B are diagrams showing control flows of the oscillating laser and the amplifying laser.

In the control shown in FIGS. 29A and 29B, the oscillating laser executes the second osc spike control processing from the 1-st pulse to the No-th pulse in one burst and executes the second osc pulse-by-pulse control processing from the No+1-st pulse to the O-th pulse. And, the amplifying laser executes the amp spike control processing from the 1-st pulse to the Na-th pulse in one burst, executes the amp pulse-by-pulse control processing from the Na+1-st pulse to the Ma-th pulse, and executes the amp exposure amount-by-exposure amount constant control processing from the Ma+1-st pulse to the O-th pulse. The amp exposure amount-by-exposure amount constant control processing is described above, so that its description is omitted below.

FIG. 27 is a diagram showing a processing flow of the second osc spike control processing.

In the second osc spike control processing, the following preprocessing is executed before the laser oscillation is started. The main controller 4 or the energy controller 7 counts a laser downtime between bursts by an unshown downtime counter T (step S1901). When an oscillation instruction is output from the exposure device 3, the downtime counting is stopped (step S1902).

This laser system is provided with an unshown database, in which the target energy Potgt and downtime of the oscillating laser 100 are stored in correspondence with a Vtosc-Ptosc data table. The Vtosc-Ptosc data table includes the data record of every pulse in the second osc spike control processing and is comprised of the data Vtosc of the charging voltage Vosc of the oscillating laser 100 and the data Ptosc of the laser pulse energy Ptosc of the oscillating laser 100. The downtime is specified by the downtime counter T, and the Vtosc-Ptosc data table corresponding to the downtime T and the target energy Potgt is retrieved and taken into the energy controller 7 (step S1903). Then, the downtime counter T is reset (step S1904).

When the above preprocessing is completed, the laser oscillation pulse counter ko is set to the initial value 1 (step S1905), and the following processing is repeated until the pulse counter ko exceeds N (=3), namely between one to three pulses (YES in step S1906).

Difference $\Delta$Ptosc(ko) (=Ptosc(ko)−Potgt) between the pulse energy Ptosc(ko) of the ko-th pulse in the Vtosc-Ptosc data table and the target energy Potgt is calculated, and the calculated result $\Delta$Ptosc(ko) is used to calculate correction value $\Delta$Vtosc(ko) (=c×$\Delta$Ptosc(ko), where c is constant) of the charging voltage of the oscillating laser 100 of the ko-th pulse. The charging voltage Vtosc of the ko-th pulse and the correction value $\Delta$Vtosc(ko) in the Vtosc-Ptosc data table are used to calculate a charging voltage Vosc(ko) (=$\Delta$Vtosc(ko)+$\Delta$Vtosc(ko)) of the actual ko-th pulse (step S1907).

And, the laser oscillation of the ko-th pulse is executed with the charging voltage Vosc (ko), and its pulse energy Posc (ko) is measured by the first monitor module 19 (step S1908, step S1909). In accordance with the laser oscillation and the measurement of energy, the charging voltage Vtosc (ko) and the pulse energy Ptosc (ko) of the ko-th pulse in data of the Vtosc-Ptosc data table corresponding to the previous downtime and the target energy Potgt are updated by the calculated actual charging voltage Vosc (ko) and the measured pulse energy Posc (ko) (step S1910), and the pulse counter ko is increased by one increment (step S1911).

Processing of step S1906 through step S1911 is repeated, and when the pulse counter ko exceeds N (=3), namely when it becomes the N+1-st pulse (=the 4-th pulse), the second osc spike control processing shifts to the second osc pulse-by-pulse control processing (NO in step S1906).

FIG. 28 is a diagram showing a processing flow of the second osc pulse-by-pulse control processing.

The pulse counter ko used in the second osc pulse-by-pulse control processing is same to the pulse counter ko used in the second osc spike control processing. Therefore, the pulse number counted by the second osc spike control is transferred to the second osc pulse-by-pulse control processing.

Difference $\Delta$Posc(ko) (=Posc(ko−1)−Potgt) between the pulse energy Posc(ko−1) earlier by one pulse and the target energy Potgt is calculated. The calculated result $\Delta$Posc(ko) is used to calculate correction value $\Delta$Vosc (=a×$\Delta$Posc(ko), where a is constant) of the charging voltage of the oscillating laser 100 of the ko-th pulse (step S2001). This correction value $\Delta$Vosc and the charging voltage Vosc(ko−1) earlier by one pulse are used to calculate a charging voltage Vosc(ko) (=$\Delta$Vosc(ko)+Vosc(ko−1)) of the ko-th pulse (step S2002). And, the laser oscillation of the ko-th pulse is executed at the charging voltage Vosc (ko) (step S2003) and its pulse energy Posc (ko) is measured (step S2004). In accordance with the laser oscillation and the energy measurement, the pulse counter ko is increased by one increment (step S2005).

In this stage, if the pulse counter ko does not exceed M (=1000), a charging voltage of the oscillating laser 100 is checked (YES in step S2006). The charging voltage of the oscillating laser 100, namely the upper limit value Vomax of the charging voltage of the main capacitor C0 disposed in the oscillating high-voltage pulse generator 12 is previously determined. If the latest charging voltage Vosc (ko−1) is less than the upper limit charging voltage Vomax, the processing of the above-described step S2001 and following steps are executed again (YES in step S2007). When the laser gas of the oscillating laser 100 is deteriorated, the pulse energy of the laser is degraded. In order to prevent the pulse energy from degrading, the charging voltage Vosc is increased gradually. When the latest charging voltage Vosc (ko−1) is the upper limit charging voltage Vomax or more, the laser gas in the oscillating chamber 10 is controlled (NO in step S2007; step S2008). When the gas control processing is completed, the above-described step S2001 and following steps are executed furthermore.

By executing the above-described gas control processing, the pulse energy of the oscillating laser 100 is restored. Accordingly, it becomes possible to return the value of the charging voltage Vosc of the oscillating laser 100 to near the initial value at the time of initiation of the operation.

The processing of step S2001 to step S2008 is repeated, and if the pulse counter ko exceeds M (=1000), namely if it becomes the M+1-st pulse (=the 1001-st pulse), the laser oscillation is stopped, and the laser oscillation of one burst is terminated (NO in step S2006).

According to the third control example described above, the pulse energy control of the two-stage laser can be executed with high accuracy. Therefore, the pulse energy of the two-stage laser can be stabilized.

The third control example keeps the pulse energy of the laser beam (seed light), which is output from the oscillating laser 100 and injected into the amplifying laser 300, at a prescribed target energy Potgt. The setting region of the target energy Potgt is arbitrary and may be either a region (region 1 of FIG. 6) with a lower limit energy Es0 or less of the amplification saturation region or a region (region 2 of FIG. 6) with the lower limit energy Es0 or more. And, the pulse energy of the seed light is kept at the target energy Potgt, and the pulse energy after the amplification is determined according to the charging voltage of the amplifying laser 300, namely the charging voltage of the main capacitor C0 disposed in the amplifying high-voltage pulse generator 32.

Specifically, according to the third control example, the pulse energy Posc of the laser beam (seed light) which is output from the oscillating laser 100 and injected into the amplifying laser 300 is measured, and according to the measured result, the charging voltage Vosc of the oscillating laser 100 is controlled for every pulse (the second osc spike control processing, and the second osc pulse-by-pulse control processing). Meanwhile, the pulse energy Pamp after the amplification is measured, and according to the measured result, the charging voltage Vamp of the amplifying laser 300 is controlled for every pulse (amp spike control processing, amp pulse-by-pulse control processing, and amp exposure amount constant control processing). Thus, the pulse energy control of the laser beam after the amplification with high precision can be realized. Because the control is executed independently, the high-precision energy control becomes possible.

According to the third control example, the pulse energy of the seed light is controlled with high accuracy, so that an influence of the laser beam after the amplification upon the pulse energy due to a change in energy of the seed light can be reduced. If the target energy Potgt of the seed light is within the amplification saturation region, the influence of the laser beam after the amplification upon the pulse energy due to a change in energy of the seed light can be reduced more than in the first control example. Meanwhile, both the oscillating laser and the amplifying laser execute controlling with strict accuracy, so that the controller has a computation load which is larger than in the first control example.

For the spike control and the pulse-by-pulse control of the oscillating laser 100 and the amplifying laser 300 shown in FIGS. 26A and 26B, it is desirable that the individual pulse numbers are matched (No=Na, Mo=Ma). By matching them, controllability of the oscillating laser 100 and the amplifying laser 300 becomes good, and the pulse energy with high precision becomes possible.

The control examples of the pulse energy of the two-stage laser according to the present invention are the above-described first to third control examples but not limited to them.

As described above, the laser beam may be detected at any arbitrary point of the light path from the outlet of the amplifying laser 300 to the exposure target (for example, wafer) of the exposure device 3. Specifically, the laser beam is detected by the second monitor module 39, the output monitor 51 disposed in the exposure device 3 or an unshown output monitor disposed in the light path. When the laser beam is detected not near the outlet of the amplifying laser 300 but especially at a point as closer as possible to the exposure target (for example, wafer) in the above-described light path, an influence of a change in pulse energy due to an influence of the optical element or the like in the light path can be detected easily, and the control of the exposure amount by the exposure device can be executed with high accuracy.

Especially, where the exposure amount on the exposure target (for example, wafer) is desired to be controlled with high accuracy, it is necessary to control the two-stage laser according to the detected result of the output monitor 51 disposed in the exposure device 3. And, it is necessary to send or receive the data signal at a high speed. If the data signal is not sent or received at a high speed, the main controller 4 sends the control instruction signal to the individual controllers 5 through 7 according to the control instruction from the exposure device 3, but when the data signal is sent or received at a high speed, the controller 52 of the exposure device 3 may directly send the control instruction signal to the controllers 5 through 7. For example, the controller 52 may instruct the target energy Patgt to the energy controller 7 or instruct the charging voltages Vosc, Vamp.

In the above-described first through third control examples, the pulse number of the laser is counted by the pulse counter of the energy controller 7, and the start and end of one burst are recognized according to the counted pulse number to control every pulse of one burst, but the pulse control is not limited to them. For example, an external trigger signal may be input from the controller 52 of the exposure device 3 to the energy controller 7 to control every pulse of one burst according to the input signal.

In the above case, an external trigger suspension timer is disposed instead of using the count number of the pulse counter to judge the start and end of one burst, and a lapse of a prescribed time may be recognized as the first pulse of the burst according to the counted result by the timer.

The two-stage laser shown in FIG. 1 has the charger 11 disposed in the oscillating laser 100 and the charger 31 in the amplifying laser 300. If the two chargers 11, 31 have variations in charging accuracy, a voltage which is actually charged to the main capacitor C0 of the individual high-voltage pulse generators 12, 32 includes an error with respect to voltages Vosc, Vamp. Specifically, a time interval from a moment when a trigger signal is input to the solid-state switch SW disposed in the individual high-voltage pulse generators 12, 32 to turn ON to a moment when a discharge is generated within the oscillating chamber 10 and the amplifying chamber 30 is variable. In such a case, synchronization accuracy between the discharge of the oscillating laser 100 and the discharge of the amplifying laser 300 is varied.

Accordingly, the main capacitor C0 disposed on the oscillating high-voltage pulse generator 12 of the oscillating laser 100 and the main capacitor C0 disposed on the amplifying high-voltage pulse generator 32 of the amplifying laser 300 may be recharged by a single charger. Where the charger is single, variations in synchronization between the oscillating laser 100 and the amplifying laser 300 due to variations in manufacturing accuracy of the charger can be reduced. As described above, the synchronous controller 8 receives from the energy controller 7 a signal instructing a charging voltage (voltages Vosc, Vamp) of the next discharge and judges a delay time considering the Vt product property from the contents of the instruction.

When the charger is single, in comparison with the case of two chargers having individual charging accuracy, an influence of the charging accuracy of the charger upon the above-described synchronization accuracy can be reduced. Therefore, it is considered that the use of a single charger is more suitable for the high-precision synchronization.

Meanwhile, the use of two chargers can be said superior to the use of one charger in the following points.

When the charger is single, the main capacitors C0 of the oscillating high-voltage pulse generator 12 and the amplifying high-voltage pulse generator 32 are always recharged. Here, it is assumed that only one of the oscillating chamber 10 and the amplifying chamber 30 is exchanged. In this case, the laser apparatus on the side that the chamber is exchanged is subject to a start-up operation in order to return to the prescribed performance. Where the charger is single, the main capacitor C0 disposed on the high-voltage pulse generator of the other laser apparatus which does not require the start-up operation is also recharged in accordance with the start-up operation of the other laser apparatus, and a useless discharge takes place. Accordingly, the service life of the laser apparatus becomes short by the occurrence of the useless discharge. For example, abrasion and the like of the electrodes in the chamber progress because of the useless discharge, and the service life of the chamber becomes short. And, at the time of the start-up operation, the cover for covering the individual components of the laser apparatus is open. Therefore, it is susceptible to noise generated by the discharge of the other laser apparatus not requiring the start-up operation.

The same can be for a case in that either the high-voltage pulse generator 12 or 32 of the oscillating laser 100 or the amplifying laser 300 fails and it is exchanged.

The same can also be for a case in that where the LNM 16 is adjusted to adjust an oscillation wavelength or the LNM 16 is exchanged to perform a mounting operation in the oscillating laser 100, the amplifying laser 300 which is originally not required to be operated is also operated if the charger is single.

The same is not applied to a case in that the chargers are two. Therefore, there are advantages that the life of the chamber can be extended and the above-described influence of noise is not experienced. But, an influence of the charging accuracy of the charger upon the above-described synchronization accuracy becomes large, and it is necessary to design such that the charging accuracy of the individual chargers 11, 31 is high.

Modified examples of the first control example, namely the control to nearly match a voltage change ratio of a charging voltage in the oscillating laser 100 with a voltage change ratio of a charging voltage in the amplifying laser 300 and the control to nearly match a voltage change amount of a charging voltage in the oscillating laser 100 with a voltage change amount of a charging voltage in the amplifying laser 300 are on the assumption that the chargers are two. Two chargers are required because a charging voltage setting range of the charger 11 in the oscillating laser 100 is Vco1 to Vco2 (Vco1<Vco2), and a charging voltage setting range of the charger 31 in the amplifying laser 300 is Vca1 to Vca2 (Vca1<Vca2).

Where the MOPO system is adopted as the two-stage laser, the pulse energy of seed light which is injected from the oscillating laser 100 into the amplifying laser 300 may generally be relatively small. Therefore, a charging voltage setting range of the charger 11 in the oscillating laser 100 may be set on a lower voltage side than in a charging voltage setting range of the charger 31 in the amplifying laser 300. Here, even if the chargers 11, 31 had the same charging voltage setting range, the pulse energy of seed light of the oscillating laser 100 becomes small in comparison with the case in that narrow-banding is not performed, because narrow-banding of the laser beam (seed light) is executed by the LNM 16. In such a case, however, the energy of the seed light is often larger than necessary. Therefore, a charging voltage setting range of the charger 11 of the oscillating laser 100 is desirably set on the side of a lower voltage than the charging voltage setting range of the charger 31 of the amplifying laser 300, it becomes effective to use two chargers.

INDUSTRIAL APPLICABILITY

The present invention can be applied to, for example, an excimer laser apparatus and a molecular fluorine laser apparatus used as the lithography light source.

BRIEF DESCRIPTION OF THE DRAWINGS

FIG. 6 is a diagram showing a relationship between energy of seed light injected into an amplifying laser and energy after amplification.

FIGS. 7A, 7B, 7C and 7D are diagrams showing individual charging voltages and individual pulse energies in a first control example.

FIGS. 8A and 8B are diagrams showing control flows of an oscillating laser and an amplifying laser.

FIGS. 19A, 19B, 19C and 19D are diagrams showing individual charging voltages and individual pulse energies in a second control example.

FIGS. 25A, 25B, 25C and 25D are diagrams showing individual charging voltages and individual pulse energies in a third control example.

DESCRIPTION OF REFERENCE NUMERALS

Figure 1:
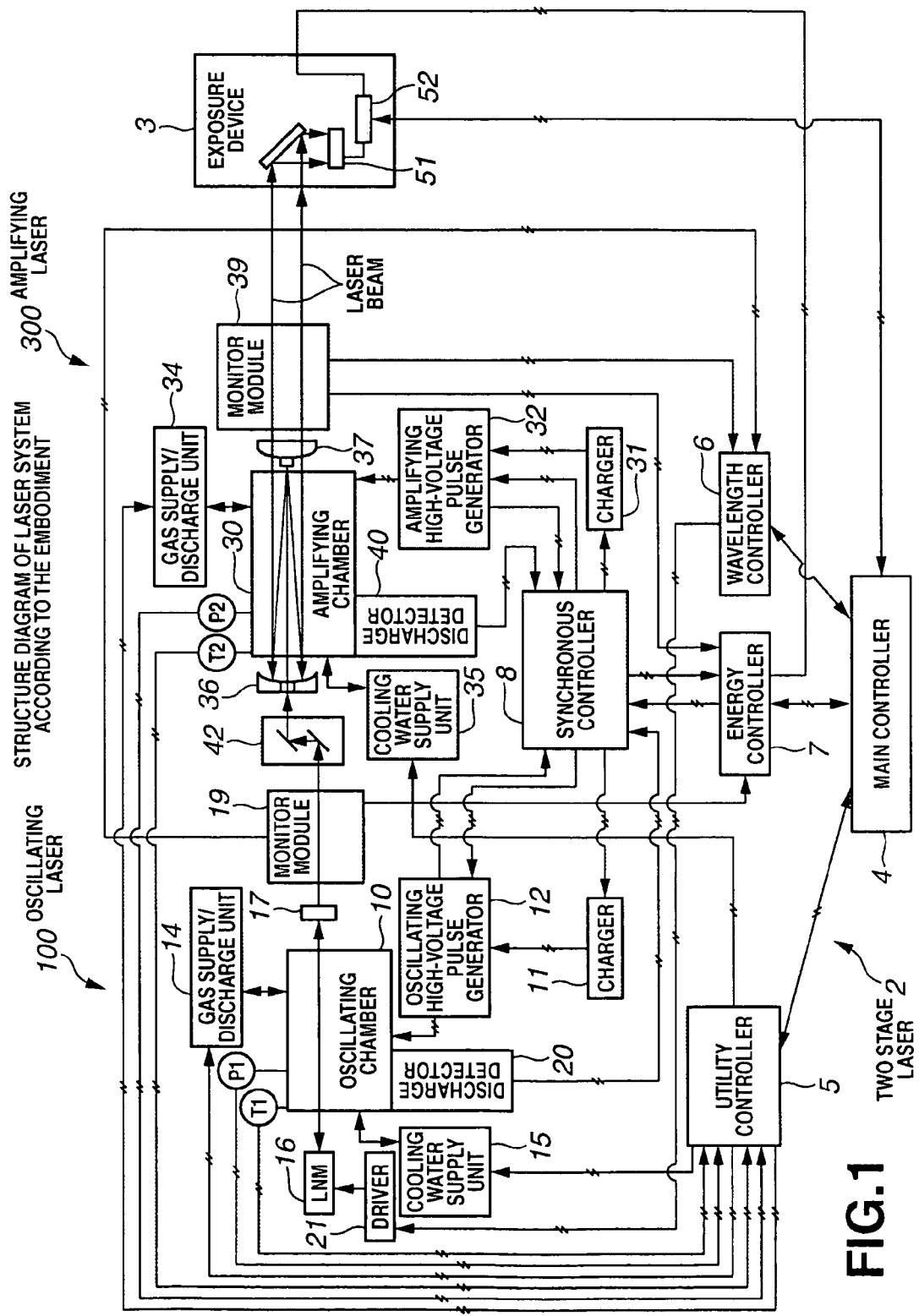
FIG. 1 is a structure diagram of a laser system according to this embodiment.
Figure 2A:
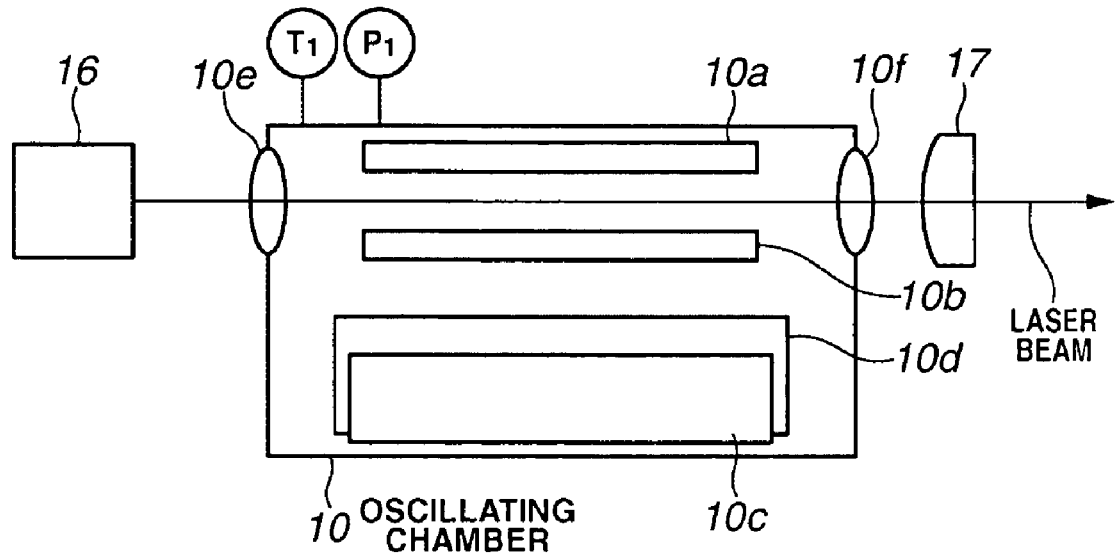
FIG. 2A is a structure diagram of an oscillating chamber.
Figure 2B:
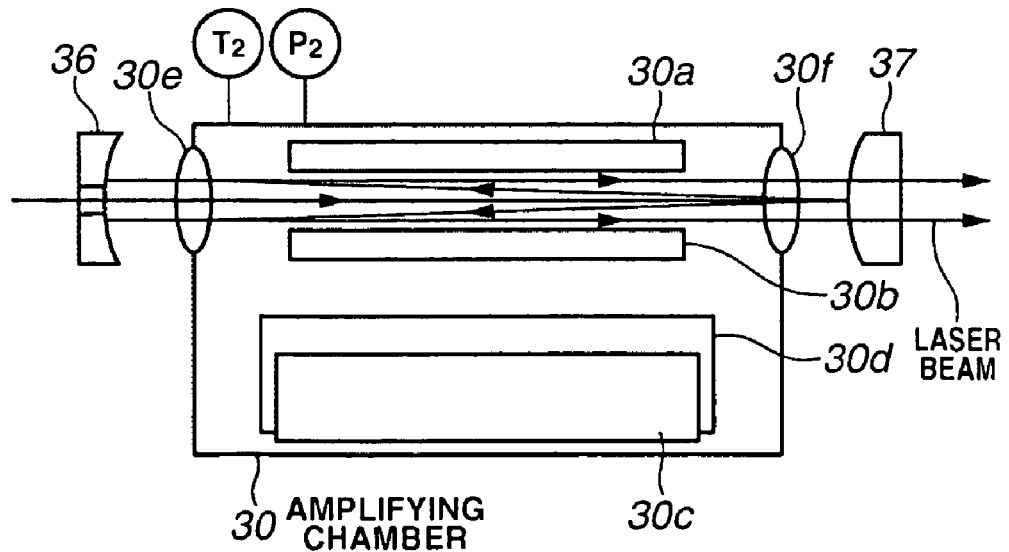
FIG. 2B is a structure diagram of an amplifying chamber.
Figure 3A:
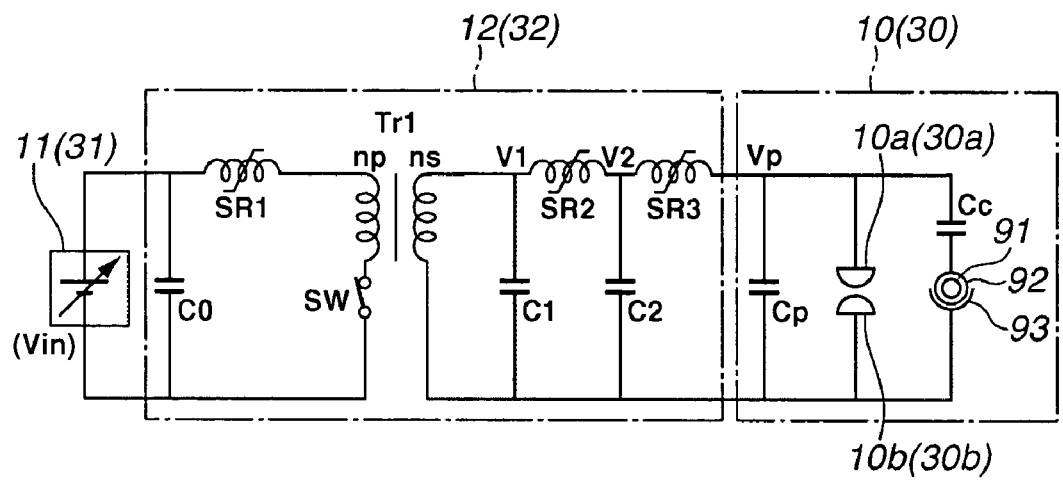
FIGS. 3A and 3B are diagrams showing examples of circuit structures of a power source and a chamber interior.
Figure 3B:
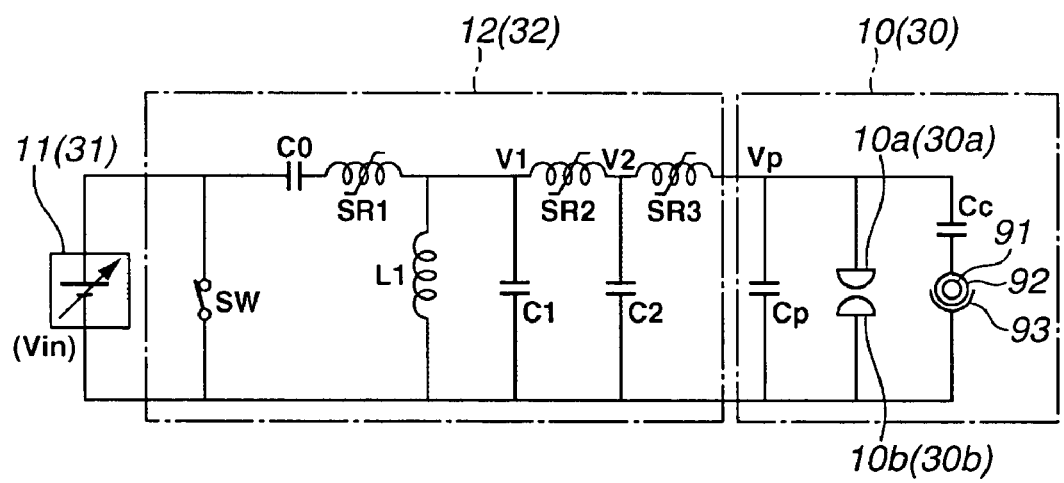
Figure 4:
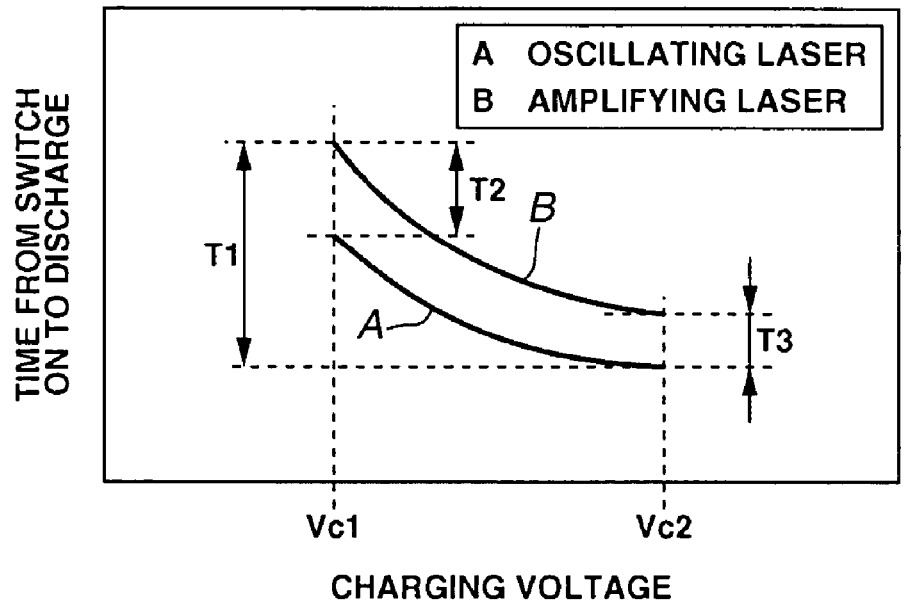
FIG. 4 is a diagram showing a relationship between a time, from when a solid-state switch SW of each high-voltage pulse generator becomes ON to when a discharge is generated between electrodes, and a charging voltage of a main capacitor C0.
Figure 5:
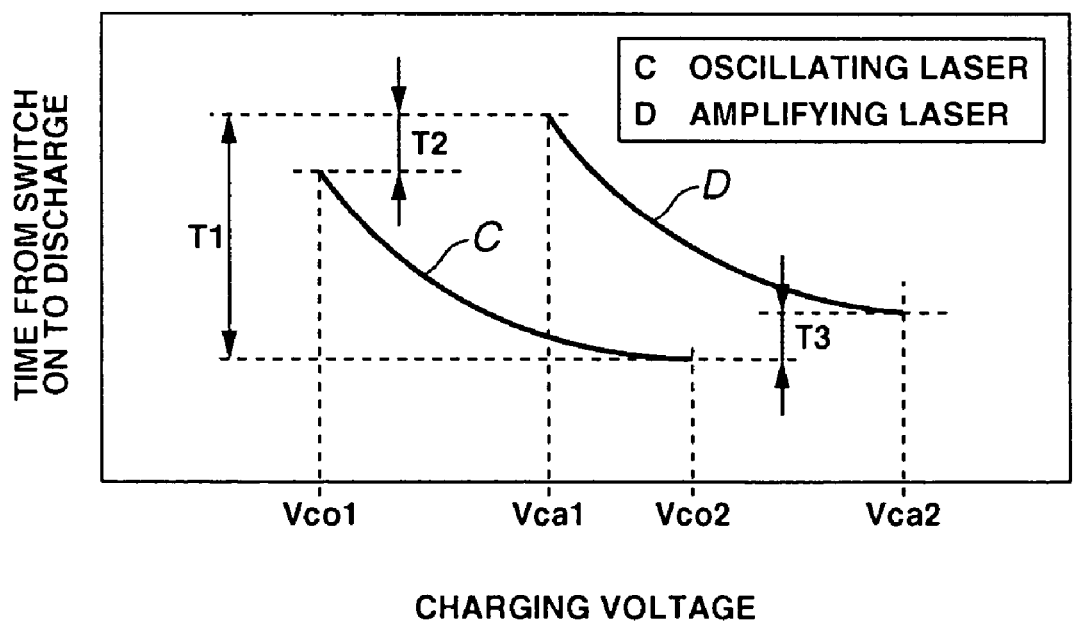
FIG. 5 is a diagram showing a relationship between a time, from when a solid-state switch SW of each high-voltage pulse generator becomes ON to when a discharge is generated between electrodes, and a charging voltage of a main capacitor C0.
Figure 9:
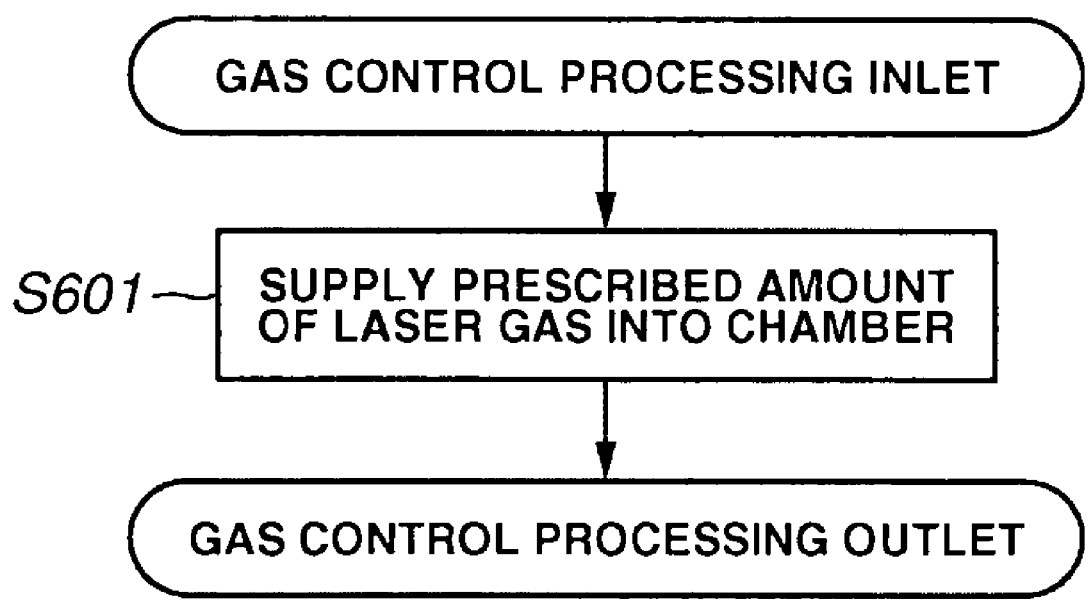
FIG. 9 is a diagram showing a processing flow of gas control processing.
Figure 10:
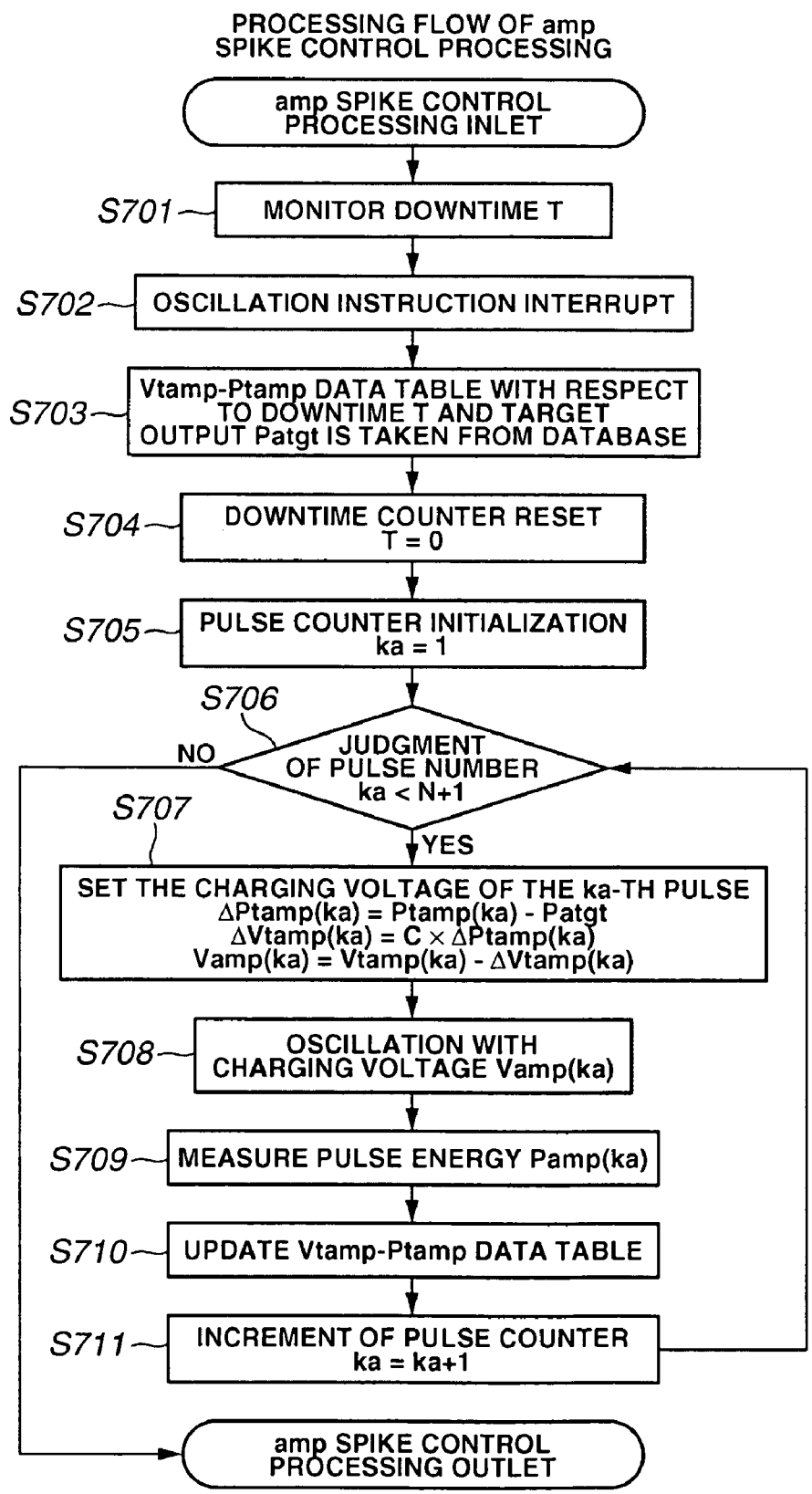
FIG. 10 is a diagram showing a processing flow of amp spike control processing.
Figure 11:
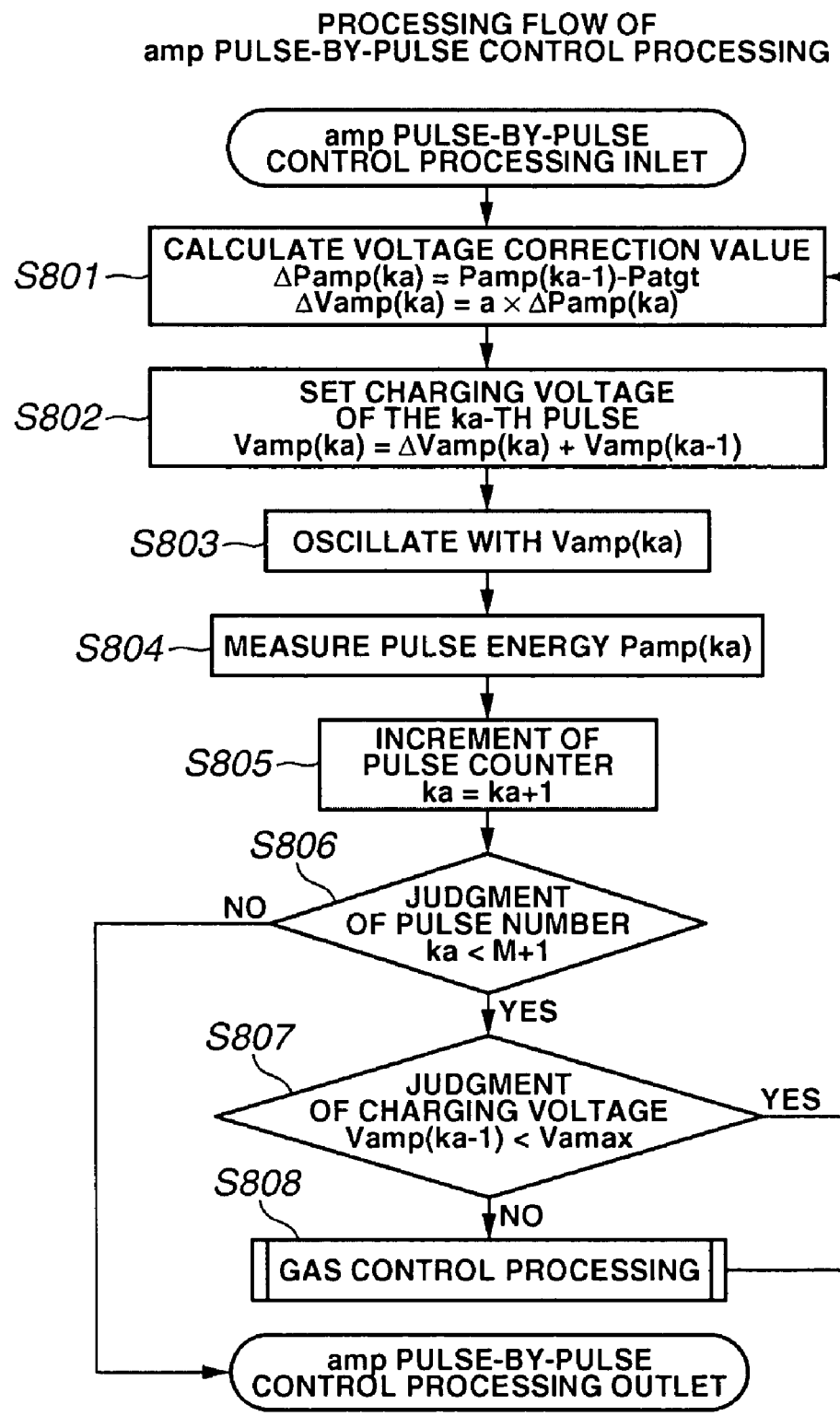
FIG. 11 is a diagram showing a processing flow of amp pulse-by-pulse control processing.
Figure 12:
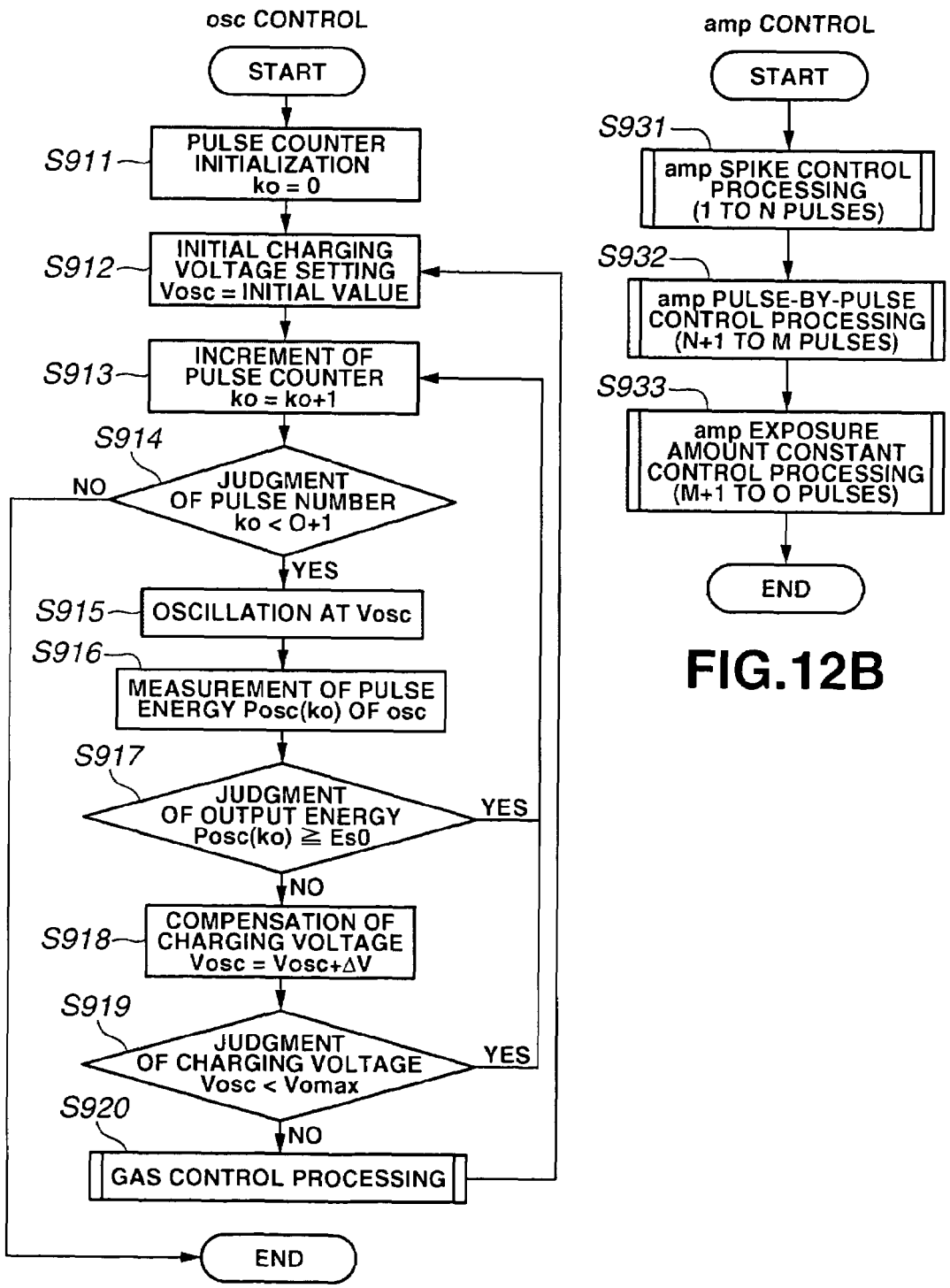
FIGS. 12A and 12B are diagrams showing control flows of an oscillating laser and an amplifying laser.
Figure 13:
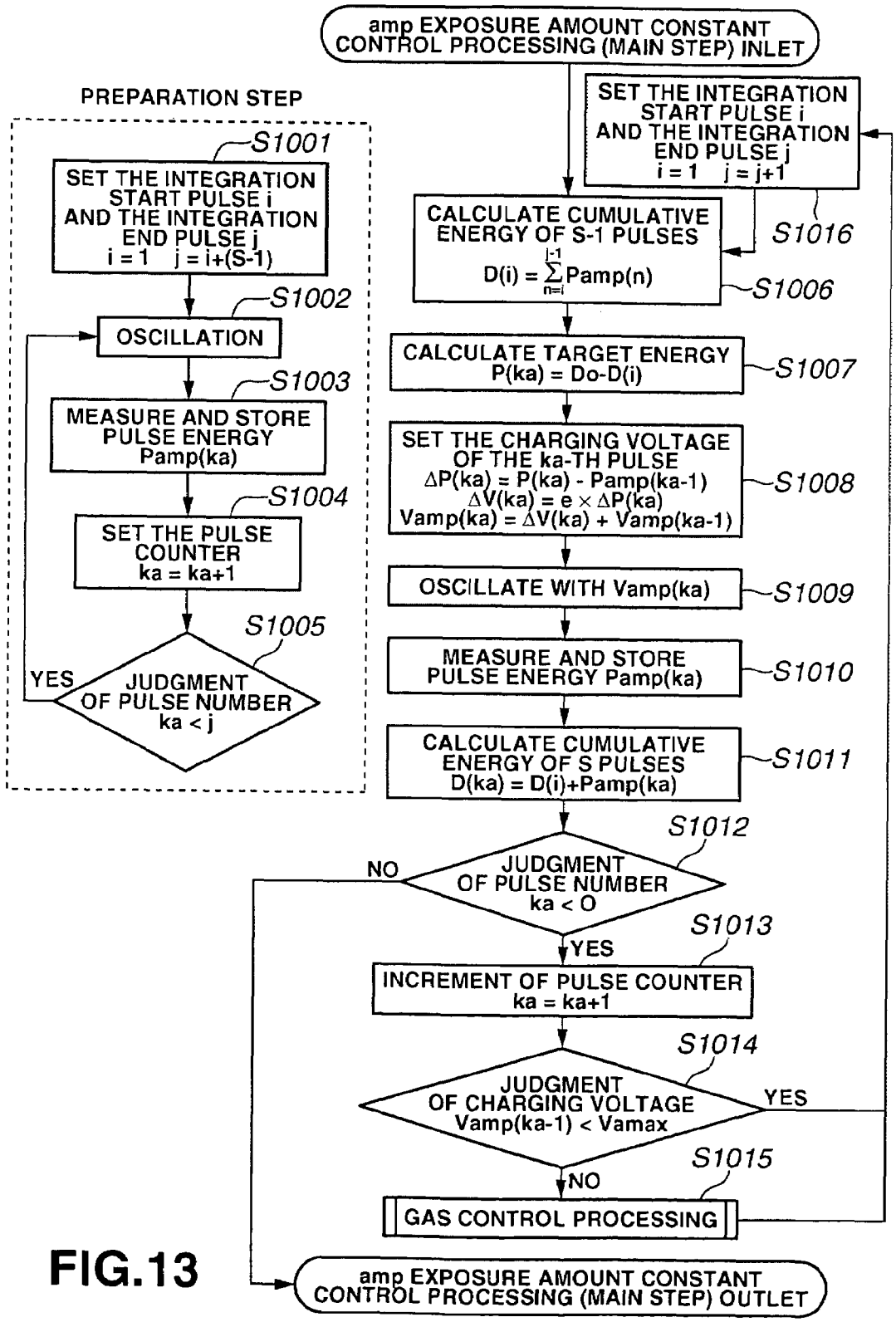
FIG. 13 is a diagram showing a processing flow of amp exposure amount constant control processing.
Figure 14:
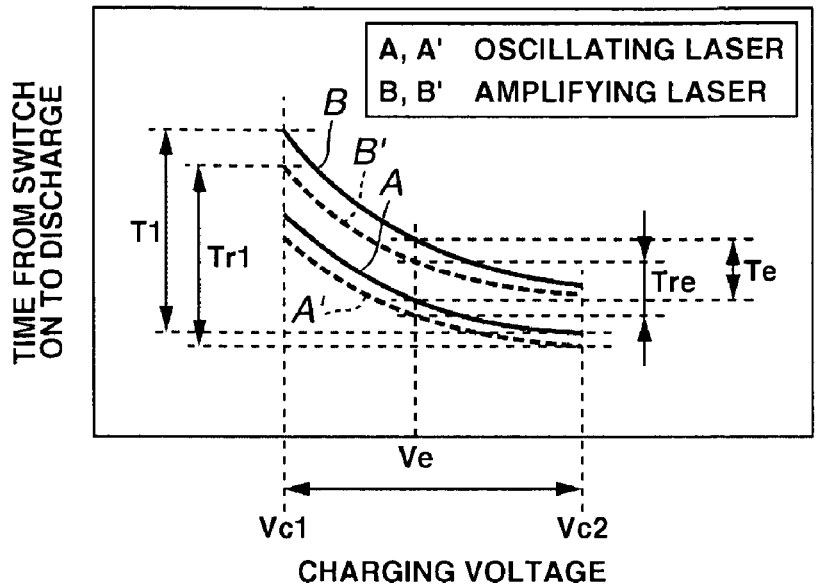
FIG. 14 is a diagram showing a relationship between a time, from when a solid-state switch SW of each high-voltage pulse generator becomes ON to when a discharge is generated between electrodes, and a charging voltage of a main capacitor C0.
Figure 15:
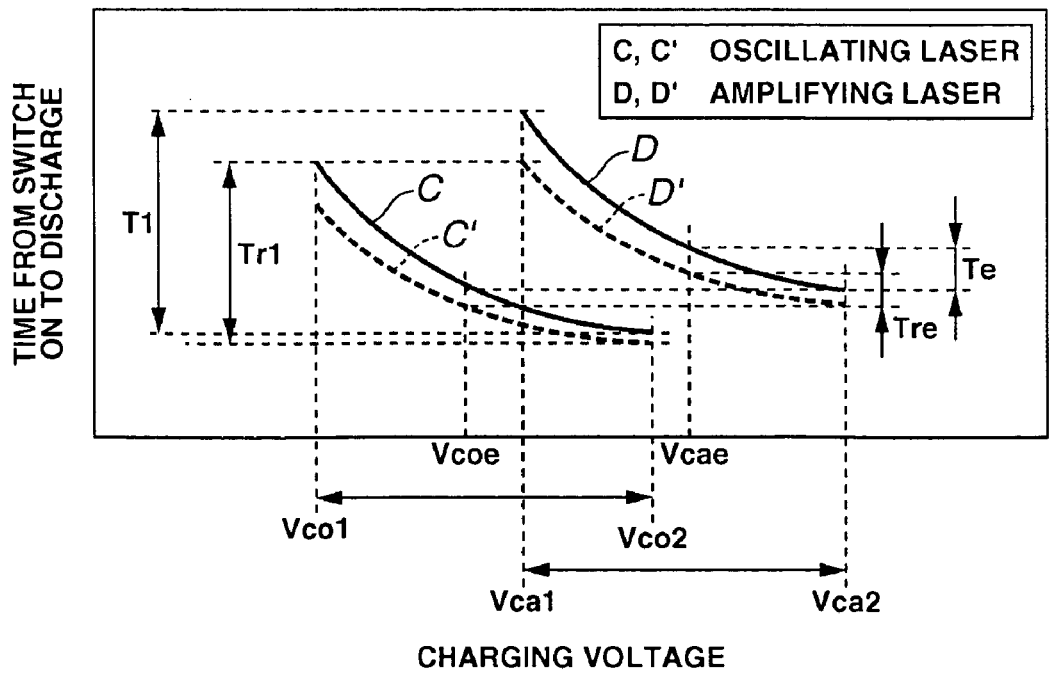
FIG. 15 is a diagram showing a relationship between a time, from when a solid-state switch SW of each high-voltage pulse generator becomes ON to when a discharge is generated between electrodes, and a charging voltage of a main capacitor C0.
Figure 16:
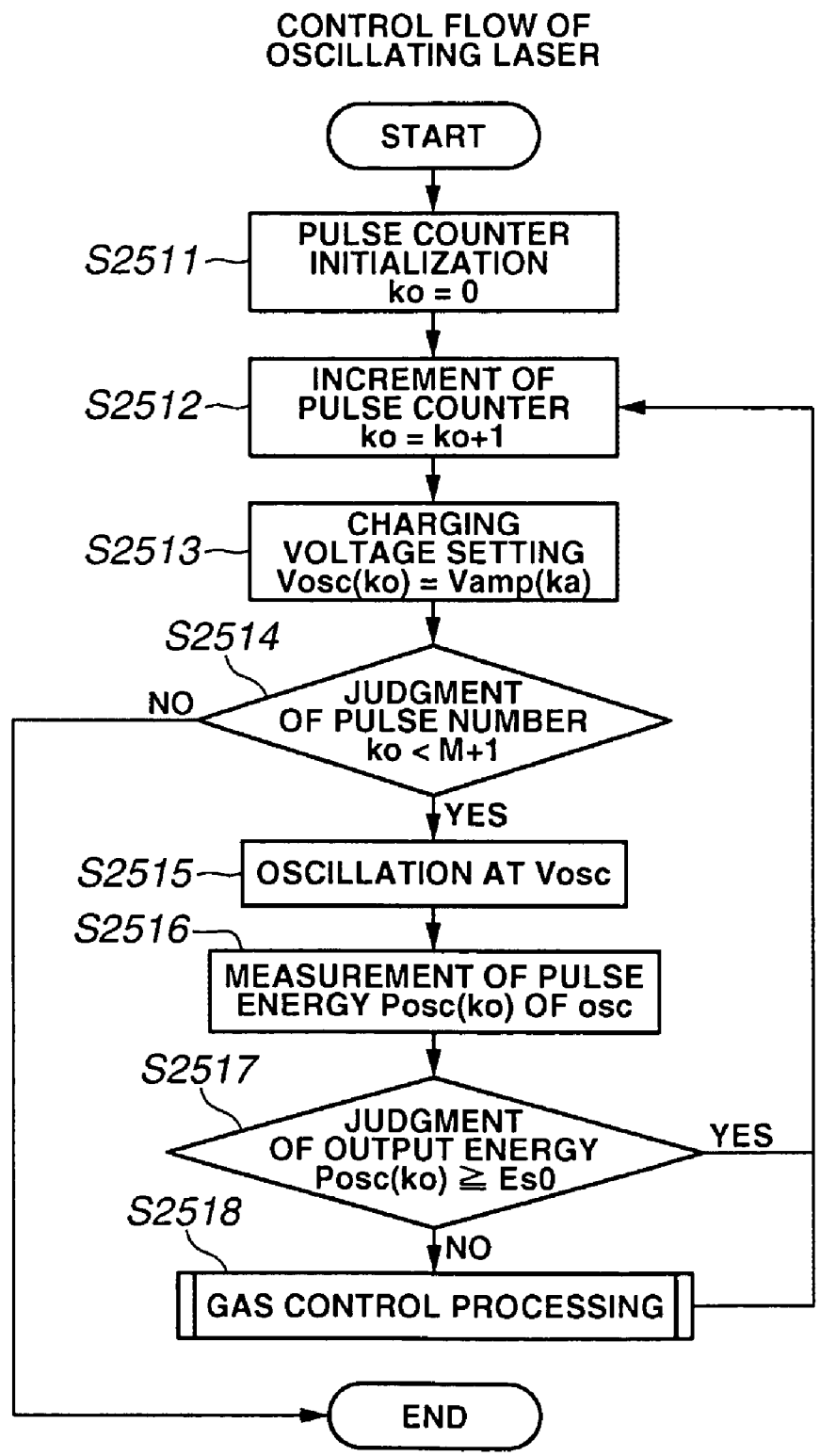
FIG. 16 is a diagram showing a control flow of an oscillating laser.
Figure 17:
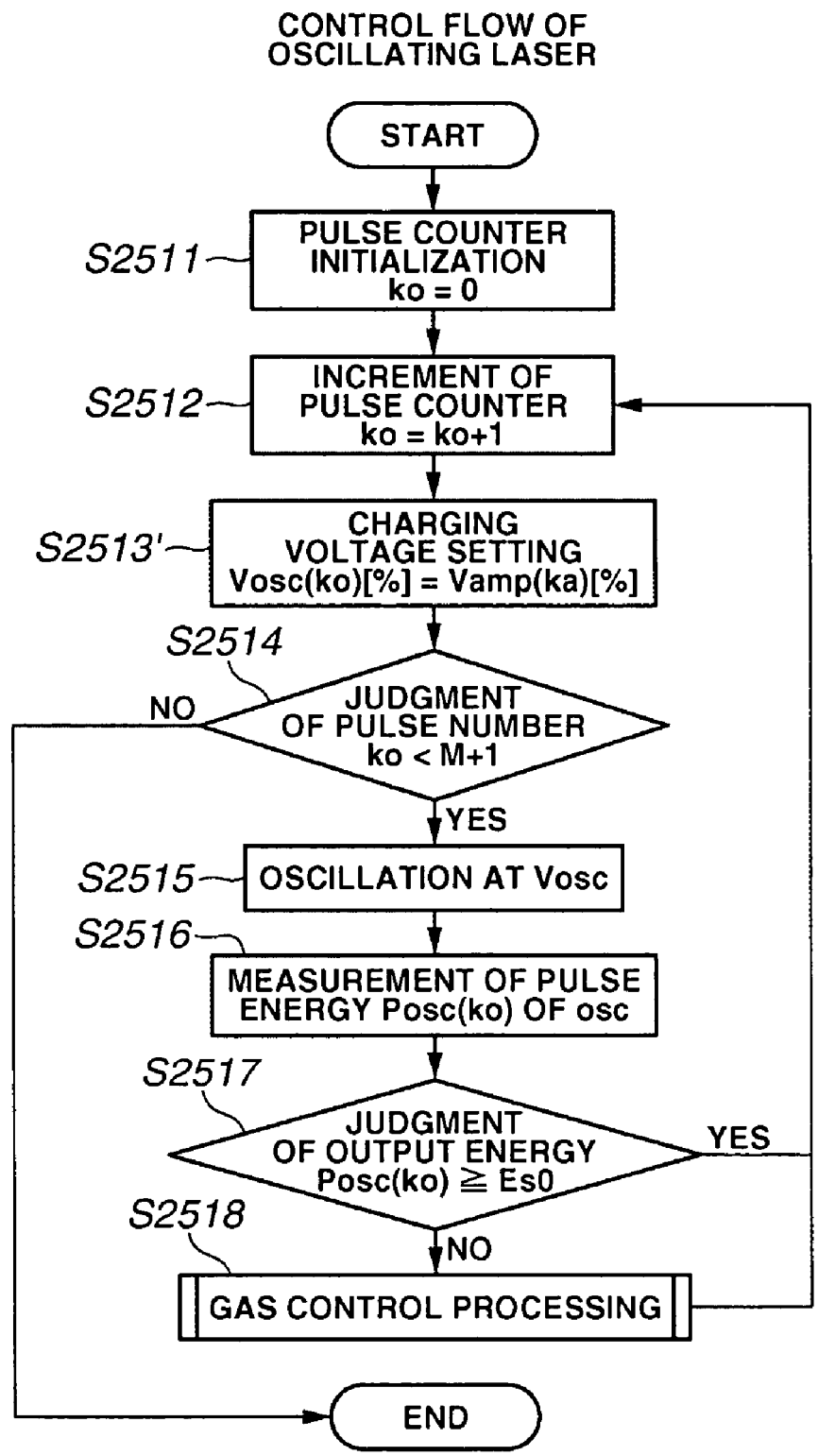
FIG. 17 is a diagram showing a control flow of an oscillating laser.
Figure 18:
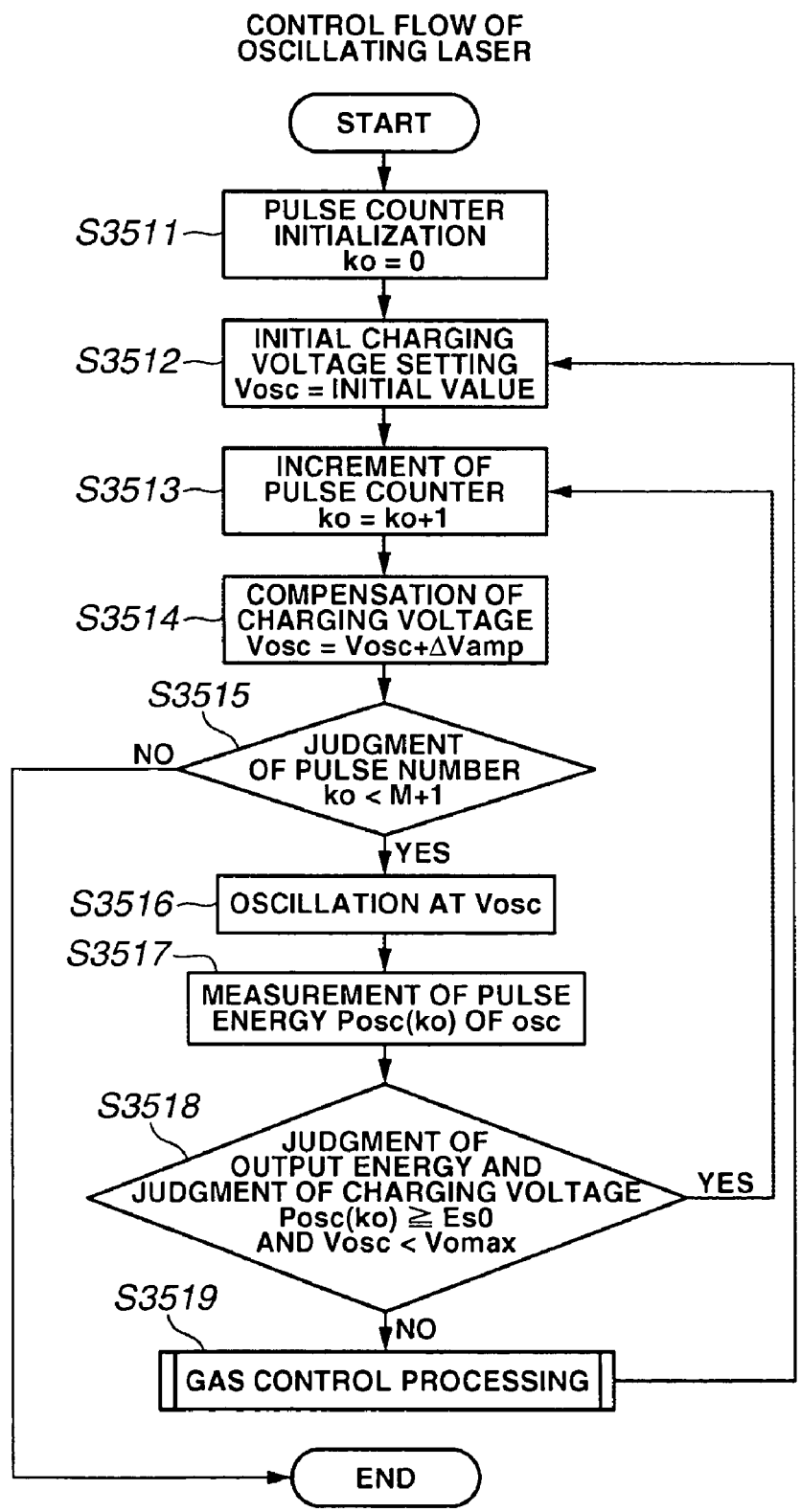
FIG. 18 is a diagram showing a control flow of an oscillating laser.
Figure 20A:
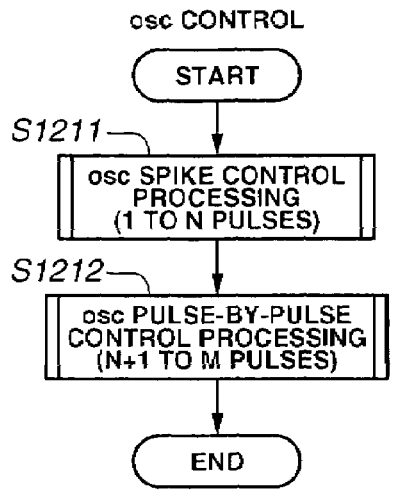
FIGS. 20A and 20B are diagrams showing control flows of an oscillating laser and an amplifying laser.
Figure 20B:
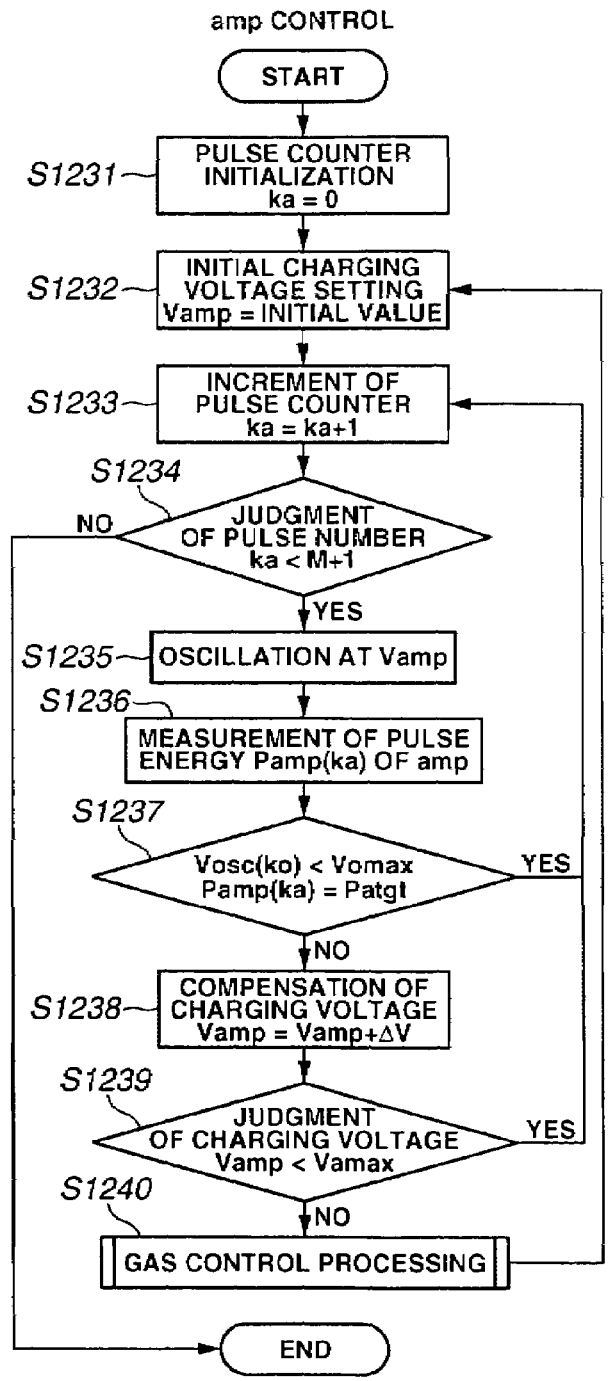
Figure 21:
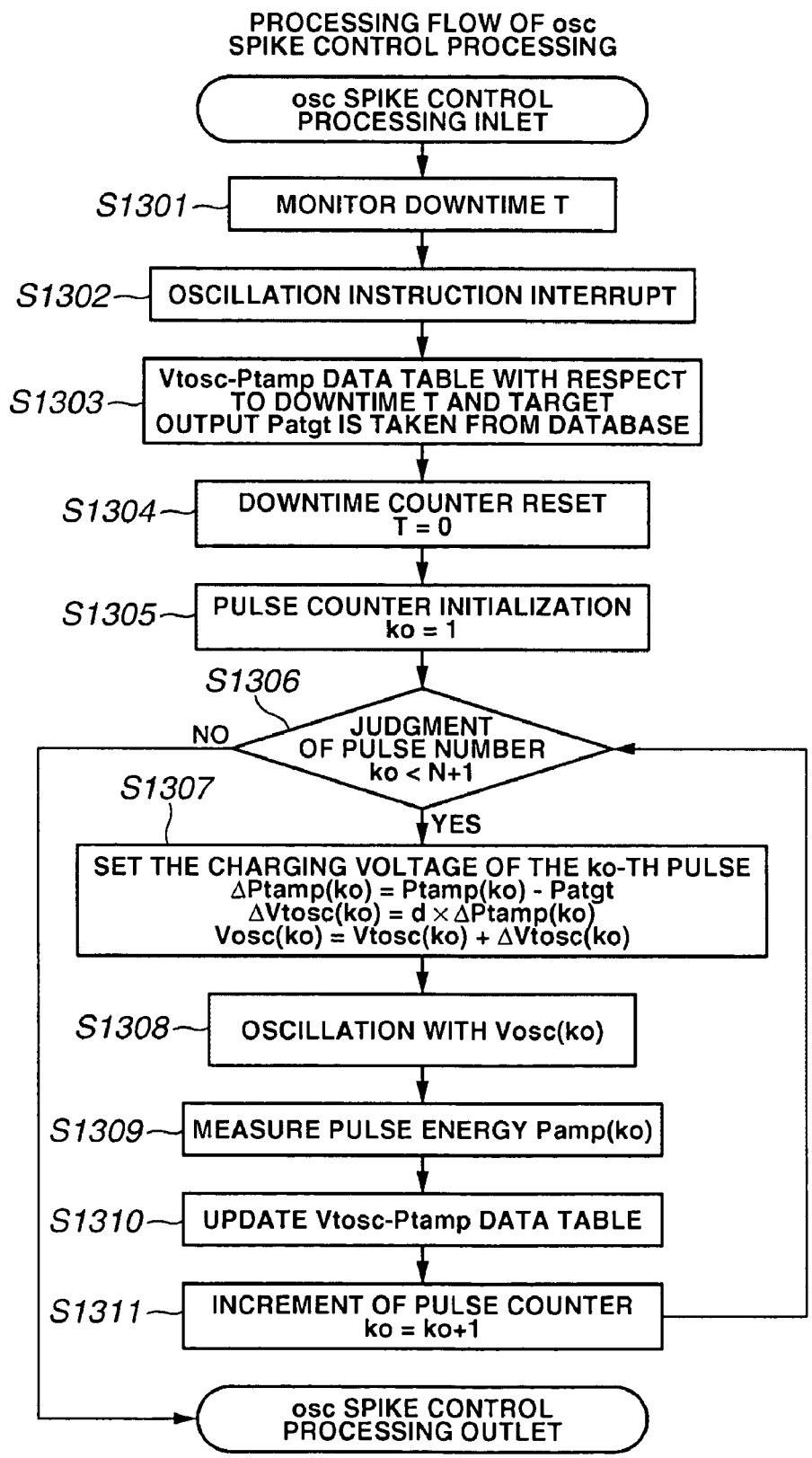
FIG. 21 is a diagram showing a processing flow of osc spike control processing.
Figure 22:
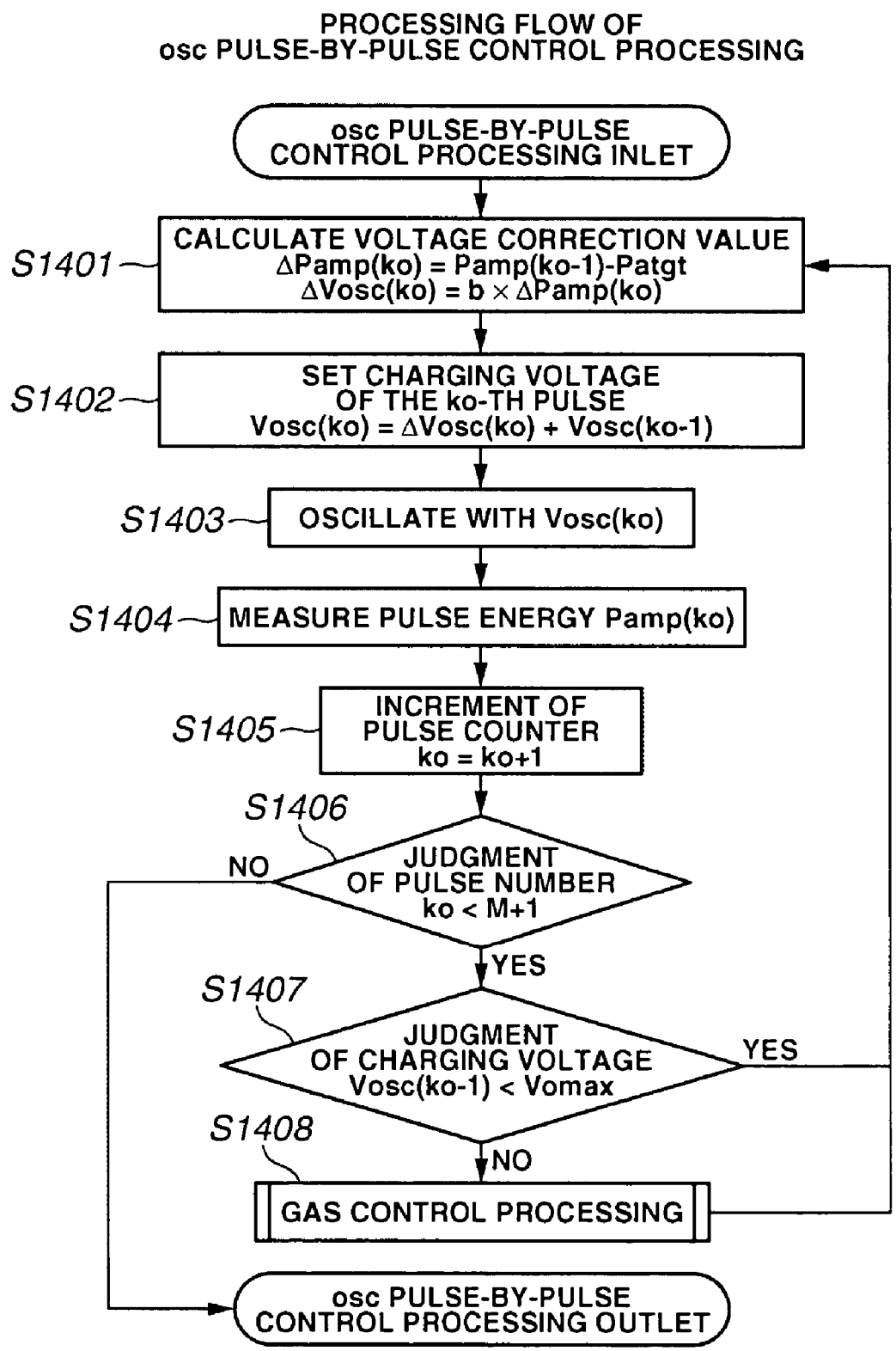
FIG. 22 is a diagram showing a processing flow of osc pulse-by-pulse control processing.
Figure 23A:
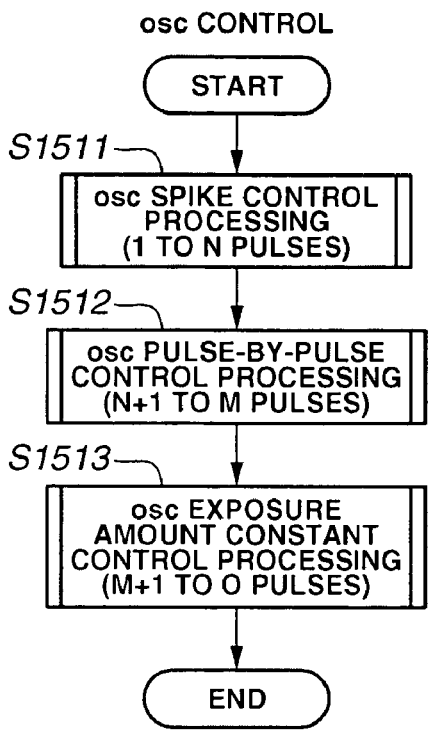
FIGS. 23A and 23B are diagrams showing control flows of an oscillating laser and an amplifying laser.
Figure 23B:
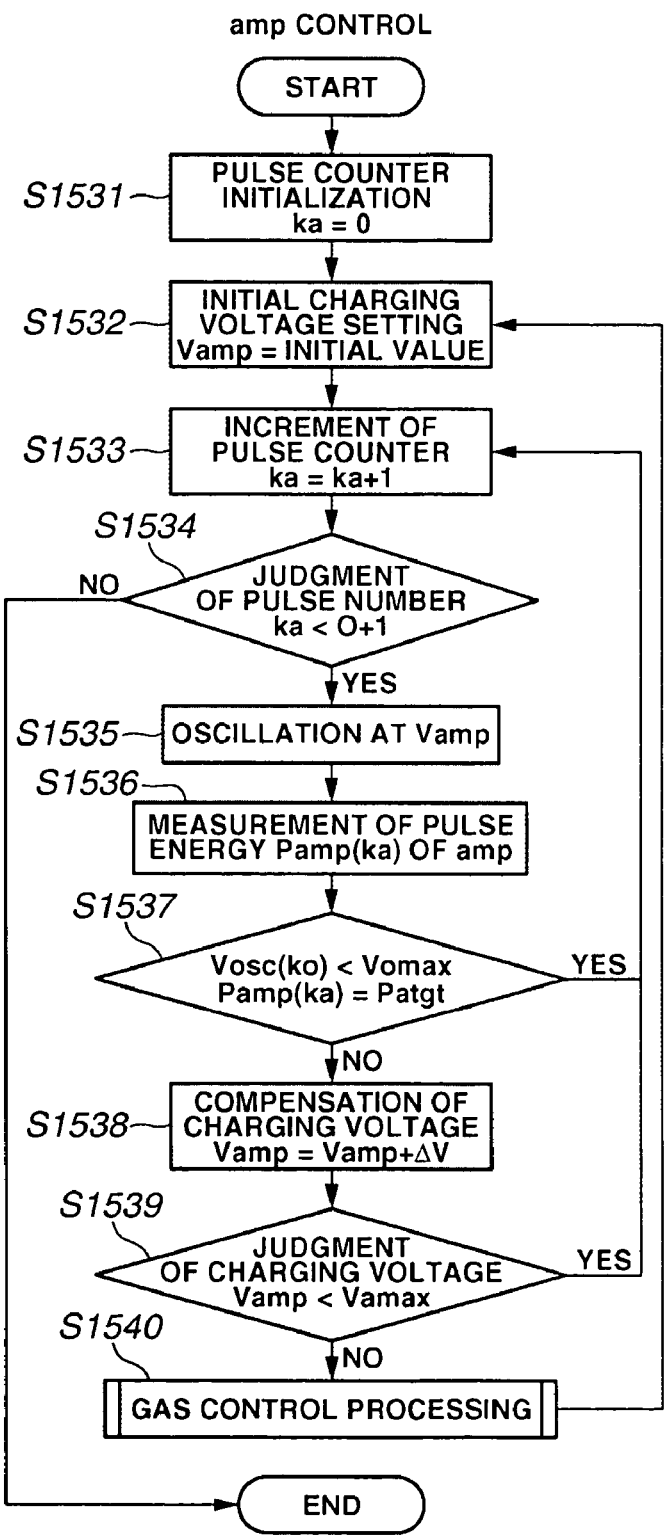
Figure 24:
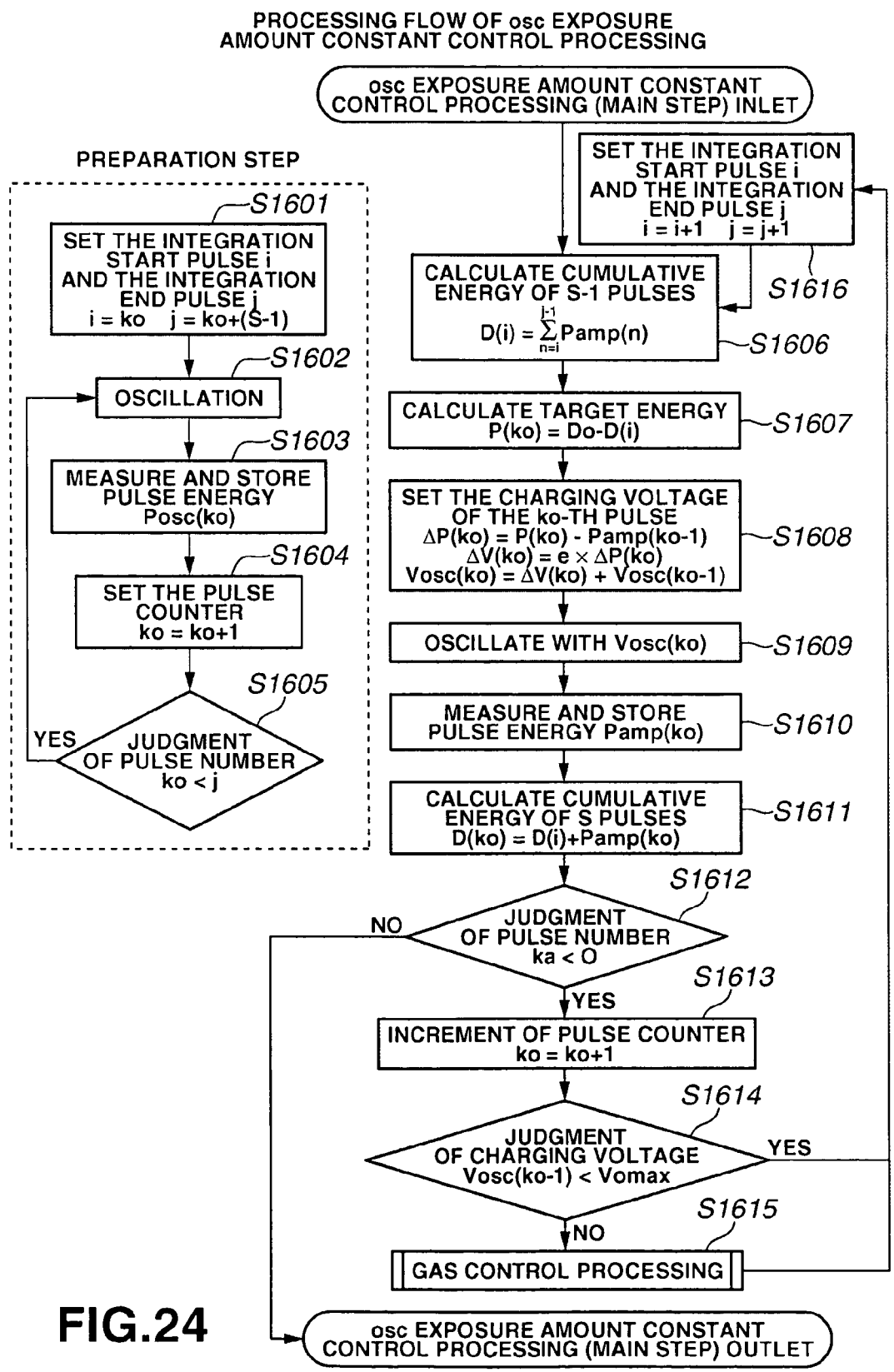
FIG. 24 is a diagram showing a processing flow of osc exposure amount constant control processing.
Figure 26A:
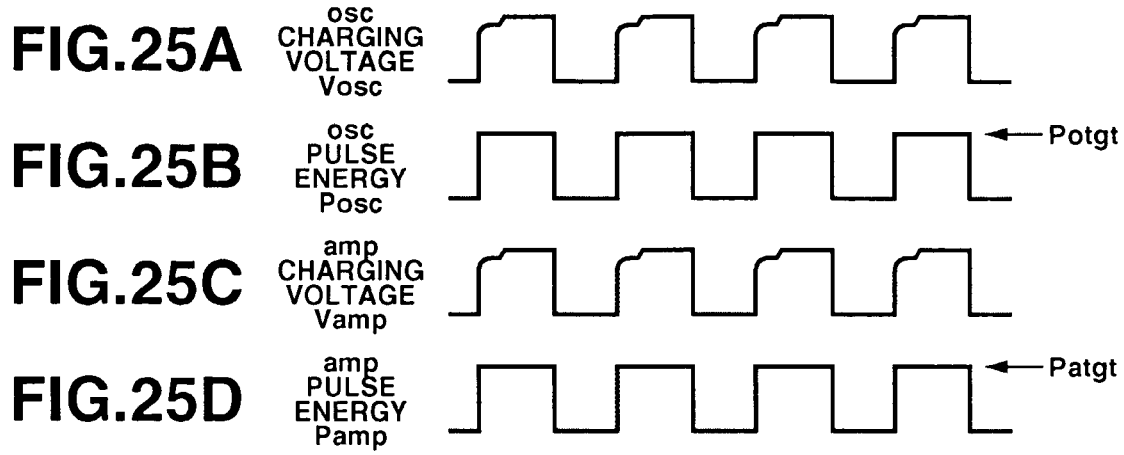
FIGS. 26A and 26B are diagrams showing control flows of an oscillating laser and an amplifying laser.
Figure 26B:
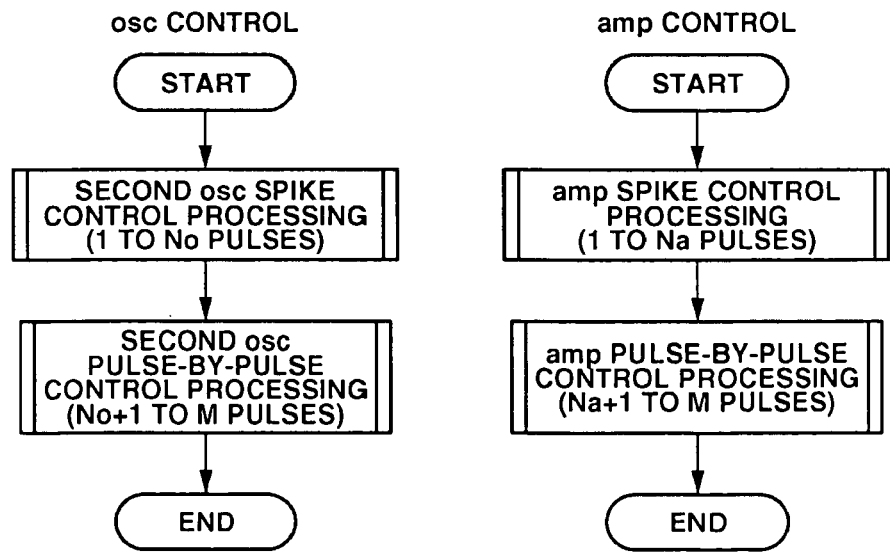
Figure 27:
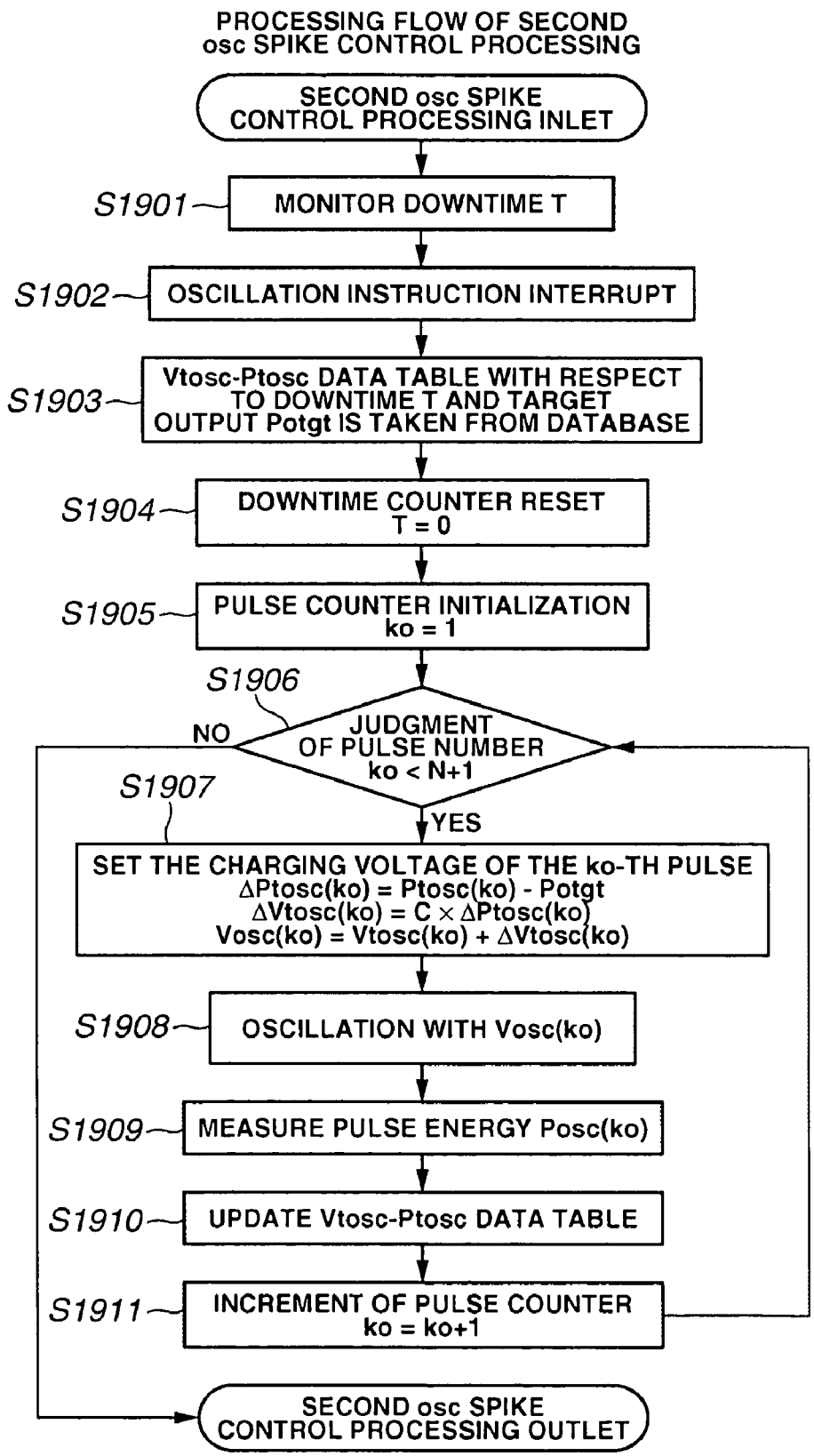
FIG. 27 is a diagram showing a processing flow of second osc spike control processing.
Figure 28:
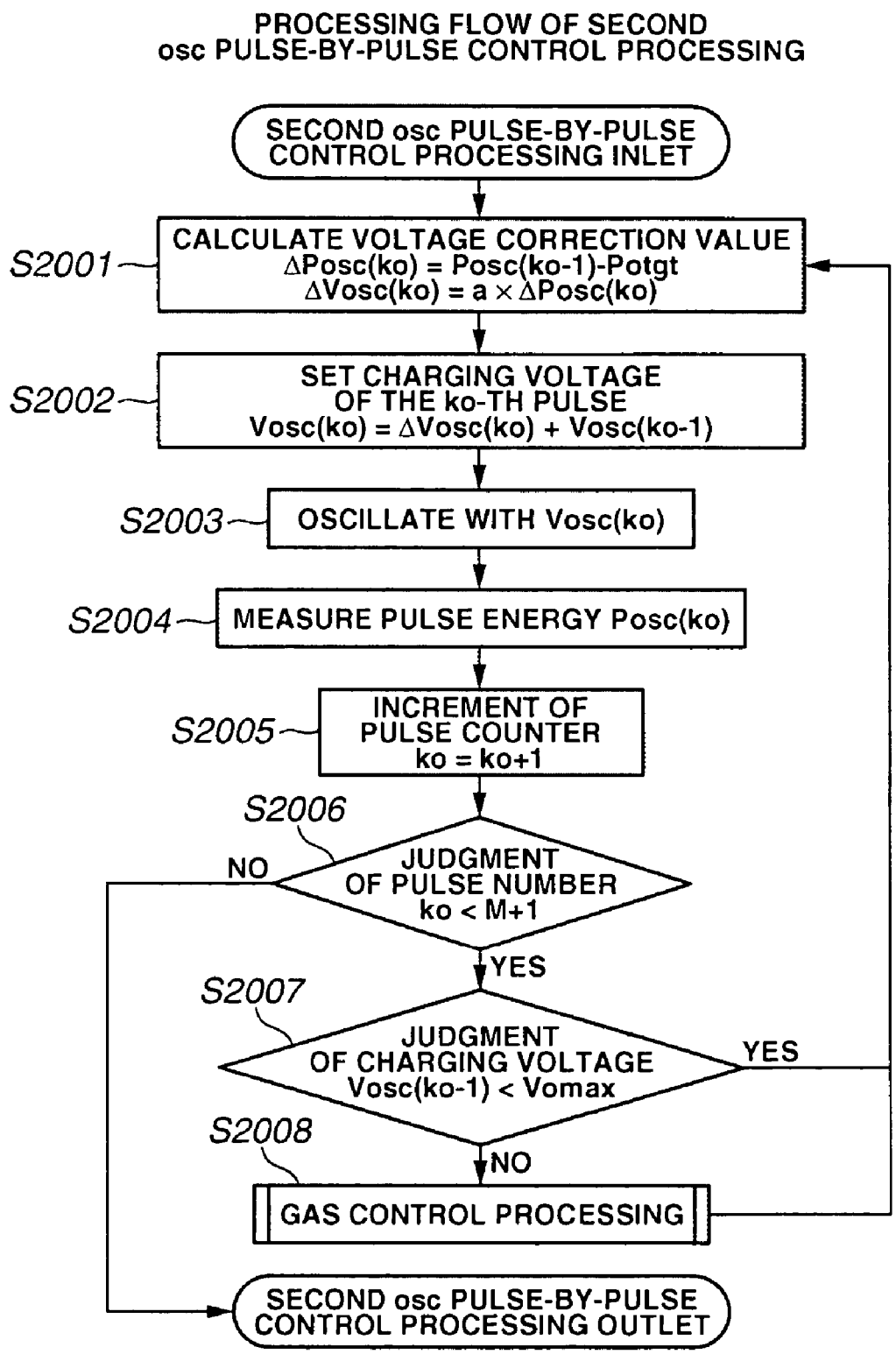
FIG. 28 is a diagram showing a processing flow of second osc pulse-by-pulse control processing.
Figure 29A:
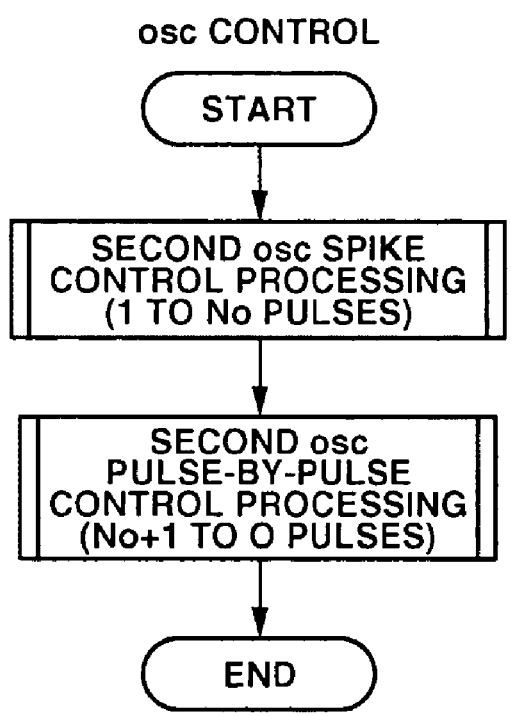
FIGS. 29A and 29B are diagrams showing control flows of an oscillating laser and an amplifying laser.
Figure 29B:
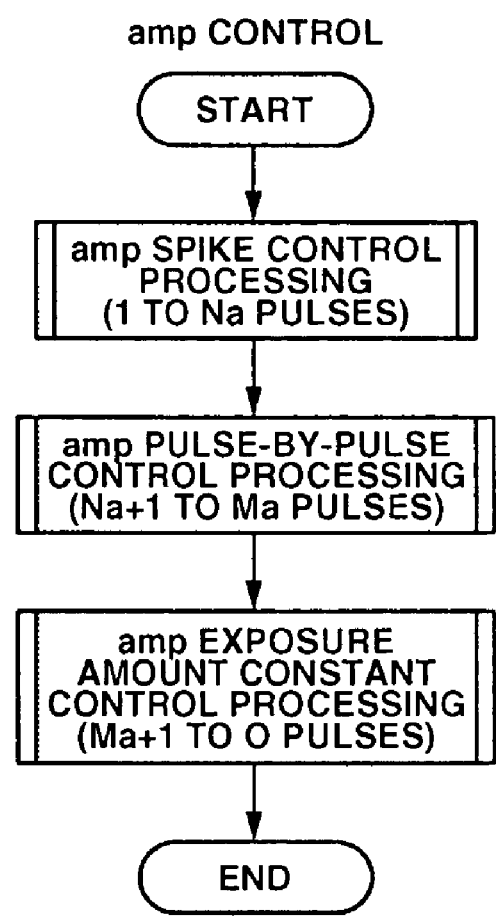

2 . . . Two-stage laser,
3 . . . Exposure device,
4 . . . Main controller,
5 . . . Utility controller,
6 . . . Wavelength controller,
7 . . . Energy controller,
8 . . . Synchronous controller,
100 . . . Oscillating laser (osc),
10 . . . Oscillating chamber, 11 . . . Charger,
12 . . . Oscillating high-voltage pulse generator,
14 . . . Gas supply/discharge unit,
15 . . . Cooling water supply unit,
16 . . . LNM (line narrowing module),
17 . . . Front mirror,
19 . . . Monitor module,
20 . . . Discharge detecting portion,
300 . . . Amplifying laser (amp),
30 . . . Amplifying chamber,
31 . . . Charger,
32 . . . Amplifying high-voltage pulse generator,
34 . . . Gas supply/discharge unit,
35 . . . Cooling water supply unit,
36 . . . Rear mirror,
37 . . . Output mirror,
39 . . . Monitor module,
40 . . . Discharge detecting portion

The invention claimed is:

1. A two-stage laser pulse energy control device, comprising:
    a two-stage laser which is comprised of an optical oscillation stage in which energy charged in an oscillating capacitor is subjected to pulse compression and applied to a pair of mutually opposed electrodes disposed in an oscillating chamber to excite laser gas in the oscillating chamber so as to output seed light, and an optical amplification stage in which energy charged in an amplifying capacitor is subjected to pulse compression and applied to a pair of mutually opposed electrodes disposed in an amplifying chamber to excite laser gas in the amplifying chamber so as to amplify the seed light injected into the amplifying chamber to output a laser beam;
    a first monitor module which measures a pulse energy Posc of the seed light; and
    a second monitor module which measures a pulse energy Pamp of the laser beam, and
    controlling the pulse energy Pamp of the laser beam, wherein:
    the optical oscillation stage is controlled according to a measured result of the first monitor module so that the pulse energy Posc of the seed light becomes a prescribed energy Es0 or more,
    the optical amplification stage is controlled according to a measured result of the second monitor module so that the pulse energy Pamp of the laser beam becomes a target energy Patgt of the optical amplification stage, and
    the prescribed energy Es0 is set to a lower limit energy value of amplification saturation region which is a threshold value between an amplification saturation region in which the pulse energy Pamp of the laser beam saturates without increasing substantially even if the pulse energy Posc of the seed light increases, and a region other than the amplification saturation region in which the pulse energy Pamp of the laser beam increases as the pulse energy Posc of the seed light increases.

2. The two-stage laser pulse energy control device according to claim 1, wherein the control in the optical oscillation stage controls a charging voltage Vosc applied to the oscillating capacitor, and the control in the optical amplification stage controls a charging voltage Vamp applied to the amplifying capacitor.

3. The two-stage laser pulse energy control device according to claim 1, wherein:
    the control in the optical oscillation stage controls at least one of a laser gas pressure and a laser gas composition in the oscillating chamber in addition to a control of a charging voltage Vosc applied to the oscillating capacitor, and
    the control in the optical amplification stage controls at least one of a laser gas pressure and a laser gas composition in the amplifying chamber in addition to a control of a charging voltage Vamp applied to the amplifying capacitor.

4. The two-stage laser pulse energy control device according to claim 2, wherein the charging voltage Vosc applied to the oscillating capacitor is nearly matched with the charging voltage Vamp applied to the amplifying capacitor.

5. The two-stage laser pulse energy control device according to claim 2, wherein a change ratio of the charging voltage Vosc applied to the oscillating capacitor is nearly matched with a change ratio of the charging voltage Vamp applied to the amplifying capacitor.

6. The two-stage laser pulse energy control device according to claim 2, wherein a change amount of the charging voltage Vosc applied to the oscillating capacitor is nearly matched with a change amount of the charging voltage Vamp applied to the amplifying capacitor.

7. A two-stage laser pulse energy control device, comprising:
    a two-stage laser which is comprised of an optical oscillation stage in which energy charged in an oscillating capacitor is subjected to pulse compression and applied to a pair of mutually opposed electrodes disposed in an oscillating chamber to excite laser gas in the oscillating chamber so as to output seed light, and an optical amplification stage in which energy charged in an amplifying capacitor is subjected to pulse compression and applied to a pair of mutually opposed electrodes disposed in an amplifying chamber to excite laser gas in the amplifying chamber so as to amplify the seed light injected into the amplifying chamber to output a laser beam; and
    a monitor module which measures a pulse energy Pamp of the laser beam, and
    controlling the pulse energy Pamp of the laser beam, wherein:
    when the pulse energy Pamp of the laser beam becomes a target energy Patgt of the optical amplification stage by controlling the optical oscillation stage,
    the optical oscillation stage is controlled for every pulse according to a measured result of the monitor module so that the pulse energy Pamp of the laser beam becomes the target energy Patgt of the optical amplification stage,
    a voltage of the optical amplification stage is controlled to be substantially constant, and
    a control region of a pulse energy Posc of the seed light is a region other than an amplification saturation region between the amplification saturation region in which the pulse energy Pamp of the laser beam saturates without increasing substantially even if the pulse energy Posc of the seed light increases, and the region other than the amplification saturation region in which the pulse energy Pamp of the laser beam increases as the pulse energy Posc of the seed light increases.

8. The two-stage laser pulse energy control device according to claim 7, wherein the optical amplification stage is controlled when the pulse energy Pamp of the laser beam does not become the target energy Patgt of the optical amplification stage even if the optical oscillation stage is controlled.

9. The two-stage laser pulse energy control device according to claim 7, wherein the control in the optical oscillation stage controls a charging voltage Vosc applied to the oscillating capacitor.

10. The two-stage laser pulse energy control device according to claim 7, wherein the control in the optical oscillation stage controls at least one of laser gas pressure and laser gas composition in the oscillating chamber in addition to a control of a charging voltage Vosc applied to the oscillating capacitor.

11. The two-stage laser pulse energy control device according to claim 8, wherein:
the control in the optical oscillation stage controls a charging voltage Vosc applied to the oscillating capacitor, and
the control in the optical amplification stage controls a charging voltage Vamp applied to the amplifying capacitor.

12. The two-stage laser pulse energy control device according to claim 8, wherein:
the control in the optical oscillation stage controls at least one of laser gas pressure and laser gas composition in the oscillating chamber in addition to a control of a charging voltage Vosc applied to the oscillating capacitor, and
the control in the optical amplification stage controls at least one of laser gas pressure and laser gas composition in the amplifying chamber in addition to a control of a charging voltage Vamp applied to the amplifying capacitor.

13. A two-stage laser system, comprising the two-stage laser pulse energy control device according to claim 1, and an exposure device which exposes an object of light exposure using a laser beam.

14. The two-stage laser system according to claim 13, wherein the two-stage laser is any of a KrF laser, an ArF laser, and a molecular fluorine laser.

* * * * *